US010777597B2

(12) United States Patent
Ogi et al.

(10) Patent No.: US 10,777,597 B2
(45) Date of Patent: Sep. 15, 2020

(54) IMAGING DEVICE
(71) Applicant: SONY SEMICONDUCTOR SOLUTIONS CORPORATION, Kanagawa (JP)
(72) Inventors: Jun Ogi, Tokyo (JP); Yoshiaki Tashiro, Tokyo (JP); Takahiro Toyoshima, Kanagawa (JP); Yorito Sakano, Kanagawa (JP); Yusuke Oike, Kanagawa (JP); Hongbo Zhu, Tokyo (JP); Keiichi Nakazawa, Tokyo (JP); Yukari Takeya, Kanagawa (JP); Atsushi Okuyama, Kanagawa (JP); Yasufumi Miyoshi, Tokyo (JP); Ryosuke Matsumoto, Tokyo (JP); Atsushi Horiuchi, Kanagawa (JP)
(73) Assignee: Sony Semiconductor Solutions Corporation, Kanagawa (JP)
( * ) Notice: Subject to any disclaimer, the term of this patent is extended or adjusted under 35 U.S.C. 154(b) by 13 days.
(21) Appl. No.: 16/301,877
(22) PCT Filed: Mar. 20, 2018
(86) PCT No.: PCT/JP2018/011179
§ 371 (c)(1),
(2) Date: Nov. 15, 2018
(87) PCT Pub. No.: WO2018/174090
PCT Pub. Date: Sep. 27, 2018
(65) Prior Publication Data
US 2019/0157323 A1  May 23, 2019
(30) Foreign Application Priority Data
Mar. 22, 2017 (JP) ................. 2017-055582
Mar. 13, 2018 (JP) ................. 2018-045205
(51) Int. Cl.
H01L 27/146 (2006.01)
H04N 5/369 (2011.01)
H01L 31/107 (2006.01)

(52) U.S. Cl.
CPC ...... H01L 27/1463 (2013.01); H01L 27/1464 (2013.01); H01L 27/14623 (2013.01);
(Continued)
(58) Field of Classification Search
CPC .......... H01L 27/1463; H01L 27/14645; H01L 27/14623; H01L 27/14685; H01L 27/14689
See application file for complete search history.

(56) References Cited
U.S. PATENT DOCUMENTS
8,390,707 B2 * 3/2013 Yamashita ............ H01L 31/18
348/294
8,928,784 B2 * 1/2015 Watanabe ............. H01L 31/18
348/272
(Continued)

FOREIGN PATENT DOCUMENTS
EP  3540788  0/2019
EP  2040308  3/2009
(Continued)

OTHER PUBLICATIONS
Partial European Search Report for European Patent Application No. 18770698.1, dated Nov. 28, 2019, 14 pages.
(Continued)

Primary Examiner — Dung A. Le
(74) Attorney, Agent, or Firm — Sheridan Ross P.C.

(57) ABSTRACT
To realize miniaturization of a pixel, reduction in noise, and high quantum efficiency, and to improve short-wavelength sensitivity while suppressing inter-pixel interference and variations for each pixel. According to the present disclosure, there is provided an imaging device including: a first semiconductor layer formed in a semiconductor substrate; a second semiconductor layer of a conductivity type opposite to a conductivity type of the first semiconductor layer
(Continued)

formed on the first semiconductor layer; a pixel separation unit which defines a pixel region including the first semiconductor layer and the second semiconductor layer; a first electrode which is connected to the first semiconductor layer from one surface side of the semiconductor substrate; and a second electrode which is connected to the second semiconductor layer from a light irradiation surface side that is the other surface of the semiconductor substrate, and is formed to correspond to a position of the pixel separation unit.

19 Claims, 57 Drawing Sheets

(52) U.S. Cl.
CPC .. *H01L 27/14645* (2013.01); *H01L 27/14685* (2013.01); *H01L 27/14689* (2013.01); *H04N 5/369* (2013.01); *H01L 31/107* (2013.01)

(56) References Cited

U.S. PATENT DOCUMENTS

| | | | |
|---|---|---|---|
| 2009/0256223 A1 | 10/2009 | Yamamura et al. | |
| 2010/0108893 A1 | 5/2010 | Flitsch et al. | |
| 2010/0214454 A1* | 8/2010 | Kikuchi | G02B 3/0068 348/272 |
| 2013/0009265 A1 | 1/2013 | Dautet et al. | |
| 2014/0054662 A1* | 2/2014 | Yanagita | H01L 27/14641 257/291 |
| 2014/0367576 A1 | 12/2014 | Sasaki et al. | |

FOREIGN PATENT DOCUMENTS

| | | |
|---|---|---|
| JP | 2008-147409 | 6/2008 |
| JP | 2013-175494 | 9/2013 |
| JP | 2014-518458 | 7/2014 |
| JP | 2014-241543 | 12/2014 |
| JP | 2015-041746 | 3/2015 |
| JP | 2016-082067 | 5/2016 |
| JP | 2017-011211 | 1/2017 |
| WO | WO 2008/004547 | 1/2008 |

OTHER PUBLICATIONS

International Search Report prepared by the Japan Patent Office dated Jun. 4, 2018, for International Application No. PCT/JP2018/011179.
Extended European Search Report for European Patent Application No. 18770698.1, dated Mar. 5, 2020, 12 pages.

* cited by examiner

FIG. 35
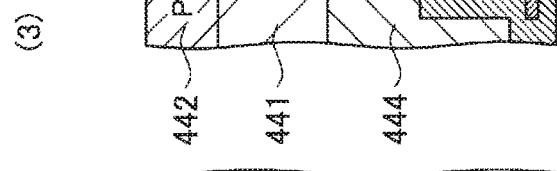
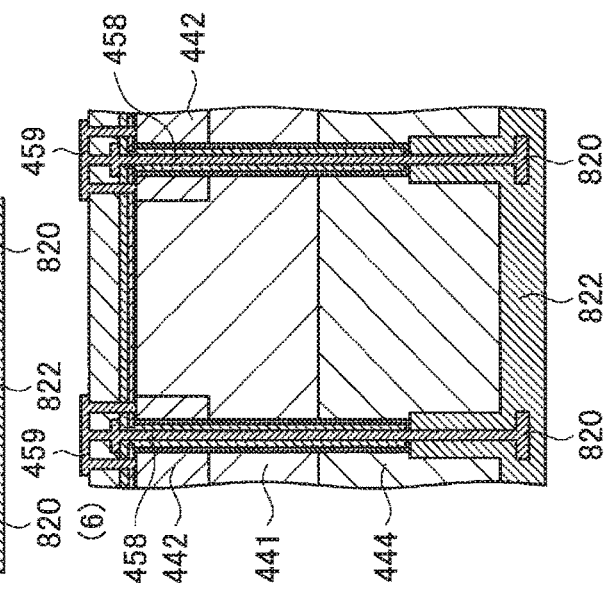
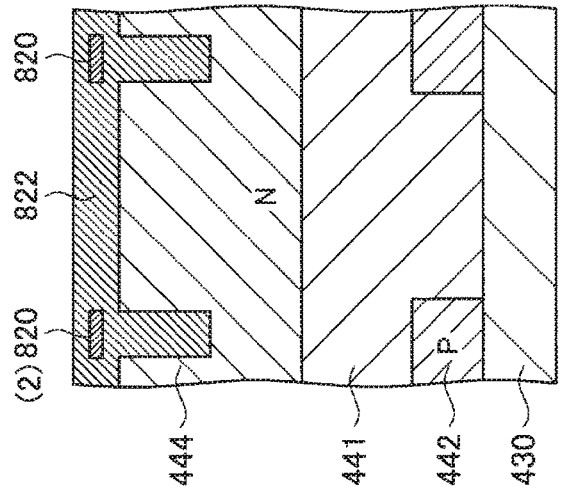
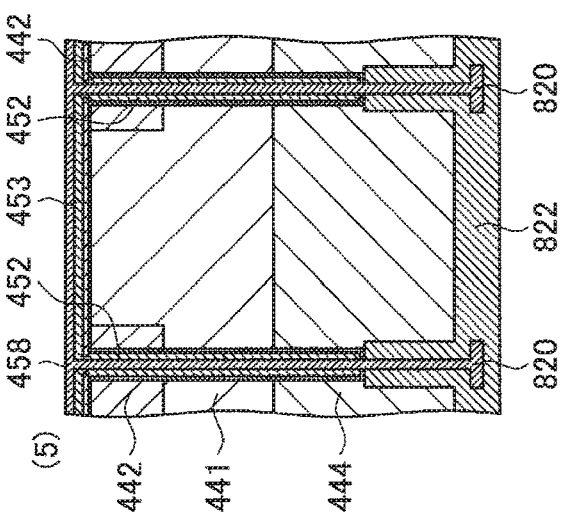
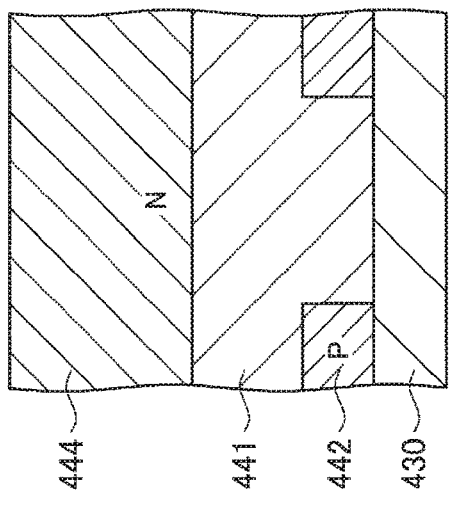
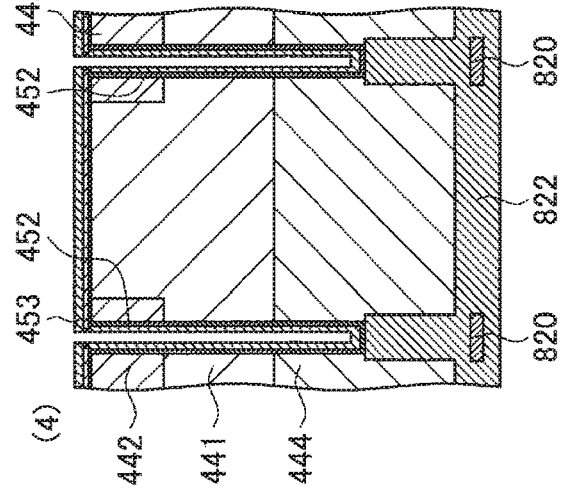

FIG. 39
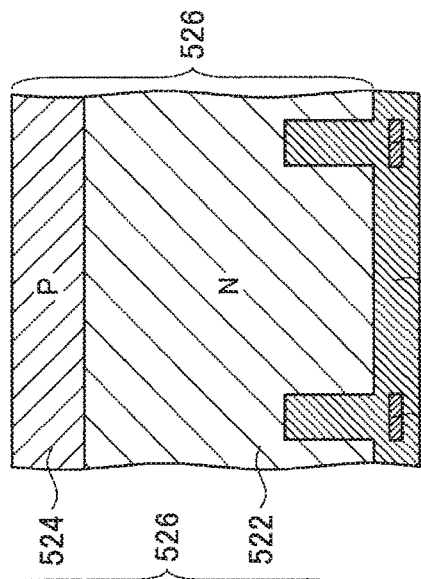
(1)
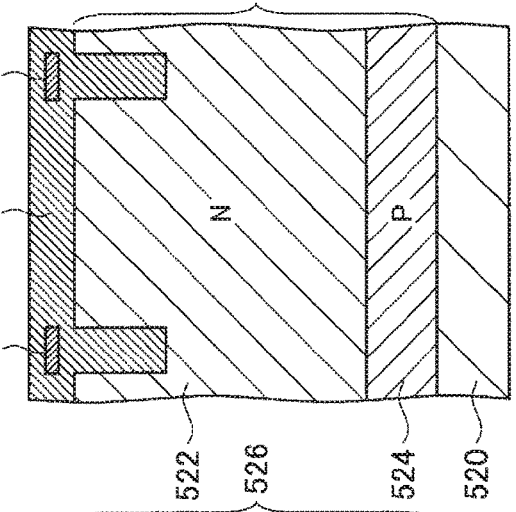
(2)
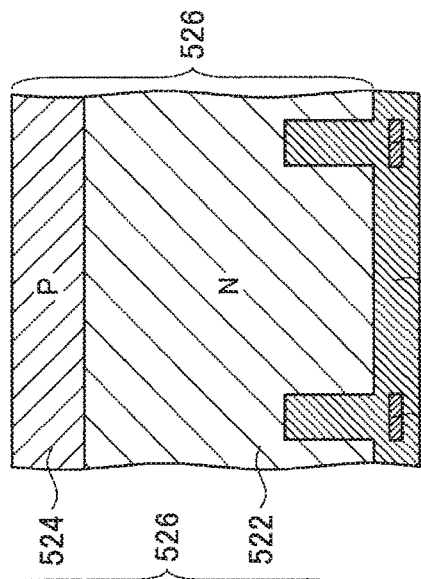
(3)
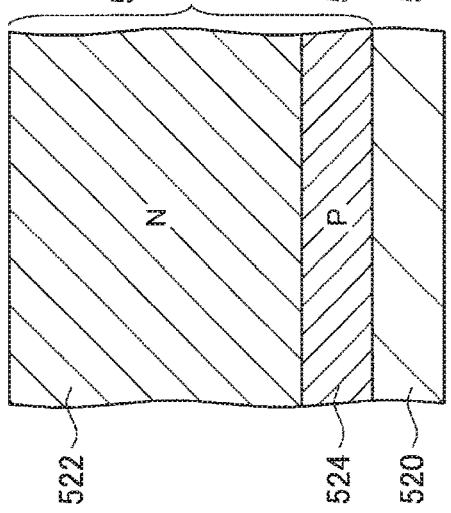
(4)
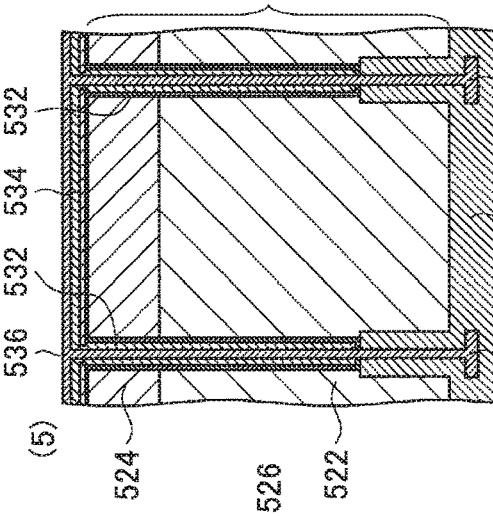
(5)
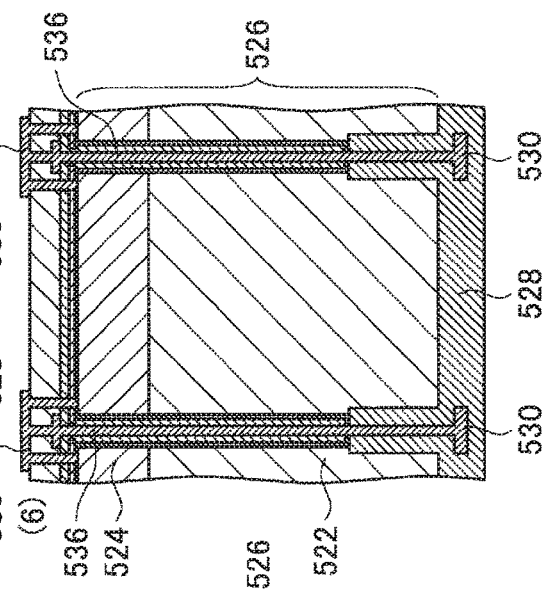
(6)

IMAGING DEVICE

CROSS REFERENCE TO RELATED APPLICATIONS

This application is a national stage application under 35 U.S.C. 371 and claims the benefit of PCT Application No. PCT/JP2018/011179 having an international filing date of 20 Mar. 2018, which designated the United States, which PCT application claimed the benefit of Japanese Patent Application No. 2017-055582 filed 22 Mar. 2017, and of Japanese Patent Application No. 2018/045205 filed 13 Mar. 2018, the entire disclosures of each of which are incorporated herein by reference.

TECHNICAL FIELD

The present disclosure relates to an imaging device and a signal processing device.

BACKGROUND ART

Conventionally, for example, the following Patent Literature 1 discloses a configuration of a single photon avalanche diode (SPAD) which includes a first semiconductor layer that is a first buried layer having a first conductivity type, a second semiconductor layer having a second conductivity type opposite to the first conductivity type under the first semiconductor layer, in which the second semiconductor layer is buried in an epitaxial layer, and the second semiconductor layer is completely converted into a depletion layer by applying a bias voltage thereto.

CITATION LIST

Patent Literature

Patent Literature 1: JP 2015-41746A

DISCLOSURE OF INVENTION

Technical Problem

In SPAD technology, it is possible to extract light incidence as a large signal according to electron multiplication by applying a high bias voltage. However, in the configuration described in Patent Literature 1, since a pair of electrodes to which a high voltage is applied are provided side by side on the front surface of a substrate, it is necessary to reliably insulate the pair of electrodes to reduce noise and to improve photoelectric conversion efficiency. In particular, as miniaturization advances, it is becoming more difficult to insulate the pair of electrodes, and it is difficult to achieve reduction in noise, improvement of photoelectric conversion efficiency, etc. with miniaturization.

In addition, in a case in which the pair of electrodes are provided on the front surface side and the back surface side of the substrate, a transparent electrode or an electrode formed by an impurity layer is provided on a light irradiation surface. However, in a case in which a transparent electrode is provided, noise may occur at a contact portion with the substrate. In addition, in a case in which an electrode is formed by an impurity layer, it is necessary to implant high-concentration impurities, and a depletion layer cannot be formed in a region of the impurity layer, but it is necessary to secure a thickness of the impurity layer to lower the resistance of the electrode. In this case, there is a problem that sensitivity of short-wavelength light, in particular, decreases.

Therefore, it is required to realize miniaturization of a pixel, reduction in noise, and high quantum efficiency, and to improve short-wavelength sensitivity while suppressing inter-pixel interference and variations for each pixel.

Solution to Problem

According to the present disclosure, there is provided an imaging device including: a first semiconductor layer which is formed in a semiconductor substrate; a second semiconductor layer of a conductivity type opposite to a conductivity type of the first semiconductor layer formed on the first semiconductor layer; a pixel separation unit which defines a pixel region including the first semiconductor layer and the second semiconductor layer; a first electrode which is connected to the first semiconductor layer from one surface side of the semiconductor substrate; and a second electrode which is connected to the second semiconductor layer from a light irradiation surface side that is the other surface of the semiconductor substrate, and is formed to correspond to a position of the pixel separation unit.

In addition, according to the present disclosure, there is provided a signal processing device which receives an image signal corresponding to each pixel region from an imaging device that includes a first semiconductor layer formed in a semiconductor substrate, a second semiconductor layer of a conductivity type opposite to a conductivity type of the first semiconductor layer formed on the first semiconductor layer, a pixel separation unit which defines a pixel region including the first semiconductor layer and the second semiconductor layer, a first electrode which is connected to the first semiconductor layer from one surface side of the semiconductor substrate, and a second electrode which is connected to the second semiconductor layer from a light irradiation surface side that is the other surface of the semiconductor substrate, and is formed to correspond to a position of the pixel separation unit, and performs signal processing for displaying the image signal on a display apparatus.

Advantageous Effects of Invention

According to the present disclosure as described above, it is possible to realize low noise and miniaturization of pixels, and high quantum efficiency, and to improve short-wavelength sensitivity while suppressing inter-pixel interference and variation for each pixel.

Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 35 is a schematic sectional view which shows a manufacturing method of the semiconductor device shown in FIG. 34 in process order.

FIG. 39 is a schematic sectional view which shows a manufacturing method of a semiconductor device according to a fourth variation in process order.

MODE(S) FOR CARRYING OUT THE INVENTION

Figure 1:
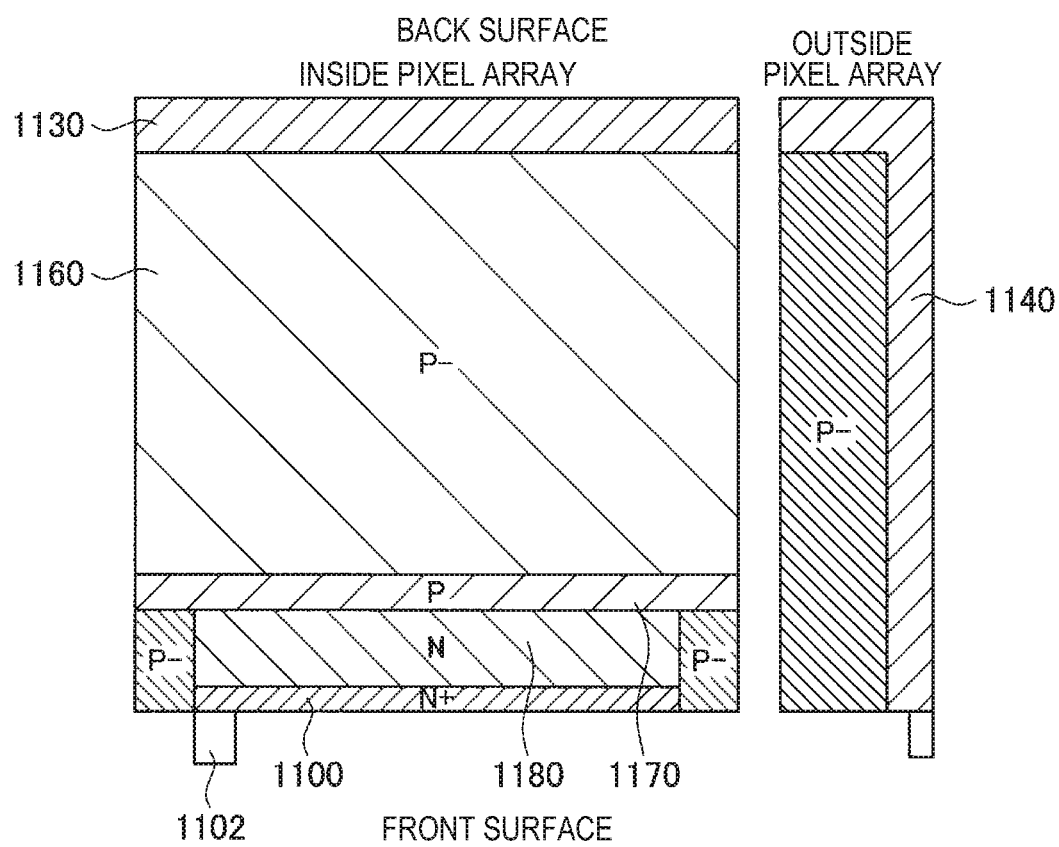
FIG. 1 is a schematic diagram which shows a configuration example in which a SPAD photodiode is set as a back-surface irradiation type, one anode electrode is provided on a back surface side, and a high voltage is applied.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that the description will be made in the following order.
1. Prerequisite technology
2. Configuration example of imaging device according to the present embodiment
3. Other configuration example of imaging device according to the present embodiment
4. Withdrawing anode electrode to outside
5. Positional relationship between anode electrode and contact layer
6. Configuration example including color filter and lens
7. Application example of imaging device according to the present embodiment
8. Variation of the present disclosure
8.1. Common structure
8.2. First variation
8.3. Second variation
8.4. Third variation
8.5. Fourth variation
8.6. Fifth variation
8.7. Sixth variation
9. Application example other than imaging device
10. Configuration example of electronic device
11. Application example to mobile body
12. Application example to endoscopic surgery system
1. Prerequisite Technology Single photon avalanche diode (SPAD) technology realizes a photodiode having a one photon level reading sensitivity by performing electron multiplication. In a SPAD, since a high voltage of ±about tens of V is required to cause multiplication, an implantation design of impurity is difficult, and it is difficult to achieve noise reduction, improvement of photoelectric conversion efficiency, or the like with miniaturization. For this reason, as shown in FIG. 1, there is a technology of solving a problem of lateral electric field mitigation to create a deep depletion layer by setting a SPAD photodiode as a back-surface irradiation type, providing one anode electrode 1130 on a back surface side, and applying a high voltage thereto. In a configuration shown in FIG. 1, a multiplication region which is a high electric field is formed between a high-concentration P-type layer (a second semiconductor layer) 1170 which is in contact with a P-type photoelectric conversion unit 1160 and a cathode N-type layer (a first semiconductor layer) 1180. The N-type layer 1180 is connected to a cathode electrode 1100. An electrode 1102 is connected to a front side of the cathode electrode 1100.

Although an anode electrode 1130 is taken out to a front surface side, in order to mitigate an electric field between a contact portion to the front surface side and the cathode electrode 1100, it is necessary to sufficiently separate the contact portion from the cathode electrode 1100. For this reason, in the configuration shown in FIG. 1, a contact layer 1140 which is connected to the anode electrode 1130 and with which the anode electrode 1130 is withdrawn to the front surface side is provided outside a pixel array.

On the other hand, it is necessary to use a transparent electrode as the anode electrode 1130 to form the anode electrode 1130 on an irradiated surface of the back surface side in a back-surface structure as shown in FIG. 1. In a method of forming the anode electrode 1130 using a transparent electrode such as ITO and bringing it into contact with a photoelectric conversion unit 1160, noise occurs at a contact portion between the anode electrode 1130 and the photoelectric conversion unit 1160. For this reason, an electrode into which impurities of high concentration are implanted may be formed on a photodiode uppermost surface, that is, an uppermost surface of the photoelectric conversion unit 1160, in some cases. However, if high-concentration impurity implantation is performed on the photoelectric conversion unit 1160, a depletion layer cannot be formed in this portion, and photoelectric conversion cannot be performed on the photodiode uppermost surface, and thus a quantum efficiency of short-wavelength light is lowered. For this reason, a high-concentration impurity portion formed on the uppermost surface of the photoelectric conversion unit 1160 needs to be made thin, but if the high-concentration impurity portion is made thin, resistance increases. In particular, in a case in which the contact layer 1140 is provided outside the pixel array and is brought into contact with the anode electrode 1130 on the back surface side, even though it is advantageous for miniaturization, electrical resistance from the contact layer 1140 to a pixel becomes high, and a voltage varies when a specific large multiplication current flows in the SPAD. This variation affects other pixels, and causes inter-pixel interference to change characteristics of other pixels.

In view of the above, in the present embodiment, while taking a back electrode structure capable of realizing fine pixels, inter-pixel interference caused by voltage variation in an electrode is suppressed, and furthermore, in particular, the quantum efficiency on a short-wavelength side is improved.

2. Configuration Example of Imaging Device According to the Present Embodiment.

Figure 2:
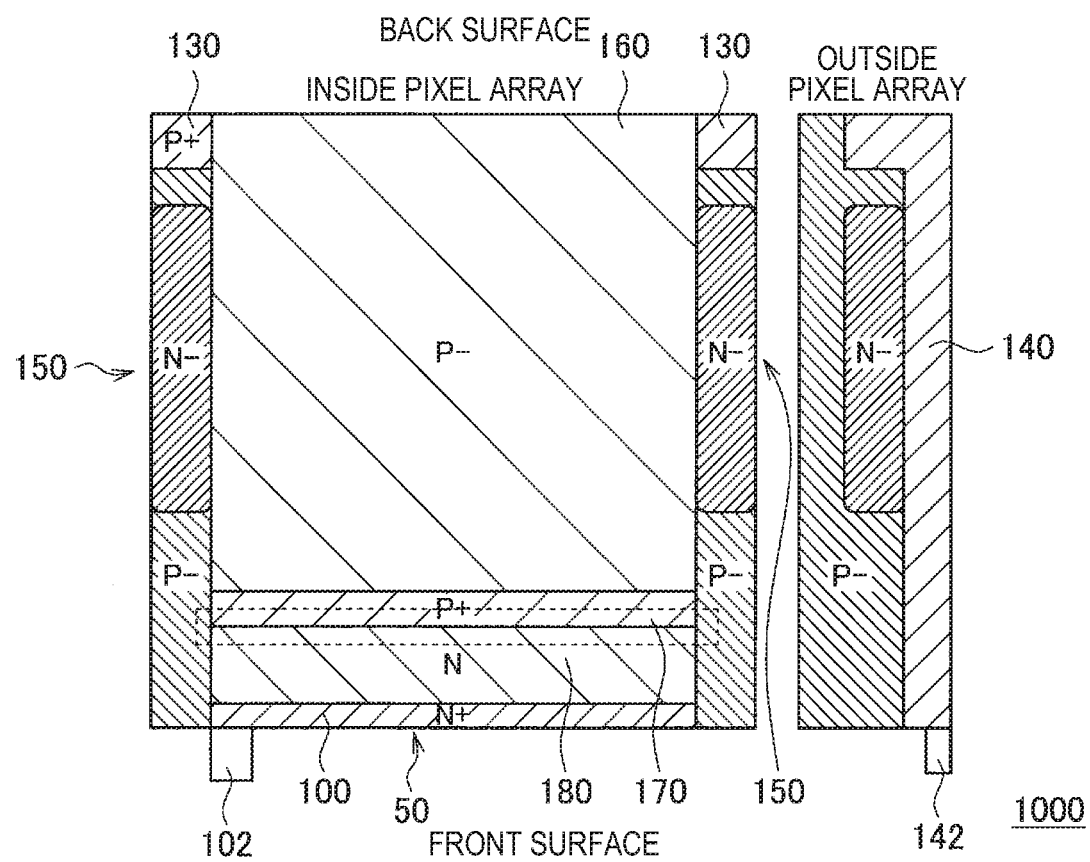
FIG. 2 is a schematic diagram which shows a semiconductor device (a SPAD photodiode) according to an embodiment of the present disclosure.

FIG. 2 is a schematic diagram which shows an imaging device (a SPAD photodiode) 1000 according to one embodiment of the present disclosure. The configuration shown in FIG. 2 includes a multiplication region as a SPAD pixel, a photoelectric conversion unit 160 which performs photoelectric conversion, a cathode electrode 100, and an anode electrode 130. The configuration shown in FIG. 2 is a pixel of a back-surface irradiation type, a substrate of a photodiode is thinned to be 10 um or less, and one anode electrode 130 among a pair of electrodes to which a high voltage is applied is provided on a back surface side thereof. Note that a front surface side of a semiconductor substrate 50 is a side on which a wiring layer is formed on the semiconductor substrate 50, and a back surface side of the semiconductor substrate 50 is set as a light irradiation surface in an imaging device 100 of the present embodiment. The anode electrode 130 on the back surface side is provided to correspond to a pixel separation unit 150. A thickness of the anode electrode 130 is set to, for example, 500 nm or more, and it is regarded as an electrode with low resistance. The photoelectric conversion unit 160 is provided in a pixel region between pixel separation units 150, and an uppermost surface of a back surface side of the photoelectric conversion unit 160 is regarded as a light irradiation portion which is irradiated with light. The pixel region is defined according to a distance between the pixel separation units 150, and has a rectangular planar shape of 5 μm or less in length and width. The anode electrode 130 is connected to the contact layer 140 formed by deep impurity implantation, metal burial, and the like outside the pixel array, and its potential is taken out to a front surface side. A predetermined voltage is applied to an electrode 142 connected to the contact layer 140 on the front surface side, and thereby a predetermined voltage is applied to the anode electrode 130 via the contact layer 140. It is desirable that the contact layer 140 be formed around the pixel array. The contact layer 140 may be provided at one place or may be divided among a plurality of places. Moreover, the anode electrode 140 may have a plurality of contact layers 140 formed in the pixel array. As the number of contact layers 140 for taking out an electrode increases, it is possible to suppress a voltage variation in the anode electrode 130 on the back surface side.

As shown in FIG. 2, pixels are separated by the pixel separation unit 150 in the pixel array. FIG. 2 shows one pixel in the pixel array. The pixel separation unit 150 is formed by changing polarities of the photoelectric conversion unit 160 and impurity. The anode electrode 130 on the back surface side is provided to correspond to a position of the pixel separation unit 150, and is provided immediately above the pixel separation unit 150 in FIG. 2. The pixel separation unit 150 is formed by high-concentration impurity implantation, and the anode electrode 130 is set to have a sufficient thickness, for example, 500 nm or more, to sufficiently lower the resistance. By using such a structure, it is possible to form the depletion layer of the photoelectric conversion unit 160 to the uppermost surface on a pixel back surface side, and to sufficiently maintain short-wavelength sensitivity.

In FIG. 2, an N-type impurity layer is formed on the front surface side to be the cathode electrode 100, and a P-type impurity layer is formed on the back surface side to be the anode electrode 130. The cathode electrode 100 is connected to an N-type layer (a first semiconductor layer) 180. In addition, a front side of the cathode electrode 100 is connected to an electrode 102. The photoelectric conversion unit 160 connected to the anode electrode 130 is a low-concentration P type, and forms a multiplication region which is a high electric field between the high-concentration P-type layer (a second semiconductor layer) 170 in contact with the photoelectric conversion unit (a third semiconductor layer) 160 and the cathode N-type layer 180. In addition, a low-concentration N-type layer is used as the pixel separation unit 150. Note that a P-type layer 170 may be enlarged to a region of the photoelectric conversion unit 160 without providing the photoelectric conversion unit 160.

Note that a conductivity type and concentration of an impurity layer are examples, and P and N may be exchanged to set the anode and cathode to opposite conductivity types. In addition, various other methods of creating a multiplication region which becomes a high electric field can be considered. Moreover, an impurity implantation region for separating the multiplication region may be provided, and a shallow trench isolation (STI) or the like may also be provided as the pixel separation unit 150.

As described above, in the present embodiment, in the SPAD of the back-surface irradiation type, the anode electrode 130 and the cathode electrode 100 are provided on the front surface and the back surface of the substrate. The anode electrode 130 on the back surface side is provided in an inter-pixel separation region 150. As a result, since the photoelectric conversion unit 160 made of a depletion layer can be enlarged to an uppermost surface of a light irradiation surface, the short-wavelength sensitivity can be greatly increased. In a case in which a pixel is relatively large, since the anode electrode 130 is positioned at a pixel end, an electric field in the pixel may not be constant, and it may be difficult to spread the depletion layer at the pixel center to a front surface of the photoelectric conversion unit 160. However, in the case of a fine pixel, since the potential from a pixel end reaches a pixel center, it is possible to adopt a structure in which the anode electrode 130 on the back surface side is provided in the pixel separation unit 150.

Figure 3:
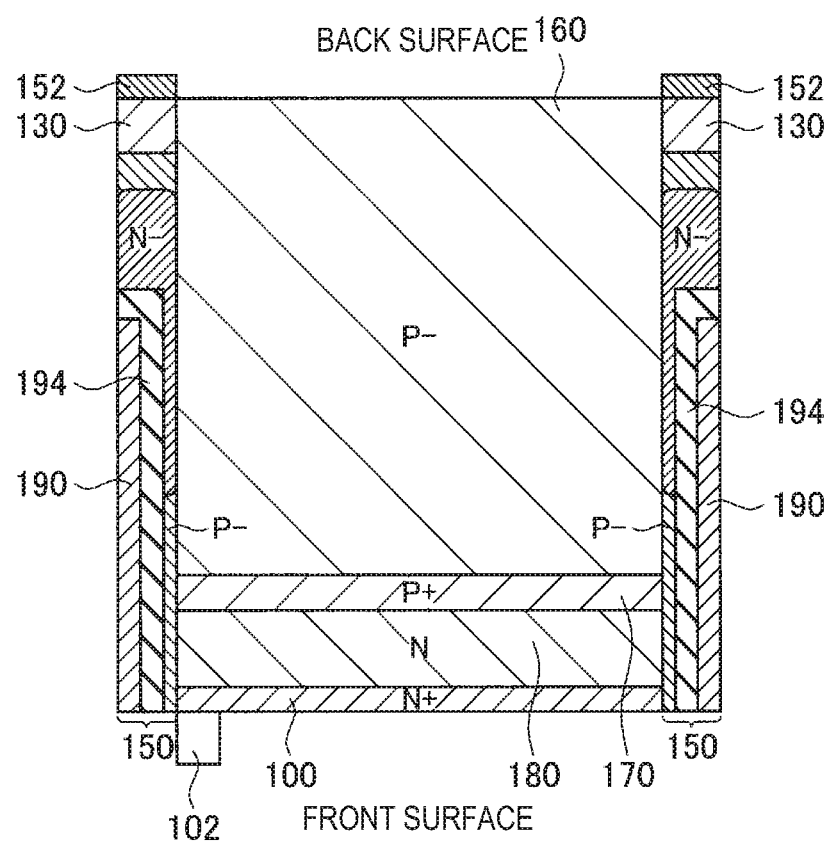
FIG. 3 is a schematic diagram which shows another configuration example of the present embodiment.

FIG. 3 is a schematic diagram which shows another configuration example of the present embodiment, and is an example in which a metal layer 152 having a light shielding property is used as the pixel separation unit 150 in a pixel front surface on the back surface side. This can lower resistance of the anode electrode 130 on the back surface while reducing inter-pixel interference caused by light, and can further suppress pixel interference caused by voltage variation. The metal layer 152 can include a metal such as tungsten (W). A high-concentration impurity implantation region like in FIG. 2 is provided immediately below this metal layer 152 to be the anode electrode 130. The metal layer 152 and the anode electrode 130 made of the high-concentration impurity region may be in contact with each other. In a case of the configuration example shown in FIG. 3, the anode electrode 130 like in FIG. 2 may be taken out to the front surface side, or may also be connected to a bonding pad as it is on the back surface side.

The pixel separation unit 150 has a lattice-like planar shape to surround a rectangular pixel region. For this reason, the anode electrode 130 formed on the pixel separation unit 150 and the metal layer 152 formed on the anode electrode 130 can also have a lattice-like planar shape, following the pixel separation unit 150.

In addition, in the example shown in FIG. 3, a buried metal layer 190 having a light shielding property is buried in the pixel separation unit 150 from the front surface side. The buried metal layer 190, like the metal layer 152, can be made of a metal such as tungsten (W). In this case, the buried metal layer 190 and the photoelectric conversion unit 160 are separated by an insulating film 194, and the buried metal layer 190 is surrounded by the insulating film 194 between adjacent pixel regions. In this structure, inter-pixel interference occurring in a deep region of a pixel region can be suppressed, and a structure advantageous for miniaturization in which the anode electrode 130 is provided on the back surface side can be combined therewith. The buried metal layer 190 is buried from the front surface side to the middle of the photoelectric conversion unit 160, and a high-concentration impurity region is created immediately above this buried metal layer 190 to be set as the anode electrode 130 on the back surface side.

Figure 4:
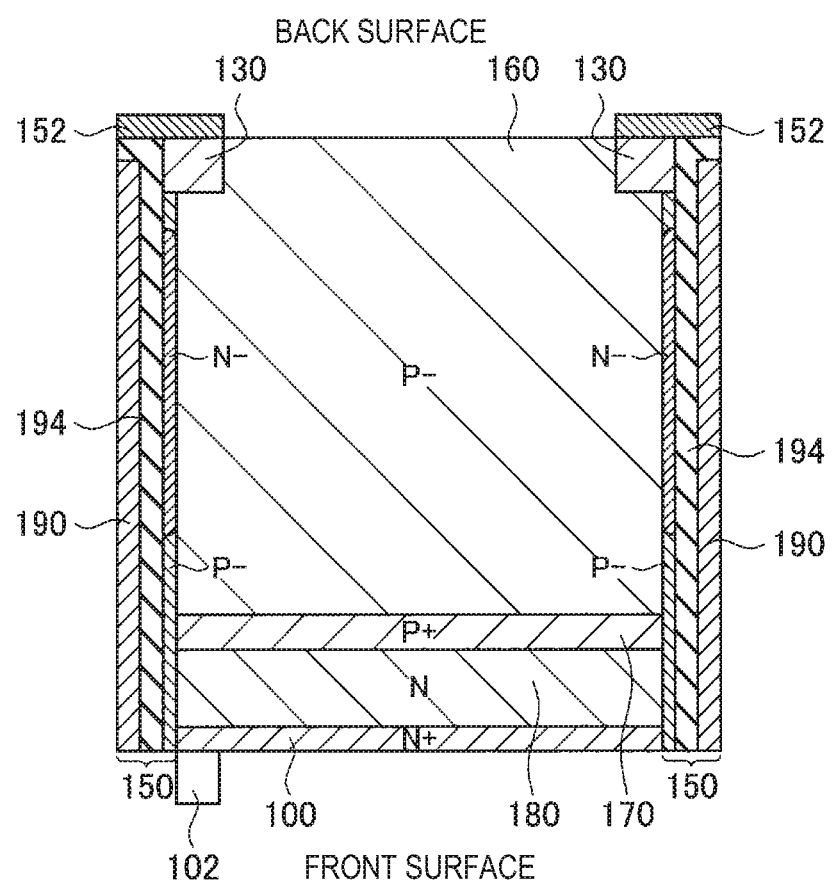
FIG. 4 is a schematic diagram which shows a configuration in which a buried metal layer having the structure shown in FIG. 3 is buried on the back surface side.

In an example shown in FIG. 4, the buried metal layer 190 having the structure shown in FIG. 3 is buried from the back surface side. In this case, the anode electrode 130 made of the high-concentration impurity region is formed in the pixel region to surround the buried metal layer 190, but since connection between pixels of the anode electrodes 130 is blocked due to the buried metal layer 190 being provided therein, the metal layer 152 is provided on the pixel separation unit 150, and the metal layer 152 is brought into contact with the anode electrodes 130 to connect the anode electrodes 130 between the pixels. The metal 152 is insulated from the buried metal layer 190. For this reason, a lateral electric field of the front surface side can be reduced without applying a high voltage to the buried metal layer 190. The buried metal layer 190 may be buried only in a portion of the photoelectric conversion unit 160, but more preferably, is buried over an entire pixel region. With this structure, it is possible to achieve miniaturization and a high quantum efficiency and to realize a pixel with low noise by suppressing inter-pixel interference caused by a voltage variation while completely blocking inter-pixel interference caused by light.

As described above, in the present embodiment, the anode electrode 130 is formed to correspond to the position of the pixel separation unit 150. Note that the anode electrode 130 being formed to correspond to the position of the pixel separation unit 150 is assumed to include a case in which the anode electrode 130 is formed immediately above the pixel separation unit 150 as shown in FIG. 2, and a case in which the anode electrode 130 is formed on a pixel region side of the pixel separation unit 150 as shown in FIG. 4. In addition, the anode electrode 130 is formed to correspond to the position of the pixel separation unit 150, but may not be provided to correspond to all of the pixel separation units 150, and may also be provided to correspond to only a part of the pixel separation units 150.

Figure 5:
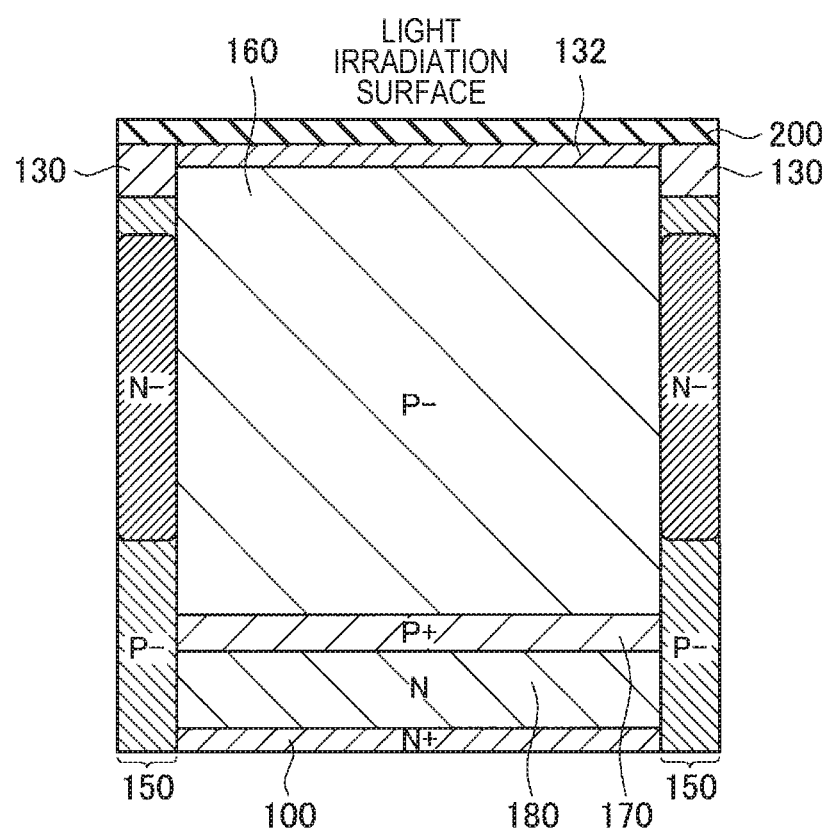
FIG. 5 is a schematic diagram which shows an example in which an auxiliary electrode continuous with an anode electrode is provided on an uppermost surface of a pixel region in the configuration example shown in FIG. 2.

3. Another Configuration Example of Imaging Device According to the Present Embodiment In the following description, on the basis of the configuration examples shown in FIGS. 2 to 4, several variations of the present embodiment will be described. A configuration example shown in FIG. 5 shows an example in which an auxiliary electrode 132 continuous with the anode electrode 130 is provided on an uppermost surface of the pixel region with respect to the configuration example shown in FIG. 2. The auxiliary electrode 132 is formed in the same conductivity type as the anode electrode 130. A thickness of the auxiliary electrode 132 is set to, for example, 50 nm or less, such that a region of the photoelectric conversion unit 160 can be secured to the maximum. In this manner, the auxiliary electrode 132 may be provided on an uppermost surface on the back surface side in a pixel by the high-concentration impurity implantation. However, a thickness of a region of the auxiliary electrode 132 into which impurity has been implanted in a pixel is made sufficiently thin, and is preferably made to be, for example, 50 nm or less. In the example shown in FIG. 5, an insulating layer 200 is provided on the auxiliary electrode 132, and the photoelectric conversion unit 160 is irradiated with light via the insulating layer 200. By providing the auxiliary electrode 132, it is possible to make a constant potential of the uppermost surface of the photoelectric conversion unit 160 on the back surface side, and to make a uniform spread of the depletion layer or electric field of the multiplication region in a pixel. Since this auxiliary electrode 132 is thin in thickness and does not affect short-wavelength sensitivity, resistance is high, resistance of the anode electrode 130 provided in the pixel separation unit is low, and thus potential variations of other pixels do not occurs.

Figure 6:
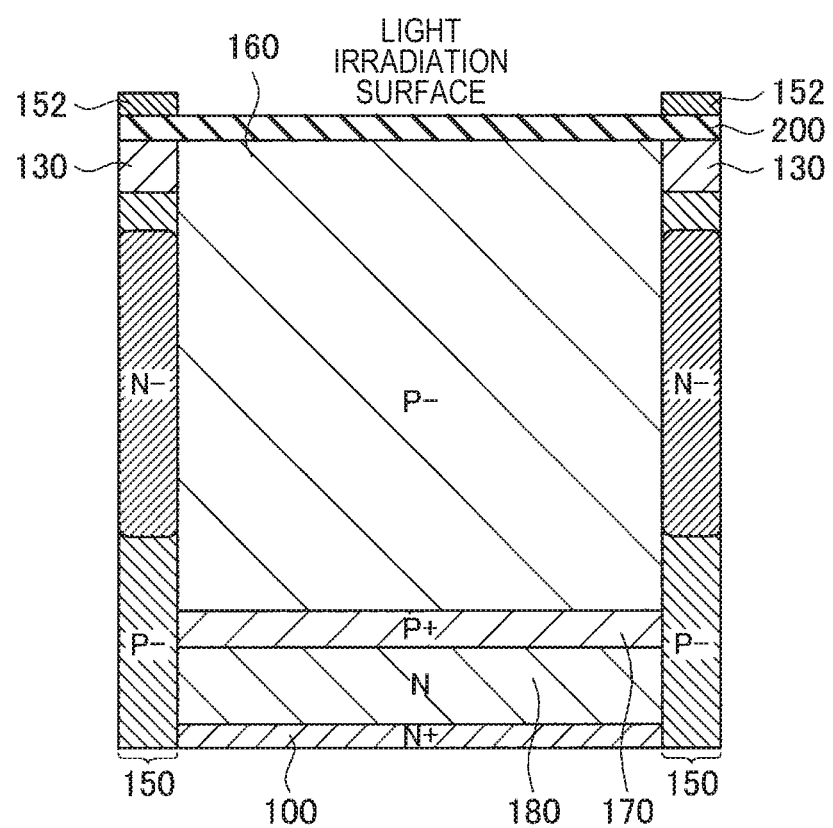
FIG. 6 is a schematic diagram which shows an example in which an insulating layer is provided on an uppermost surface of a photoelectric conversion unit, and a metal layer having a light shielding property is provided on the insulating layer within a range on a pixel separation unit in the configuration example shown in FIG. 2.
Figure 7:
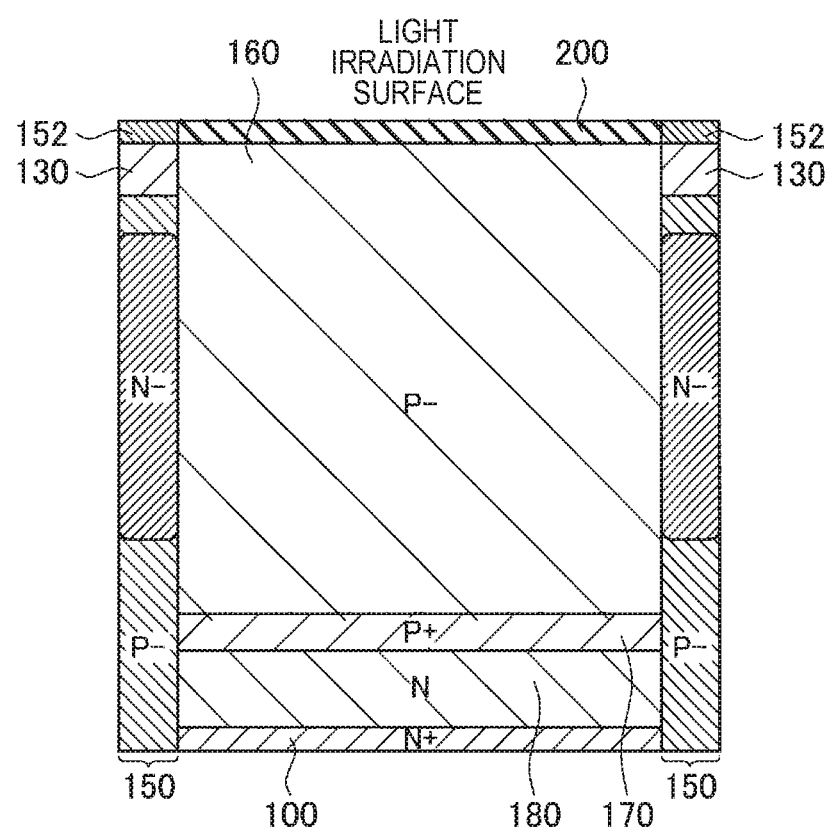
FIG. 7 is a schematic diagram which shows an example in which a metal layer having a light shielding property is provided on an anode electrode without providing an insulating film on a pixel separation unit.

A configuration example shown in FIG. 6 shows an example in which the insulating layer 200 is provided on the uppermost surface (a light irradiation surface) of the photoelectric conversion unit 160 and the metal layer 152 having a light shielding property is provided on the insulating layer 200 in a range above the pixel separation unit 150 with respect to the configuration example shown in FIG. 2. In addition, a configuration example shown in FIG. 7 shows an example in which the insulating film 200 is not provided on the pixel separation unit 150, and the metal layer 152 having a light shielding property is provided on the anode electrode 130. It is possible to classify a light intrusion path for each pixel by providing the metal layer 152 having a light shielding property. According to the configuration example shown in FIG. 7, it is possible to set the anode electrode 130 and the metal layer 152 having a light shielding property to have the same potential.

Figure 8:
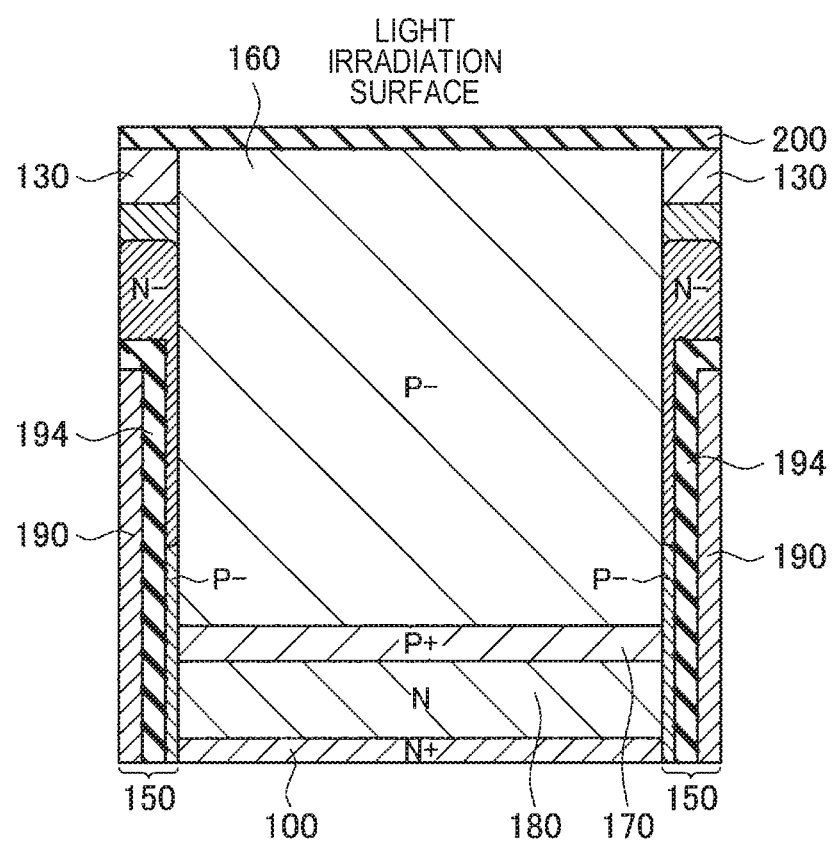
FIG. 8 is a schematic diagram which shows an example in which an insulating layer is provided on a light irradiation surface without providing a metal layer having a light shielding property in the configuration example shown in FIG. 3.
Figure 9:
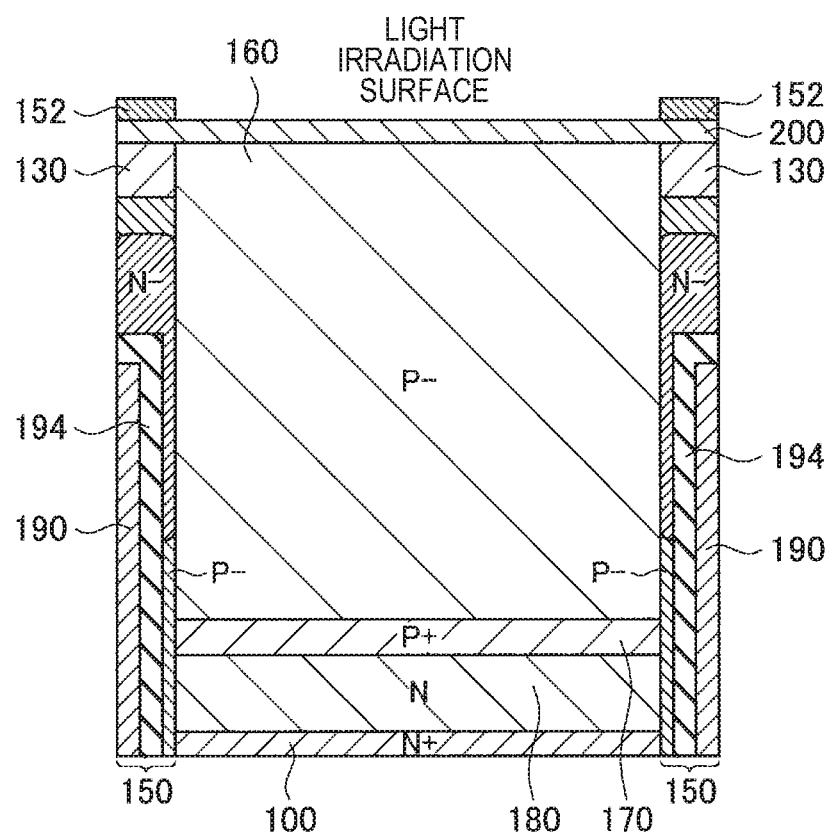
FIG. 9 is a schematic diagram which shows an example in which an insulating layer and a metal layer having a light shielding property are provided in the configuration example shown in FIG. 3 in the same manner as the configuration example shown in FIG. 6.
Figure 10:
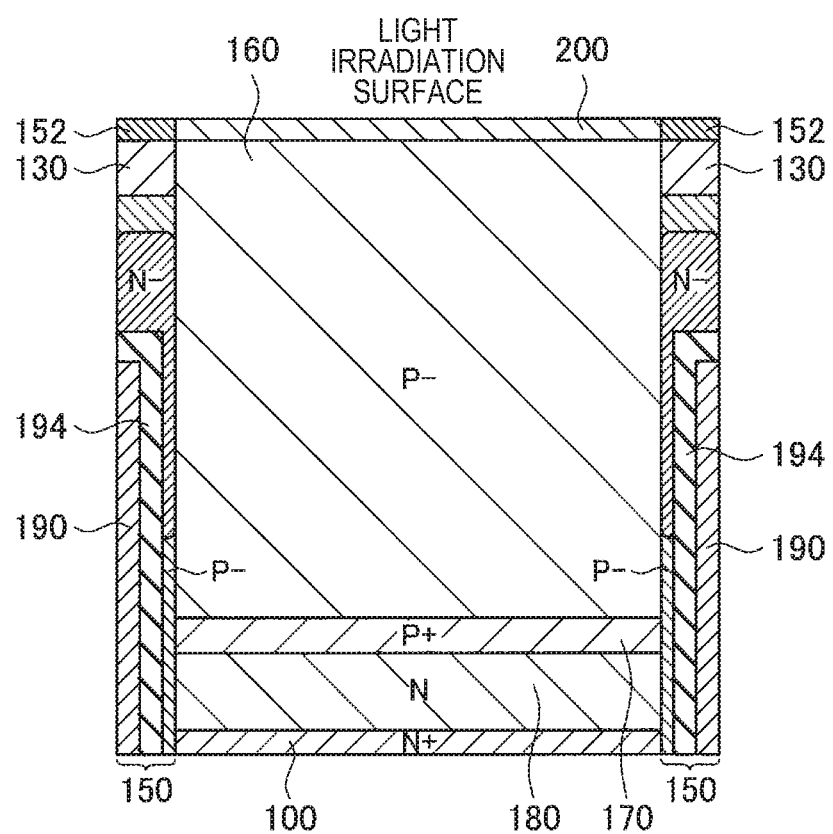
FIG. 10 is a schematic diagram which shows an example in which an insulating layer and a metal layer having a light shielding property are provided in the configuration example shown in FIG. 3 in the same manner as the configuration example shown in FIG. 7.

A configuration example shown in FIG. 8 shows an example in which the metal layer 152 having a light shielding property is not provided and the insulating layer 200 is provided on a light irradiation surface in the configuration example shown in FIG. 3. In addition, a configuration example shown in FIG. 9 shows an example in which the insulating layer 200 and metal layer 152 having a light shielding property are provided, in the same manner as the configuration example shown in FIG. 6, in the configuration example shown in FIG. 3. Moreover, a configuration example shown in FIG. 10 shows an example in which the insulating layer 200 and metal layer 152 having a light shielding property are provided, in the same manner as the configuration example shown in FIG. 7, in the configuration example shown in FIG. 3.

Figure 11:
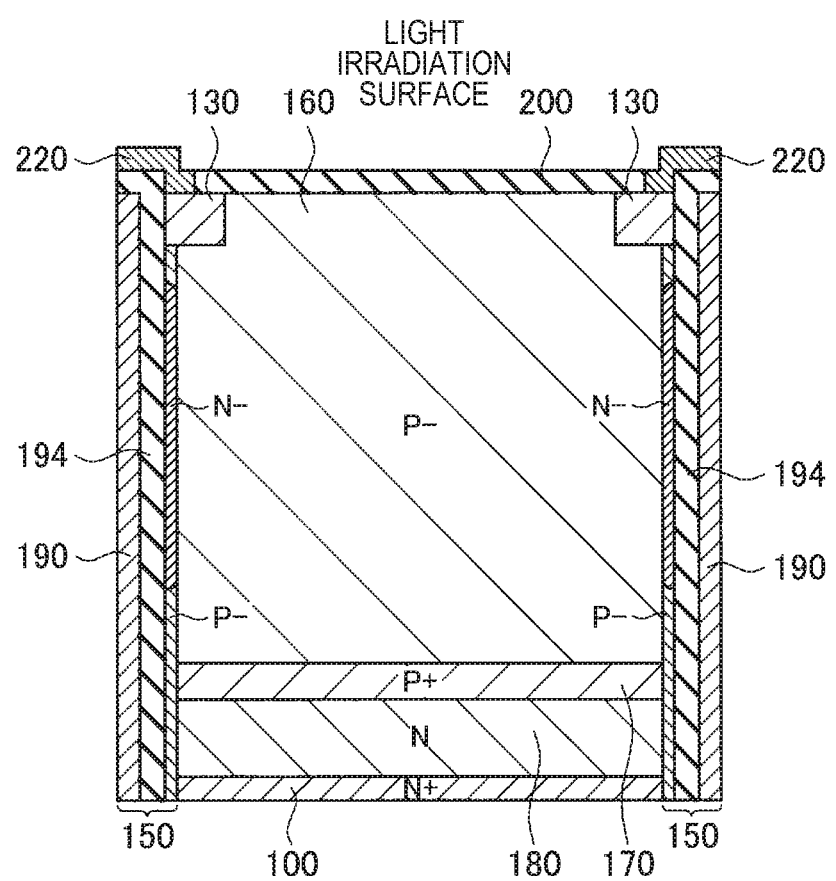
FIG. 11 is a schematic diagram which shows an example in which an anode electrode is disposed further on a pixel region side than a pixel separation unit, and the anode electrode is connected to a front surface metal layer provided on the pixel separation unit.
Figure 12:
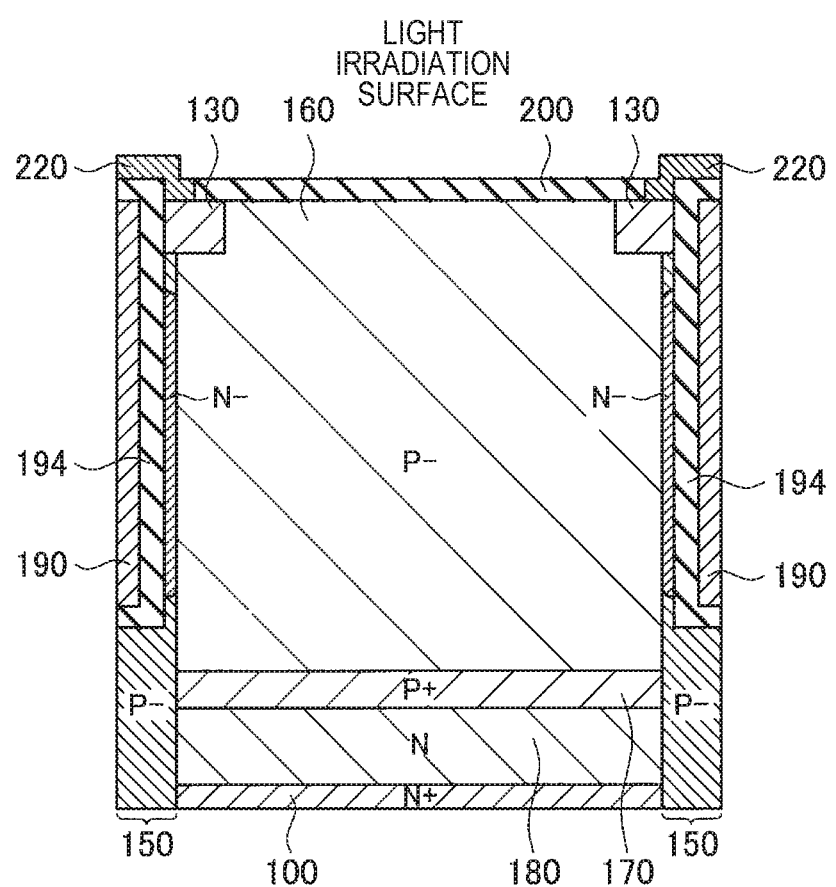
FIG. 12 is a schematic diagram which shows an example in which a length of a buried metal layer is shortened in a depth direction of the pixel region.

In addition, a configuration example shown in FIG. 11 shows an example in which the anode electrode 130 is disposed further on a pixel region side than the pixel separation unit 150, and the anode electrode 130 is connected to a front surface metal layer 220 provided on the pixel separation unit 150 in the configuration example shown in FIG. 4. The anode electrode 130 is connected to an anode electrode 130 in an adjacent pixel region by the front surface metal layer 220. For this reason, the front surface metal layer 220 is formed to straddle over the pixel separation unit 150. In addition, a configuration example shown in FIG. 12 shows an example in which a length of the buried metal layer 190 is shortened in a depth direction of the pixel region (the photoelectric conversion unit 160).

4. Withdrawing Anode Electrode to the Outside

Figure 13:
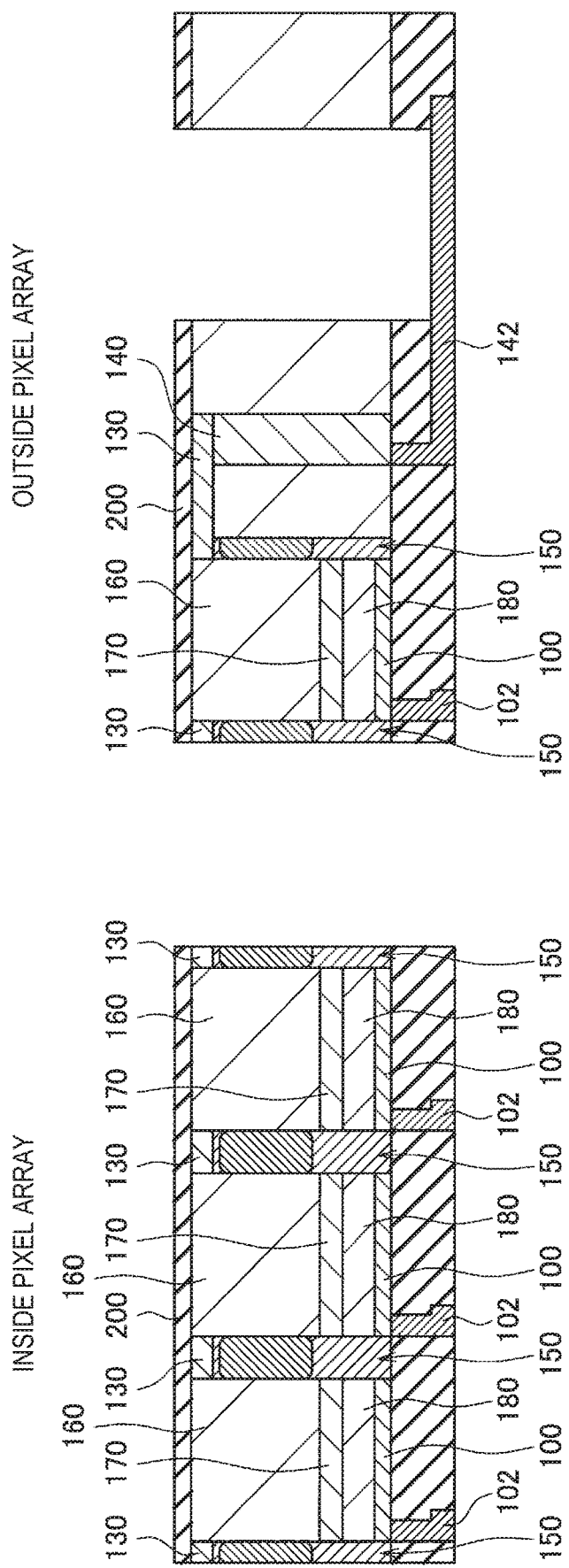
FIG. 13 is a schematic diagram which shows a positional relationship between an anode electrode and an electrode connected to the anode electrode.
Figure 14:
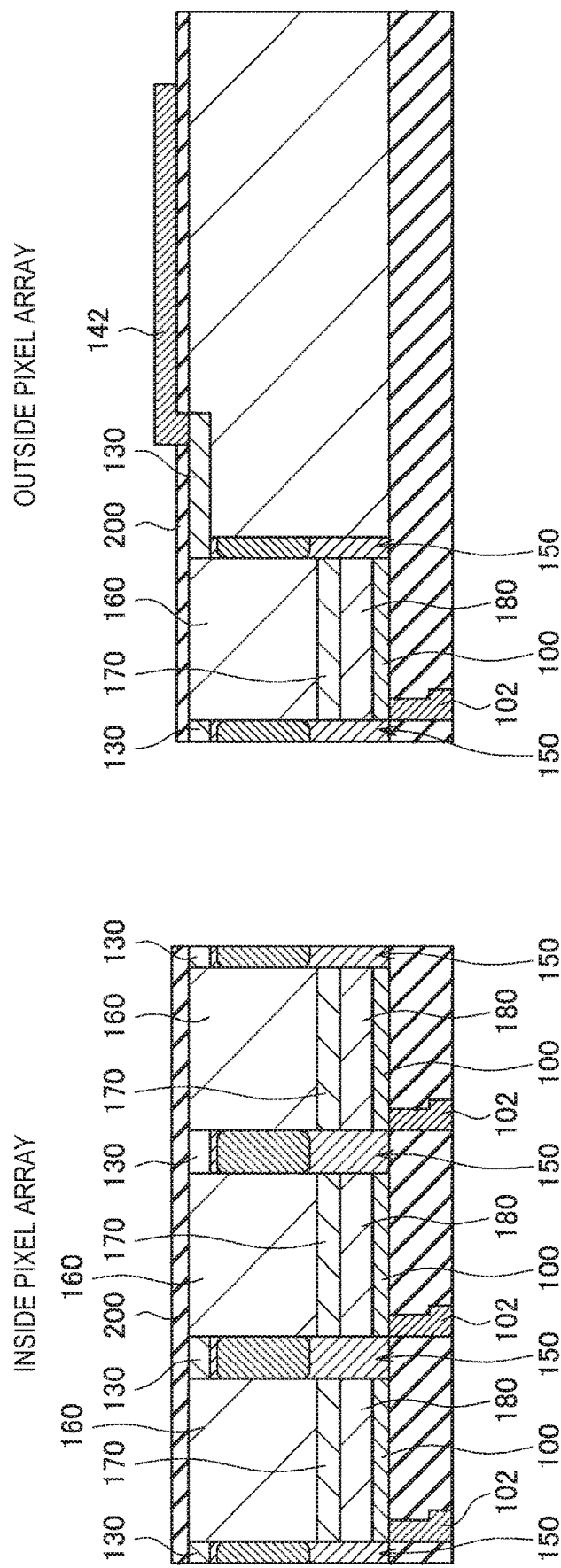
FIG. 14 is a schematic diagram which shows a positional relationship between an anode electrode and an electrode connected to the anode electrode.
Figure 15:
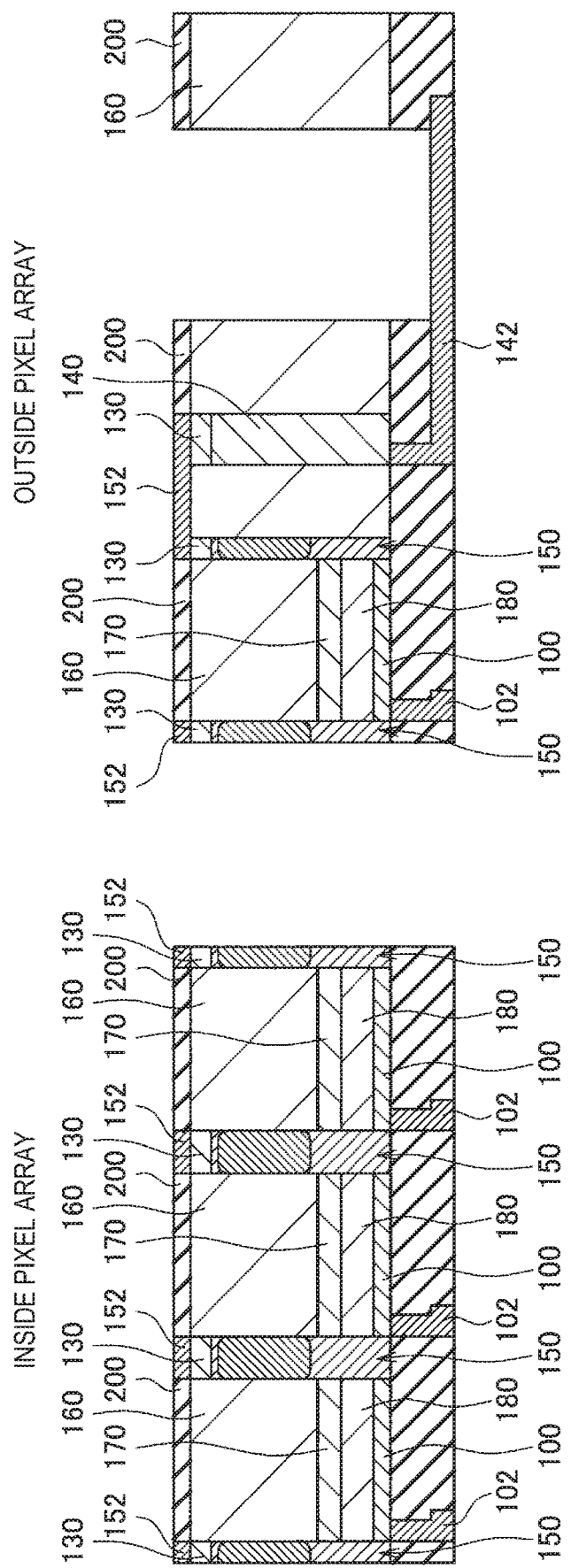
FIG. 15 is a schematic diagram which shows a positional relationship between an anode electrode and an electrode connected to the anode electrode.

FIGS. 13 to 15 are schematic diagrams which show positional relationships between the anode electrode 130 and an electrode 142 connected to the anode electrode 130. Here, the electrode 142 is provided outside the pixel array and functions as a bonding pad (a withdrawing electrode). FIG. 13 shows an example in which the contact layer 140 is provided like in FIG. 2 such that the anode electrode 130 is withdrawn to the front surface side via the contact layer 140 and the contact layer 140 is connected to the electrode 142 on the front surface side. Note that the contact layer 140 may also be connected to a circuit around the pixel array.

An example shown in FIG. 14 shows an example in which the electrode 142 is provided on the back surface side in the same manner as the anode electrode 130, and the anode electrode 130 is directly connected to the electrode 142. In the example shown in FIG. 14, the electrode 142 is provided on the back surface side as a bonding pad. In addition, the metal layer 152 having a light shielding property may be provided on the anode electrode 130, and the metal layer 152 may also be connected to the electrode 142 as a bonding pad in FIG. 14.

An example shown in FIG. 15 is a schematic diagram which shows an example in which the electrode 142 is provided in the front surface side like the example shown in FIG. 13, but also shows an example in which the electrode 152 connected to the anode electrode 130 is provided and connection to the contact layer 140 is performed via the electrode 152.

5. Positional Relationship Between Anode Electrode and Contact Layer

Figure 16:
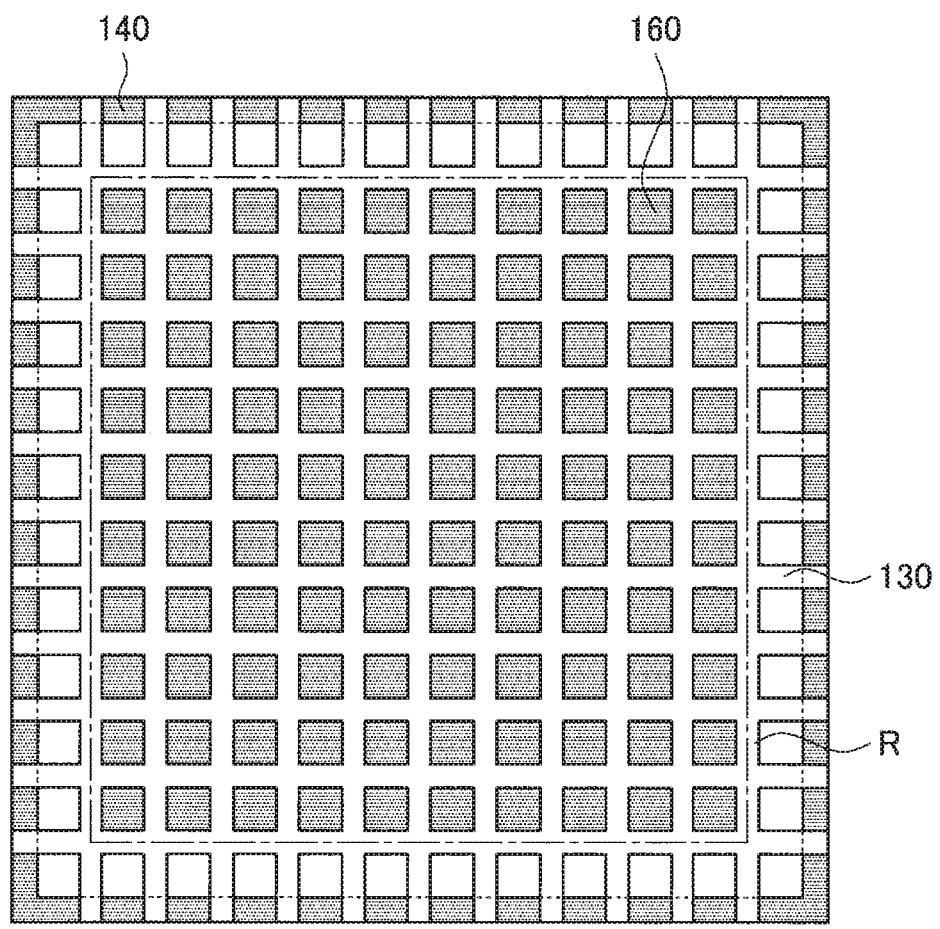
FIG. 16 is a plan view which shows a positional relationship between an anode electrode and a contact layer.
Figure 17:
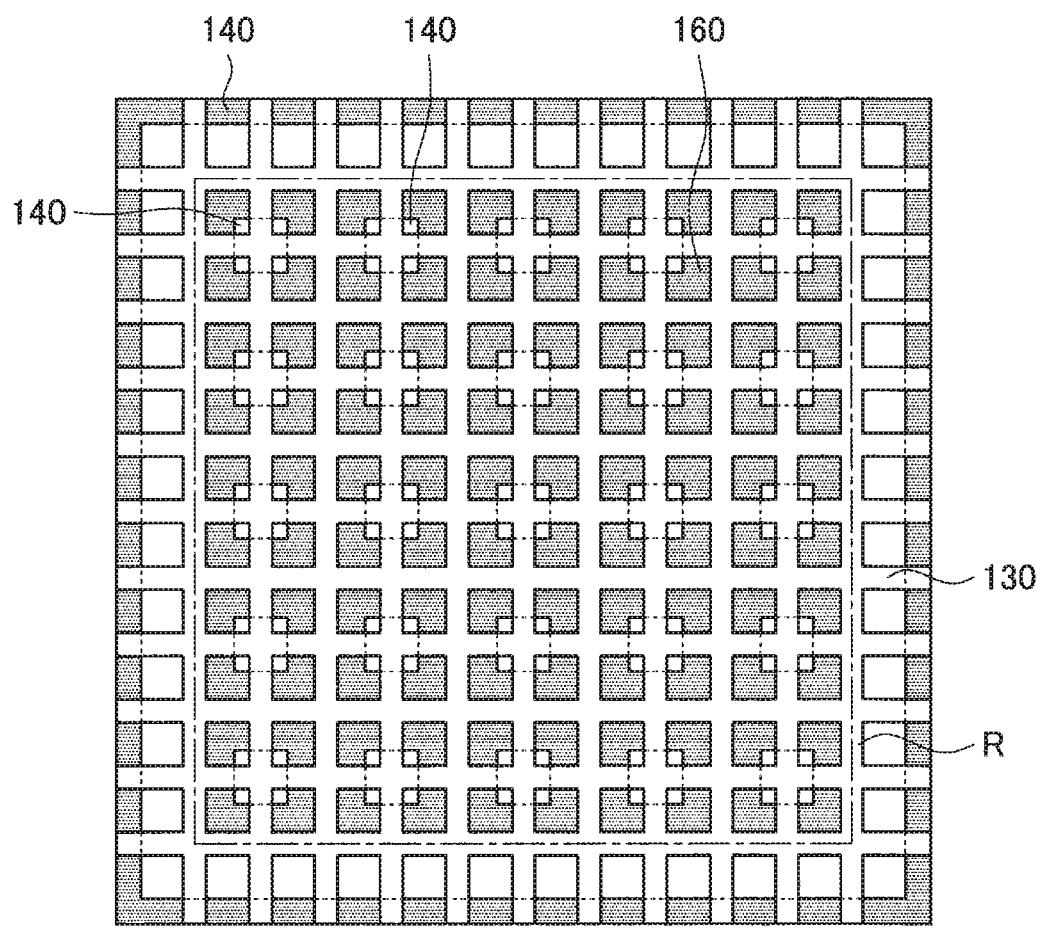
FIG. 17 is a plan view which shows a positional relationship between an anode electrode and a contact layer.

FIGS. 16 and 17 are plan views which show positional relationships between the anode electrode 130 and the contact layer 140, and show states viewed from a light irradiation surface side (the back surface side). In FIGS. 16 and 17, an inside of an one-dot chain line R is a region in the pixel array, and an outside of the one-dot chain line R is a region outside the pixel array. As shown in FIG. 16, since the anode electrode 130 is provided along the pixel separation unit 150 in the pixel array, the anode electrode 130 has a lattice-like shape. In a case in which the metal layer 152 having a light shielding property is provided, the metal layer 152 having the same shape as the lattice-like anode electrode 130 shown in FIG. 16 can be provided on the anode electrode 130. The metal layer 152 having a light shielding property shifts the position from the pixel separation unit 150 as going toward a periphery in the pixel array, and thereby it is possible to perform correction in accordance with a pupil position and to improve a light shielding effect. In particular, in a case in which the metal layer 152 having a light shielding property is formed on the anode electrode 130 via the insulating layer 200 as shown in FIG. 6, the metal layer 152 and the anode electrode 130 are not integrated, and thus the position of the metal layer 152 can be shifted from the pixel separation unit 150 (the anode electrode 130) as going toward the periphery in the pixel array. Outside the pixel array, the contact layer 140 is provided to surround the pixel array, and, as shown in FIG. 2, the anode electrode 130 is withdrawn to the front surface side via the contact layer 140. By providing the contact layer 140 around an entire periphery outside the pixel array, it is possible to reliably suppress a voltage variation in the anode electrode 130.

FIG. 17 shows an example in which the contact layer 140 is provided even in the pixel array in addition to the configuration of FIG. 16. As shown in FIG. 17, it is possible to further stabilize the potential of the anode electrode 130 by providing the contact layer 140 also in the pixel array.

6. Configuration Example Including Color Filter and Lens

Figure 18:
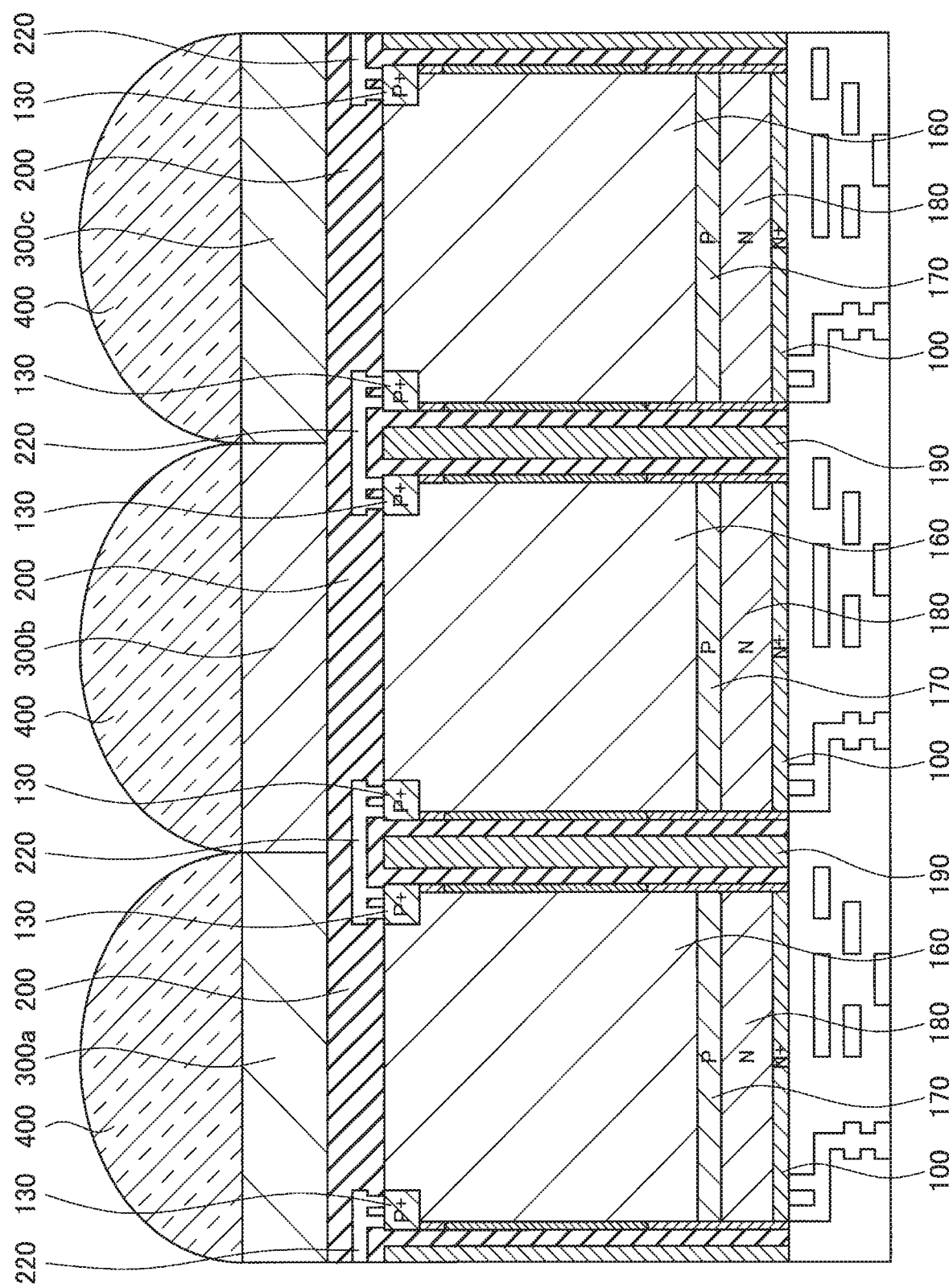
FIG. 18 is a schematic sectional view which shows a configuration in which a color filter is provided on an insulating layer of a light irradiation surface and an on-chip lens is provided further upward on the color filter in the configuration shown in FIG. 12.

FIG. 18 is a schematic sectional view which shows a configuration in which color filters 300a, 300b, and 300c are provided on the insulating layer 200 on the light irradiation surface, and an on-chip lens 400 is provided further on the color filters 300a, 300b, and 300c. Light which has passed through the on-chip lens 400 and the color filters 300a, 300b, and 300c is emitted to the photoelectric conversion unit 160. Note that the insulating film 194 of the pixel separation unit 150 shown in FIG. 12 is provided in common with the insulating layer 200 on the light irradiation surface in FIG. 18.

Figure 19:
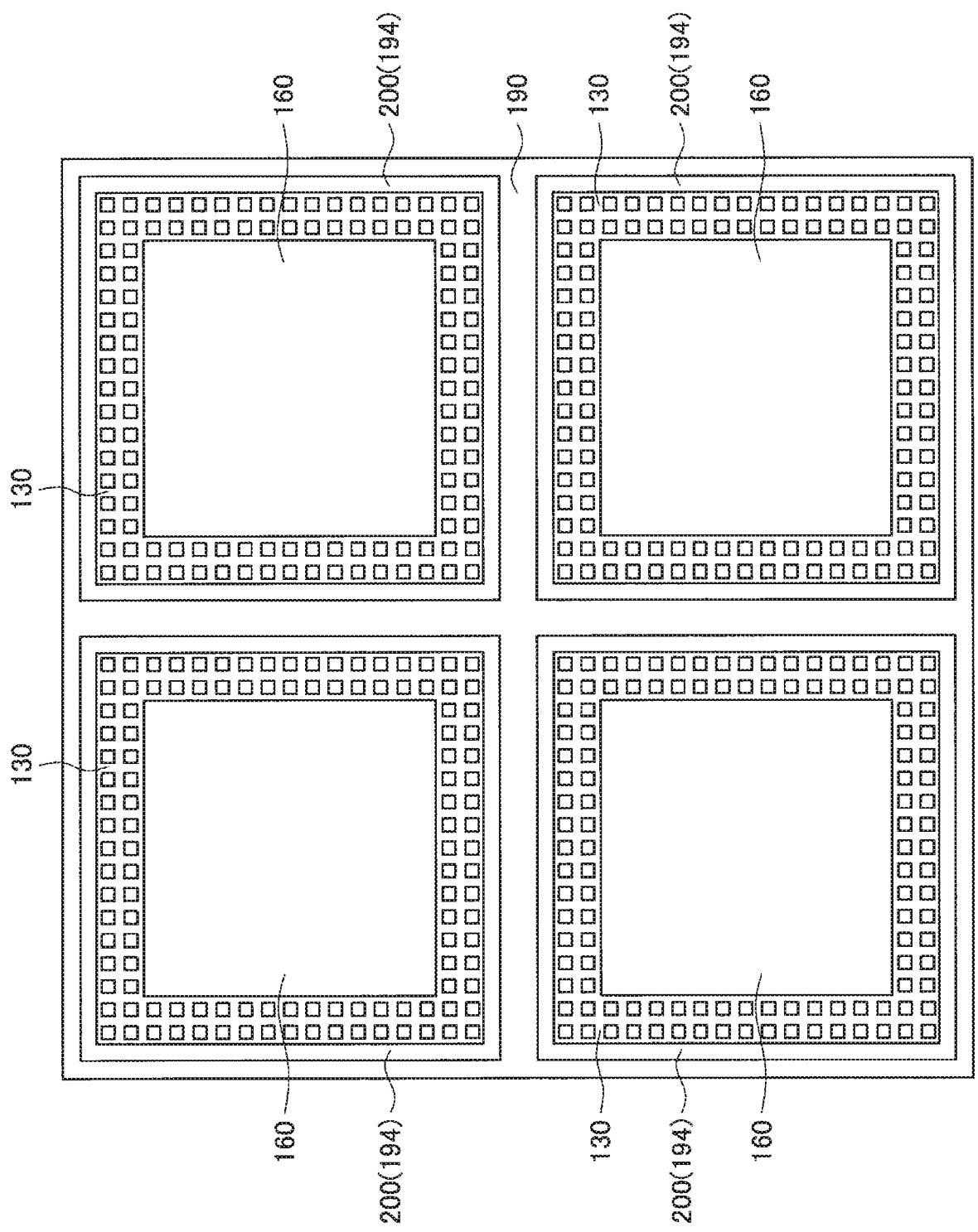
FIG. 19 is a schematic diagram which shows a state of a region on a photoelectric conversion unit side viewed from an interface between the photoelectric conversion unit and the insulating layer shown in FIG. 18.

FIG. 19 is a schematic diagram which shows a state of a region on a photoelectric conversion unit 160 side viewed from an interface between the photoelectric conversion unit 160 and the insulating layer 200 shown in FIG. 18. As shown in FIG. 19, the pixel separation unit 150 is provided from the buried metal layer 190 and the insulating layer 200 (the insulating film 194), and a pixel region including the photoelectric conversion unit 160 is defined by the pixel separation unit 150. In each photoelectric conversion unit 160 shown in FIG. 19, the anode electrode 130 is provided to surround the pixel region along the pixel separation unit 150.

7. Application Example of Imaging Device According to the Present Embodiment

Figure 20:
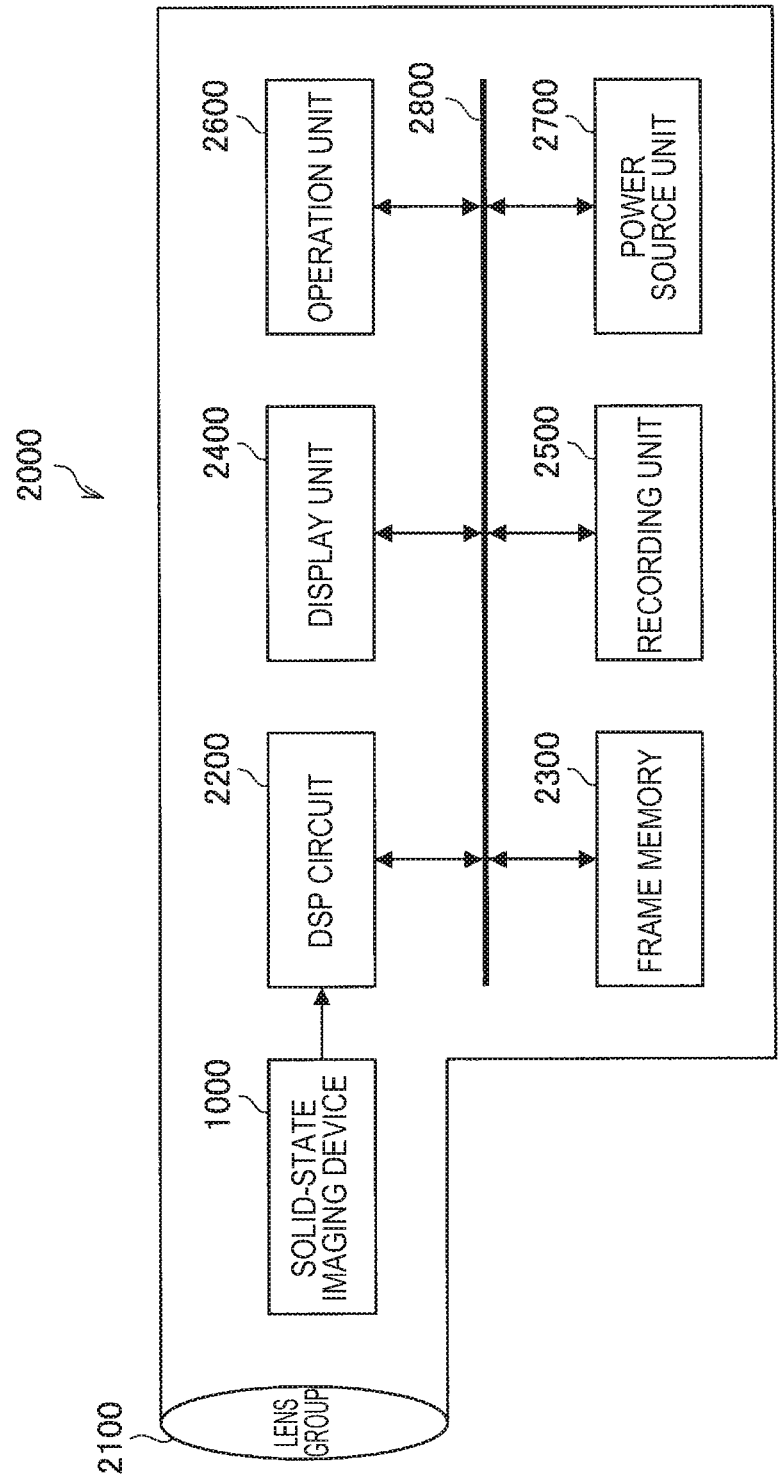
FIG. 20 is a block diagram which shows a configuration example of a camera apparatus as an electronic apparatus to which the present technology is applied.

FIG. 20 is a block diagram which shows a configuration example of a camera apparatus 2000 as an electronic apparatus to which the present technology is applied. The camera apparatus 2000 shown in FIG. 20 includes an optical unit 2100 made of a lens group and the like, an imaging device (an imaging device) 1000 described above, and a DSP circuit 2200 which is a camera signal processing device. In addition, the camera apparatus 2000 includes a frame memory 2300, a display section (a display apparatus) 2400, a recording unit 2500, an operation unit 2600, and a power supply unit 2700. The DSP circuit 2200, the frame memory 2300, the display section 2400, the recording unit 2500, the operation unit 2600, and the power supply unit 2700 are connected to one another via a bus line 2800.

The optical unit 2100 forms an image on an imaging surface of the imaging device 1000 by taking incident light (image light) from a subject. The imaging device 1000 converts a light amount of the incident light imaged on the imaging surface by the optical unit 2100 into an electric signal in pixel units, and outputs it as a pixel signal.

The display section 2400 is formed of, for example, a panel-type display apparatus such as a liquid crystal panel or an organic electro luminescence (EL) panel, and displays a moving image or a still image imaged by the imaging device 1000. The DSP circuit 2200 receives a pixel signal output from the imaging device 1000, and performs processing for causing it to be displayed on the display section 2400. The recording unit 2500 records a moving image or a still image imaged by the imaging device 1000 on a recording medium such as a video tape or a digital versatile disk (DVD).

The operation unit 2600 issues an operation command for various functions of the imaging device 1000 under an operation of a user. The power supply unit 2700 appropriately supplies various types of power sources which are operation power sources of the DSP circuit 2200, the frame memory 2300, the display section 2400, the recording unit 2500, and the operation unit 2600 to these supply targets.

8. Variation of the Present Disclosure

In the following description, problems that arise in a case in which the present disclosure is specifically executed and variations of examples for solving the problems will be described.

8.1. Common Structure

Figure 21:
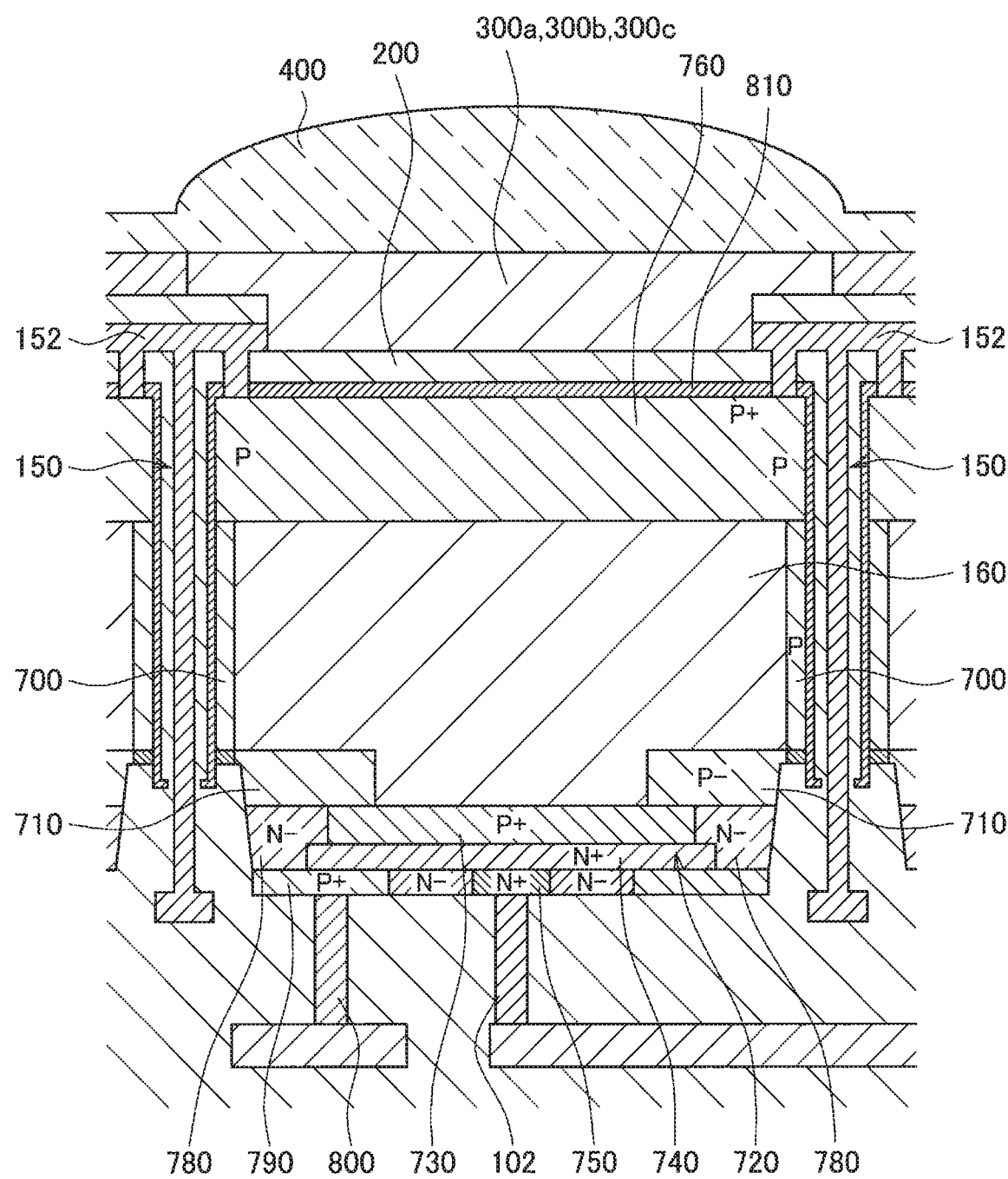
FIG. 21 is a schematic sectional view which shows a basic configuration common to each variation.

First, a basic configuration common to each variation will be described. FIG. 21 is a schematic sectional view which shows a basic configuration common to each variation. The imaging device 200 shown in FIG. 21 includes a multiplication region as a SPAD pixel, and a photoelectric conversion unit (an N− region) 160 which performs a photoelectric conversion, and an uppermost surface of the photoelectric conversion unit 160 on the back surface side is regarded as a light irradiation portion irradiated with light.

As shown in FIG. 21, the anode electrode 130 is electrically connected to a P region 760. The P region 760 is configured such that an impurity concentration is lowered at a lower layer. In addition, a P region 700 and a P− region 710 are formed along the pixel separation unit 150 from the P region 760, and the P region 760 to an avalanche unit 720 are electrically connected. The avalanche unit 720 is configured by a P+ region 730 and an N+ region 740 being joined. The P region 700 is configured by causing reverse charges (holes) to be accumulated such that electric charges (electrons) to be read pass through the avalanche unit 720. It is desirable that the P− region 710 is set as a low-concentration region to increase a potential at the center such that electric charges pass through the avalanche unit 720.

The N+ region 740 is connected to the electrode 102 via an N+ region 750. In addition, an N− region 780 is formed on side surfaces of the P+ region 730 and the N+ region 740. In addition, a P+ layer 790 electrically connected to the N+ layer 740 and the N− region 780 is provided, and the P+ layer 790 is grounded (GND) via an electrode 800. Note that the P+ layer 790 and the electrode 800 may not be provided.

A fixed charge film 810 is provided on a side surface of the pixel separation unit 150 and an upper layer of the region 760. In addition, a configuration of the upper layer of the P region 760 is basically the same as the configuration shown in FIG. 18.

In the imaging device 2000 of FIG. 21 configured as described above, the N+ region 740 and the N+ region 750 correspond to the N-type layer 180 shown in FIG. 2. In addition, the P region 760, the P region 700, and the P− region 710 correspond to the photoelectric conversion unit (a third semiconductor layer) 160, and the P-type layer 170.

Each variation described below basically is set to include configurations of SPAD pixels including the P region 760, the P region 700, the P− region 71, the avalanche unit 720 (the P+ region 730, the N+ region 740), the N+ region 750, the N− region 780, and the like, the configurations of these are set as basic configurations and illustrations thereof are appropriately omitted. In addition, configurations other than the basic configurations are partially shown, but they can be appropriately substituted for the basic configurations in each variation.

8.2. First Variation

In order to apply a high voltage to the back surface side, a high potential is applied to the P-type layer on a Si front surface and is caused to propagate to the back surface. For this reason, a very large potential difference occurs between the P-type and the N-type layers on the front surface side, and it is desirable to separate the P-type layer from the N-type layer to obtain a sufficient isolation breakdown voltage.

A first variation is a manufacturing method of a back surface ohmic electrode, and make it possible to cause a strong electric field to be generated from the Si substrate back surface toward a PN junction portion of the front surface while keeping an electric field on the Si substrate front surface weak by creating an ohmic electrode such that a voltage is applied to each of the Si substrate front surface side and the Si substrate back surface side.

Normally, impurity is implanted into Si by ion implantation at the time of ohmic electrode formation, and activation is performed by high temperature annealing. On the Si substrate front surface side, since only a material having excellent heat resistance is used, there is no problem caused by high temperature annealing. But, a wiring layer already exists on the Si substrate back surface side, and activation caused by high temperature annealing is difficult.

For this reason, a high-concentration P-type layer (the P+ layer) is formed on an Si substrate before wiring formation, a necessary Si film thickness is secured thereon by an Si epitaxial growth (epi) technology, and a photodiode layer and the like are formed thereon.

For boron (B) of the P+ layer in Si, the first variation has a structure in which B is covered with carbon (C) to suppress diffusion caused by heat applied in a subsequent process. As a result, miniaturization of the P+ layer on the back surface side can be made and a sufficient space can be provided on a light receiving surface.

Figure 22:
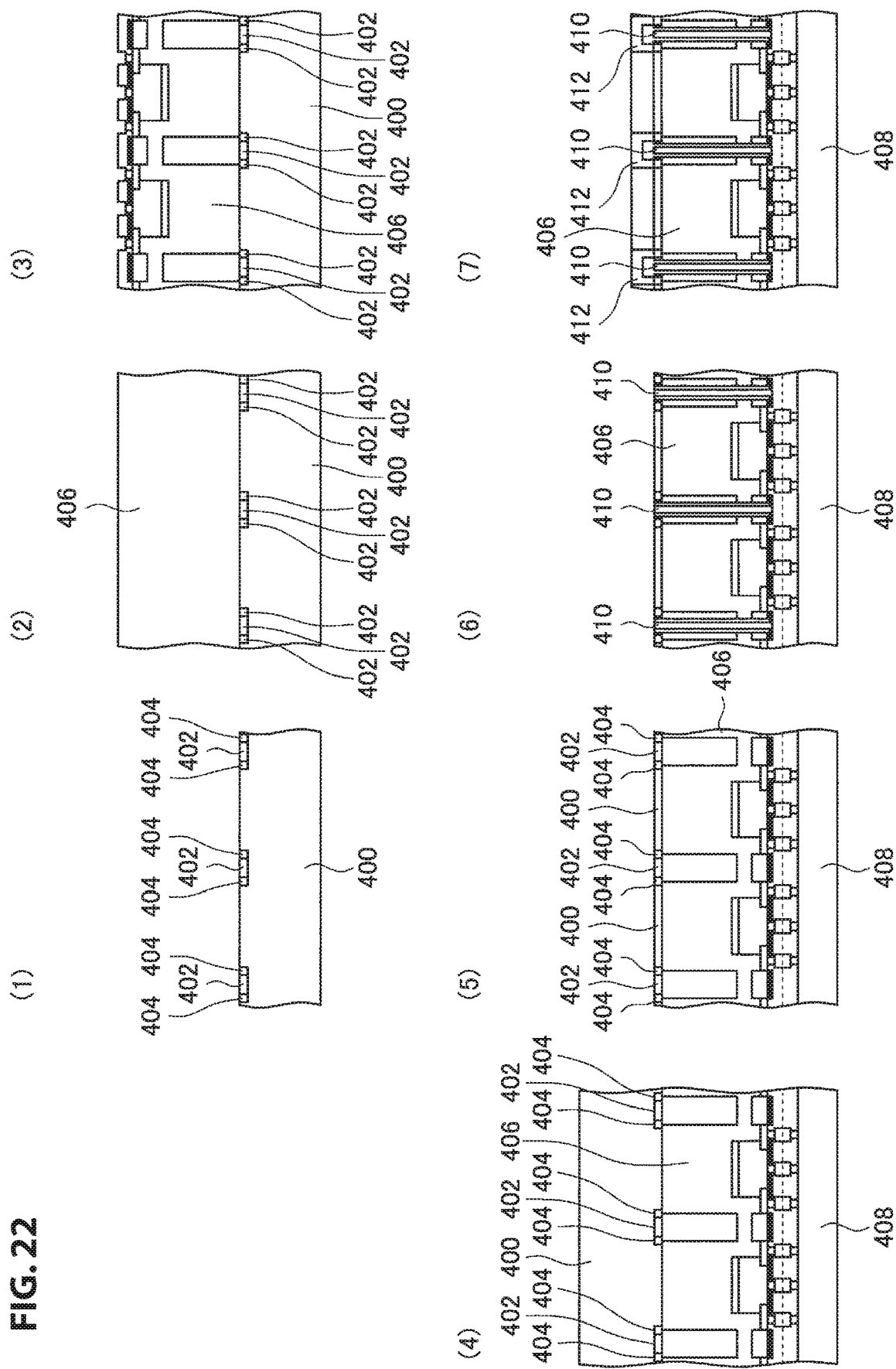
FIG. 22 is a schematic sectional view which shows a manufacturing method of a semiconductor device according to a first variation in process order.

Hereinafter, a manufacturing method of a semiconductor device according to the first variation will be described in process order with reference to FIG. 22. FIG. 22 is a schematic sectional view which shows the manufacturing method of a semiconductor device according to the first variation in process order. First, in a process of (1), patterning is performed on a Si substrate 400, and a P+ layer 402 is formed by boron (B) impurity implantation, solid phase diffusion, or the like. A concentration of boron (B) is $3\times10^{19}/cm^3$ or more because a concentration necessary for a subsequent ohmic junction is required. A C layer 404 is formed in Si to surround an outside of this P+ layer 402. A C concentration is equal to or higher than the B concentration. Then, a mask for patterning is removed and the Si substrate 400 including the P+ layer 402 and the C layer 404 is caused to be exposed.

In a next process of (2), an N-type Si epitaxial layer 406 which is a photodiode is formed on the Si substrate 400 formed in the process (1). A film thickness of the N-type Si epitaxial layer 406 at this time becomes slightly thinner than a film thickness required as a final sensor. Note that normal visible light is about 2 to 10 μm.

In a next process of (3), a sensor formation process (FEOL to BEOL) is performed on the N-type Si epitaxial layer 406 grown in the process (2). Note that front end of line (FEOL) is a first half of a process before the semiconductor manufacture, and mainly performs creation of elements in the Si substrate according to a transistor formation process, an ion implantation (implantation), annealing, and the like. In addition, back end of line (BEOL) is a second half of the process before the semiconductor manufacture, and refers to a wiring process, in particular, a process from formation of wiring to a junction. Although the growth of the N-type Si epitaxial layer 406 so far and heat exceeding 1000° C. is applied in the FEOL, the diffusion of B of the P+ layer 402 is suppressed by the C layer 404. The BEOL and subsequent processes are performed at 450° C. or below.

In a next process of (4), the Si substrate 400 which is completed up to process (3) is reversed upside down and is laminated on a logic substrate 408. At this time, the Si substrate 500 on a sensor side is positioned on the front side.

In a next process of (5), thinning of the Si substrate 400 on a sensor side is performed. At this time, the Si substrate 400 is finished to remain several hundred nm thicker than an upper surface of the N-type Si epitaxial layer 406. As a result, the high-concentration P+ layer 402 patterned on an uppermost surface on a light incidence side is exposed.

In a next process of (6), a trench which separates between pixels is formed, the light shielding metal 410 is buried in this trench, and a leakage of light from an adjacent pixel due to light emission in avalanche breakdown is blocked.

In a next process of (7), contact is dropped on the high-concentration P+ layer 402 of each pixel appearing on the light incident surface side, and all pixels are connected by the wiring 412. This wiring 412 is also used as a light shielding grid.

Figure 23:
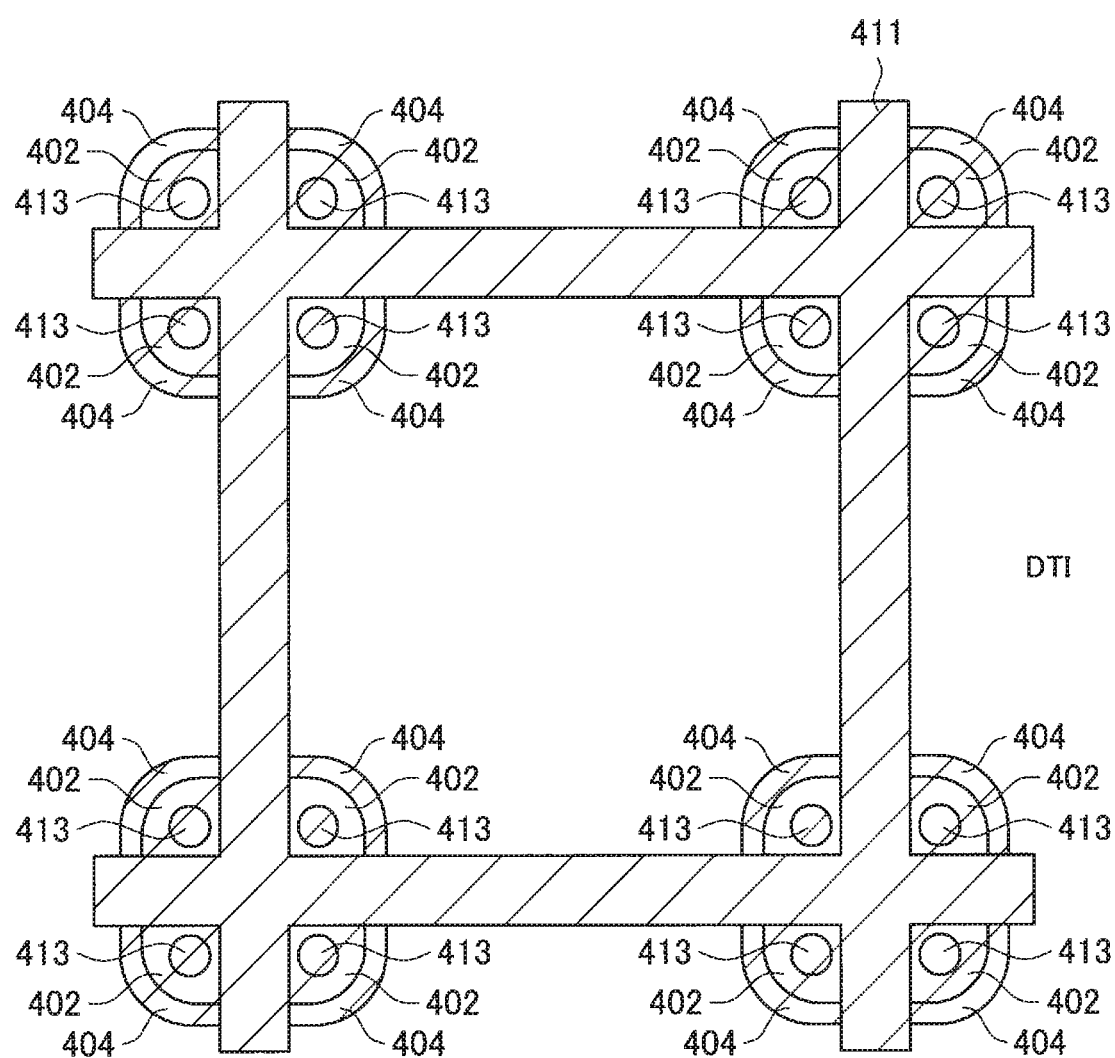
FIG. 23 is a plan view which shows a positional relationship of a P+ layer 402, a C layer 404, a trench 411 into which a light shielding metal 410 is inserted, and a contact hole 413 into which a wiring 412 is inserted.
Figure 24:
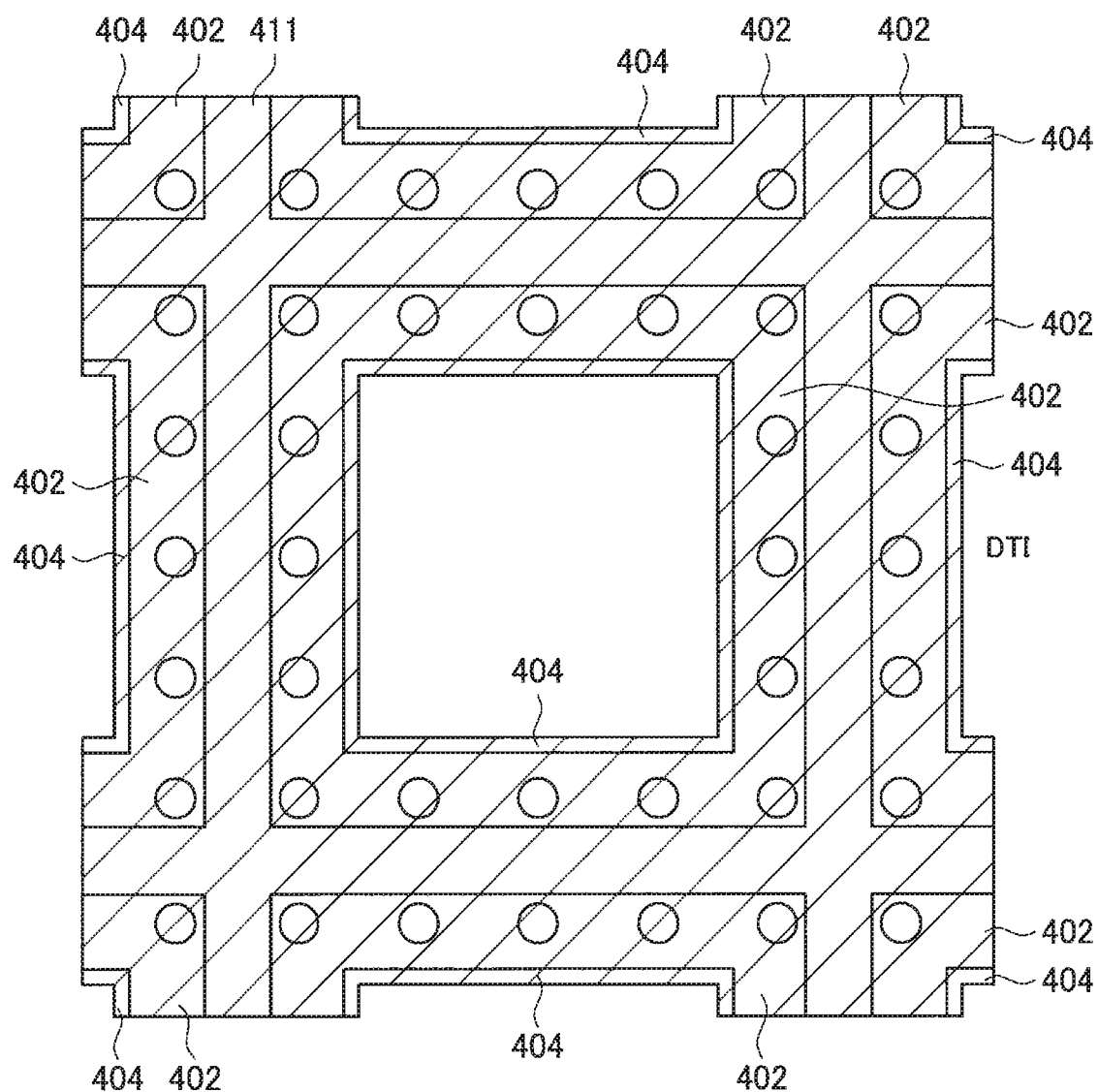
FIG. 24 is a plan view which shows a positional relationship between the P+ layer, the C layer, a trench into which a light shielding metal is inserted, and a contact hole into which a wiring is inserted.

FIGS. 23 and 24 are plan views which show positional relationships among the P+ layer 402, the C layer 404, a trench 411 into which the light shielding metal 410 is inserted, and a contact hole 413 into which the wiring 412 is inserted. FIG. 23 shows an example in which the trench 411 crosses the high-concentration P+ layer 402, and FIG. 24 shows an example in which the trench 411 is along the P+ layer 402. Note that a hatched region functions as a light shielding grid in FIG. 23 and FIG. 24.

Figure 25:
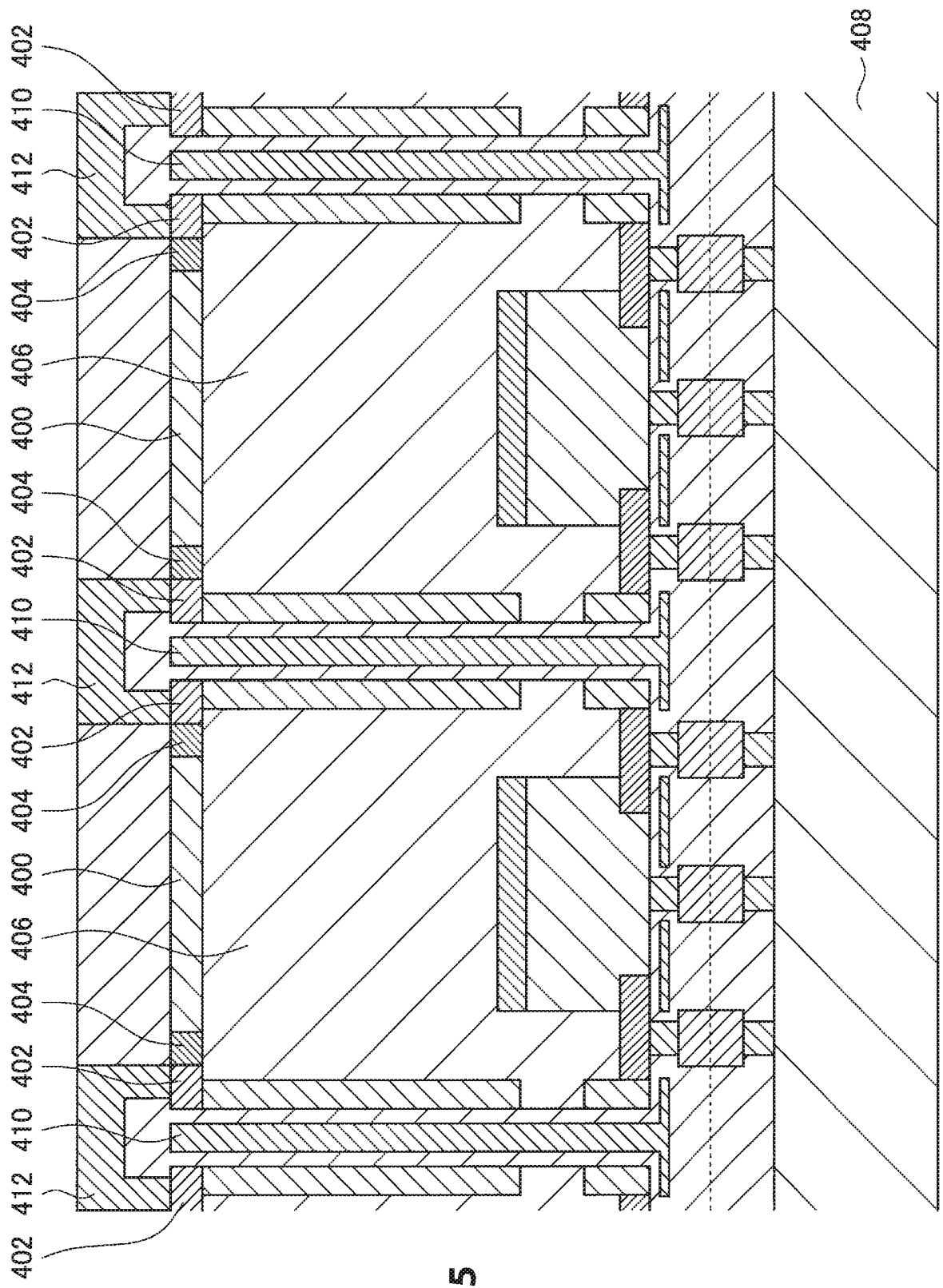
FIG. 25 is a schematic sectional view which shows a semiconductor device completed in the first variation.

FIG. 25 is a schematic sectional view which shows a completed semiconductor device. FIG. 25 shows a structure having a fine contact on the light irradiation surface side. As shown in FIG. 25, a patterned P+ layer 402 made of high-concentration B ($3 \times 10^{19}/cm^3$ or less) is formed on the Si substrate 400 at a position in contact with the wiring 412. In addition, a periphery of the P+ layer 402 is surrounded by the high-concentration C layer 404 ($3 \times 10^{19}/cm^3$ or more) in a planar manner.

Figure 26:
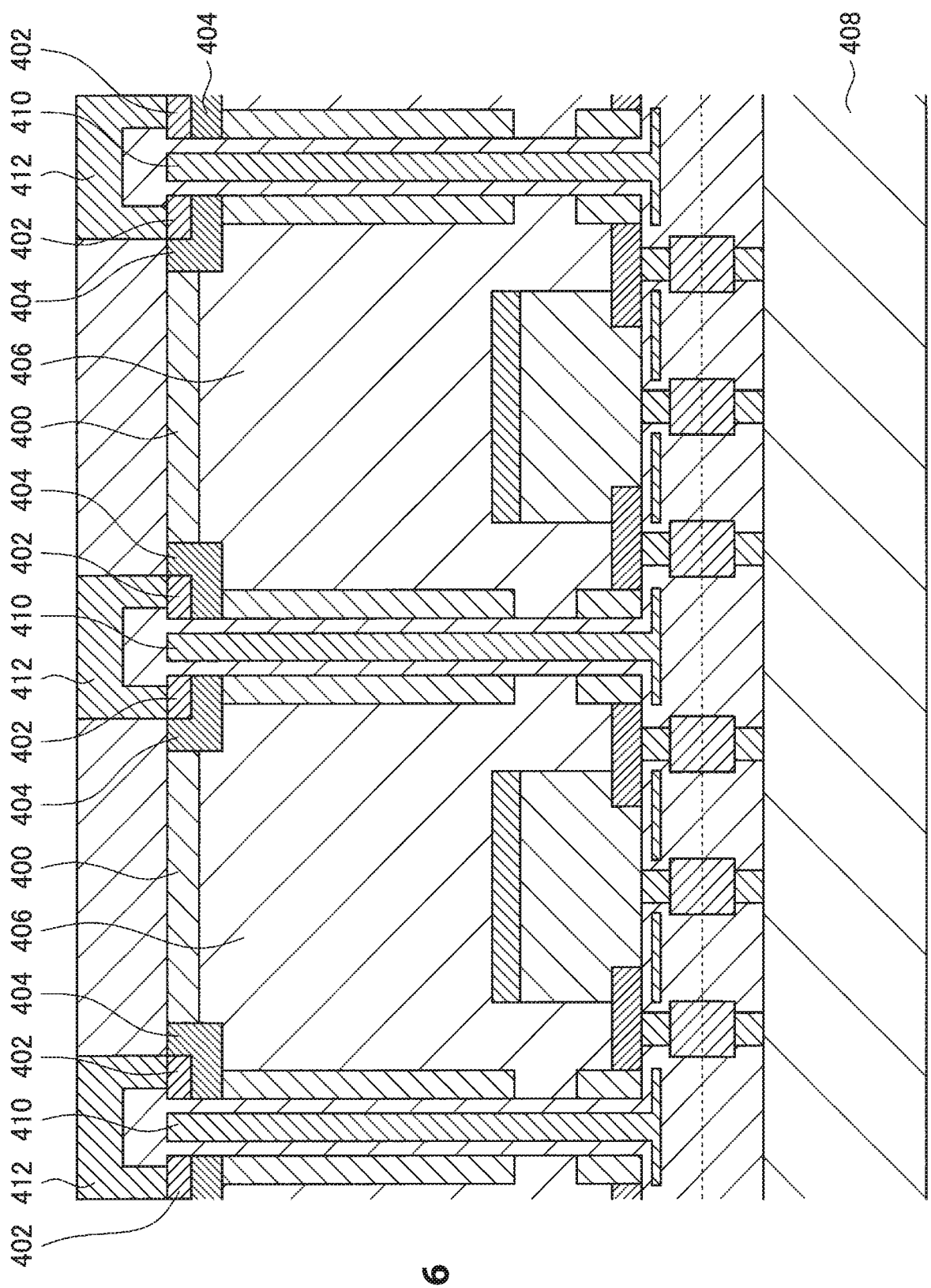
FIG. 26 is a schematic diagram which shows a structure in which a bottom surface portion of the P+ layer is surrounded by the high-concentration C layer in addition to the structure of FIG. 23.

In addition, FIG. 26 shows a structure in which a bottom surface portion of the P+ layer 402 is surrounded by the high-concentration C layer 404 ($3 \times 1019/cm3$ or more) in addition to the structure of FIG. 23.

Note that the diffusion of boron (B) of the P+ layer 402 is suppressed by forming the C layer 404 in the example described above, but high-concentration Ge (concentration $3 \times 10^{19}/cm^3$ or more) may also be used instead of boron (B).

Figure 27:
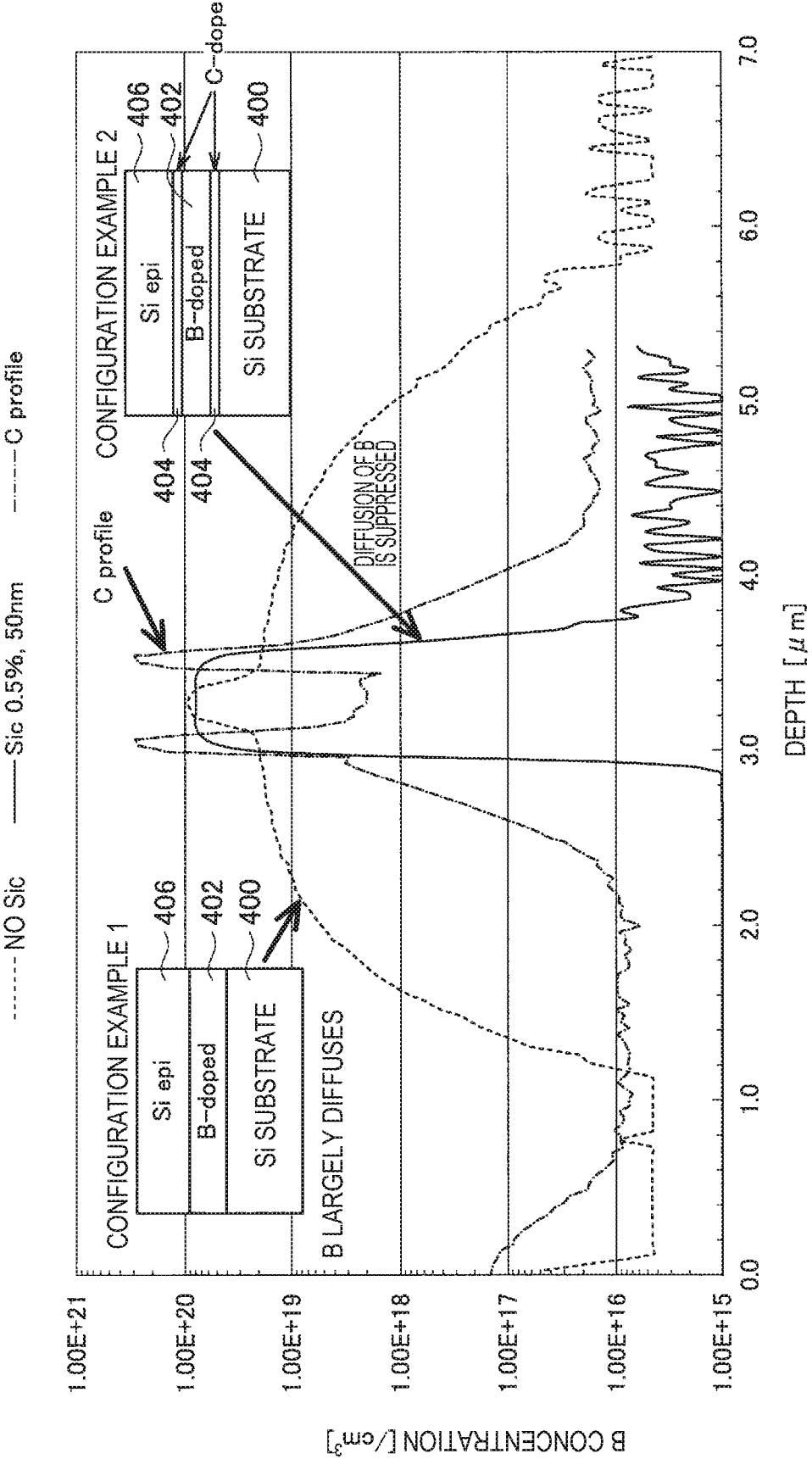
FIG. 27 is a characteristic diagram which shows how boron (B) diffuses after heat treatment in a configuration example 1 in a case in which the P+ layer is formed on a Si substrate and a Si epitaxial layer is formed on the P+ layer, and a case in which the C layer is formed above and below of the P+ layer of the configuration example 1.

FIG. 27 is a characteristic diagram which shows how boron (B) diffuses after heat treatment in a configuration example 1 of a case in which the P+ layer 402 is formed on the Si substrate 400 and the Si epitaxial layer 406 is formed on the P+ layer 402, and a case in which the C layer 404 is formed above and below the P+ layer 402 of the configuration example 1.

In FIG. 27, the P+ layer 402 is positioned between a depth 3.0 μm to a depth 3.6 μm. In addition, a characteristic indicated by a solid line in FIG. 27 is a characteristic indicating a C concentration of the C layer 404 in a configuration example 2.

A characteristic indicated by a broken line in FIG. 27 shows a B concentration after heat treatment of the configuration example 1. As shown in FIG. 27, it is understood that boron (B) diffuses above and below a depth direction after heat treatment in the configuration example 1 in which the C layer 404 is not formed above and below the P+ layer 402.

On the other hand, a characteristic indicated by a one-dot chain line in FIG. 27 shows a B concentration after heat treatment of the configuration example 2. As shown in FIG. 27, the diffusion of boron (B) after heat treatment can be suppressed in the configuration example 2 in which the C layer 404 is formed above and below the P+ layer 402.

8.3. Second Variation

As described in the first variation, there is a method of providing electrodes on the front surface side and the back surface side and applying an electric field by forming an electrode on the back surface side via the P+ layer to apply a high voltage to the back surface side. A method of forming the P+ layer includes impurity introduction using ion implantation. However, in a case of performing implantation from the back surface side, since it is a process after wiring is formed, recovery of implantation damages can be difficult in some cases since sufficient annealing temperature cannot be applied. In addition, a method of performing ion implantation using high energy from the front surface side and forming the P+ layer is considered, but since ion implantation with a dose amount of about $1 \times 10^{15}$ $cm^{-2}$ is required to make contact with the electrodes, recovery of crystal defects occurring in the photodiode layer may be difficult even though high temperature annealing of about 1000° C. is performed.

For this reason, when cathode and anode electrodes are formed from the front surface side in the SPAD, it is difficult to design an impurity profile for applying high electric field, especially, when a pixel is miniaturized. When an electrode is formed on the back surface side, a low resistance P+ layer needs to be formed, but, when an impurity introduction technology such as ion implantation is used, a recovery of crystal defects occurring in a photodiode region is difficult, and thus an improvement in characteristics such as a dark current cannot be expected.

In the second variation, an anode electrode is formed on the back surface side by using a two-layer epitaxial substrate. A two-layer epitaxial substrate 440 in which a P+ epitaxial layer 442 and an N epitaxial layer 444 are formed on the supporting substrate 430 is used. A SPAD pixel is formed from the front surface side in this two-layer epitaxial substrate 440 and is laminated on the supporting substrate 430. The high-concentration P+ layer 442 is exposed by shaving Si from the back surface side in the lamination. In the P+ layer 442, an ohmic contact can be taken using a metal layer such as tungsten (W) caused to go through from the front surface side.

With this structure, it is possible to make an electric field constant to an anode to a cathode on the back surface side and to achieve miniaturization. In addition, since an epitaxial layer is used for an activation region of a photodiode, crystal defects due to the formation of a P+ layer does not occur in the photodiode.

Among the two-layer epitaxial substrate, a first P+ layer has low resistance to reduce contact resistance with metal. Specifically, the impurity concentration is set to $2 \times 10^{19}/cm^3$ or more.

Figure 28:
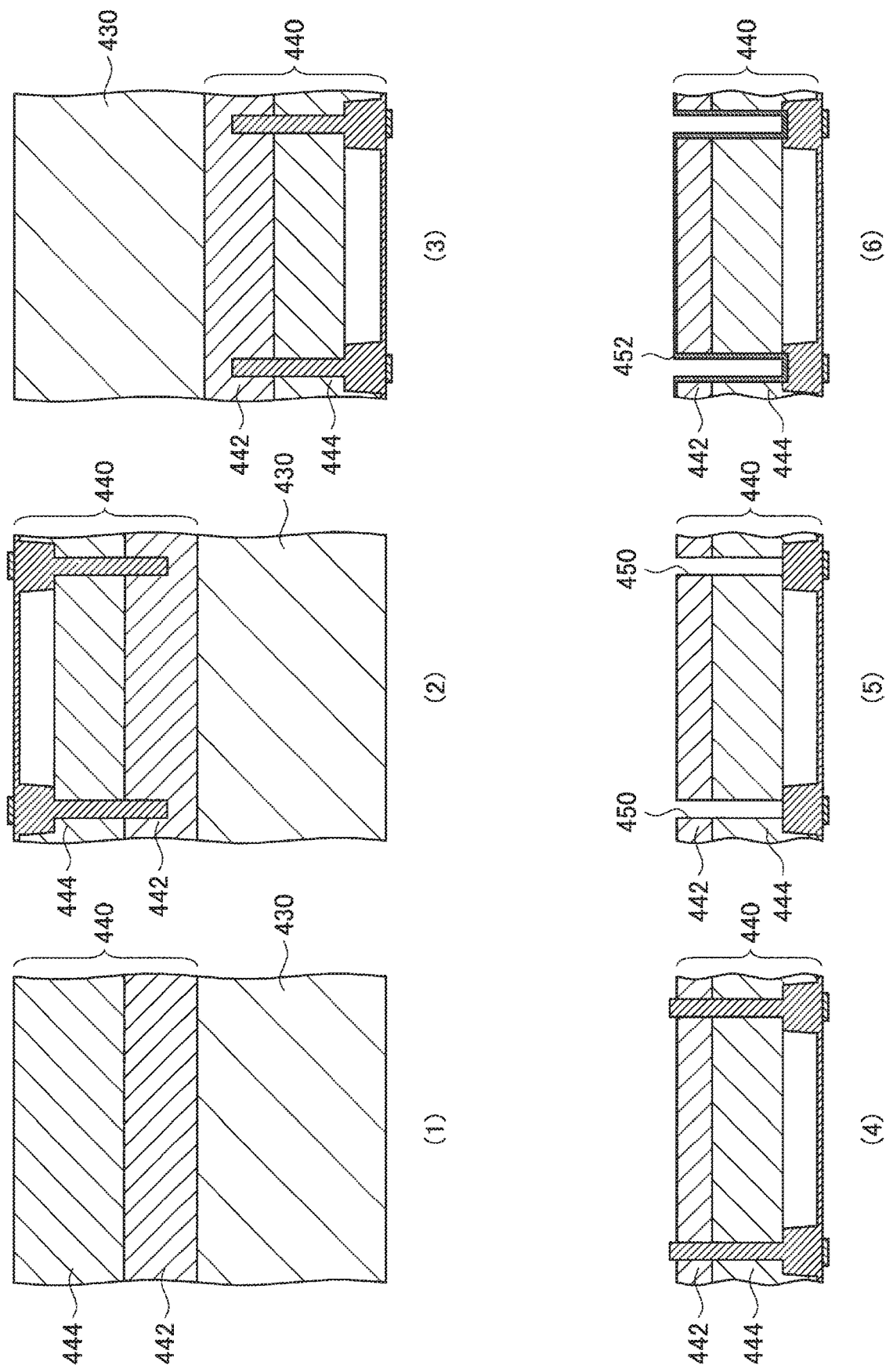
FIG. 28 is a schematic sectional view which shows a manufacturing method of a semiconductor device according to a second variation in process order.
Figure 29:
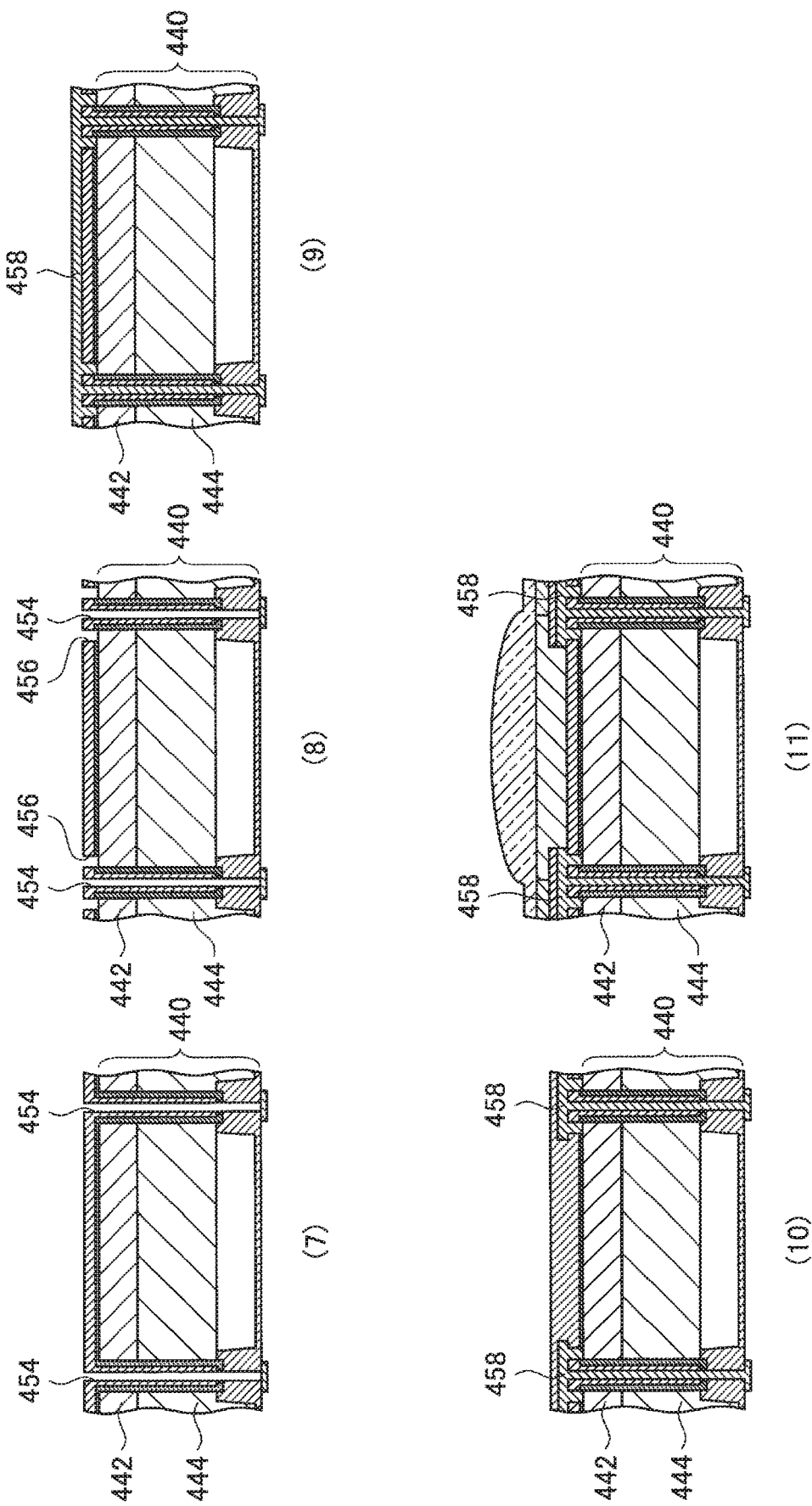
FIG. 29 is a schematic sectional view which shows a manufacturing method of a semiconductor device according to the second variation in process order.

In the following description, a manufacturing method of a semiconductor device according to the second variation will be described in process order on the basis of FIGS. 28 and 29. FIGS. 28 and 29 are schematic sectional views which show the manufacturing method of a semiconductor device according to the second variation in process order. First, in a process of (1) and process (2), a SPAD pixel is formed from the front surface side in the two-layer epitaxial substrate 440. The two-layer epitaxial substrate 440 is laminated on the supporting substrate 430.

In a process of (3), the upper and lower sides are reversed. In a process of (4), the high-concentration P+ layer 442 is exposed by shaving the supporting substrate 430 from the supporting substrate 430 side. In a next process of (5), a resist pattern is formed and a contact hole 450 for a light shielding portion is dug in from the back surface side. Furthermore, in processes (6) to (&), an interlayer film 452 is formed in the contact hole 450, and a contact hole 454 which goes through to an electrode on the front surface side is formed. Note that a fixed change film may be formed instead of the interlayer film 452.

Thereafter, a contact hole 456 reaching the P+ layer 442 is formed on the interlayer film 452 in a process of (8), and a metal film 458 such as tungsten (W) is buried in the contact holes 454 and 456 in a process of (9). The metal film 458 of a light receiving unit is removed by performing patterning on the light receiving unit in a process of (10). As a result, an anode electrode is formed on the back surface side (process (11)).

Figure 30:
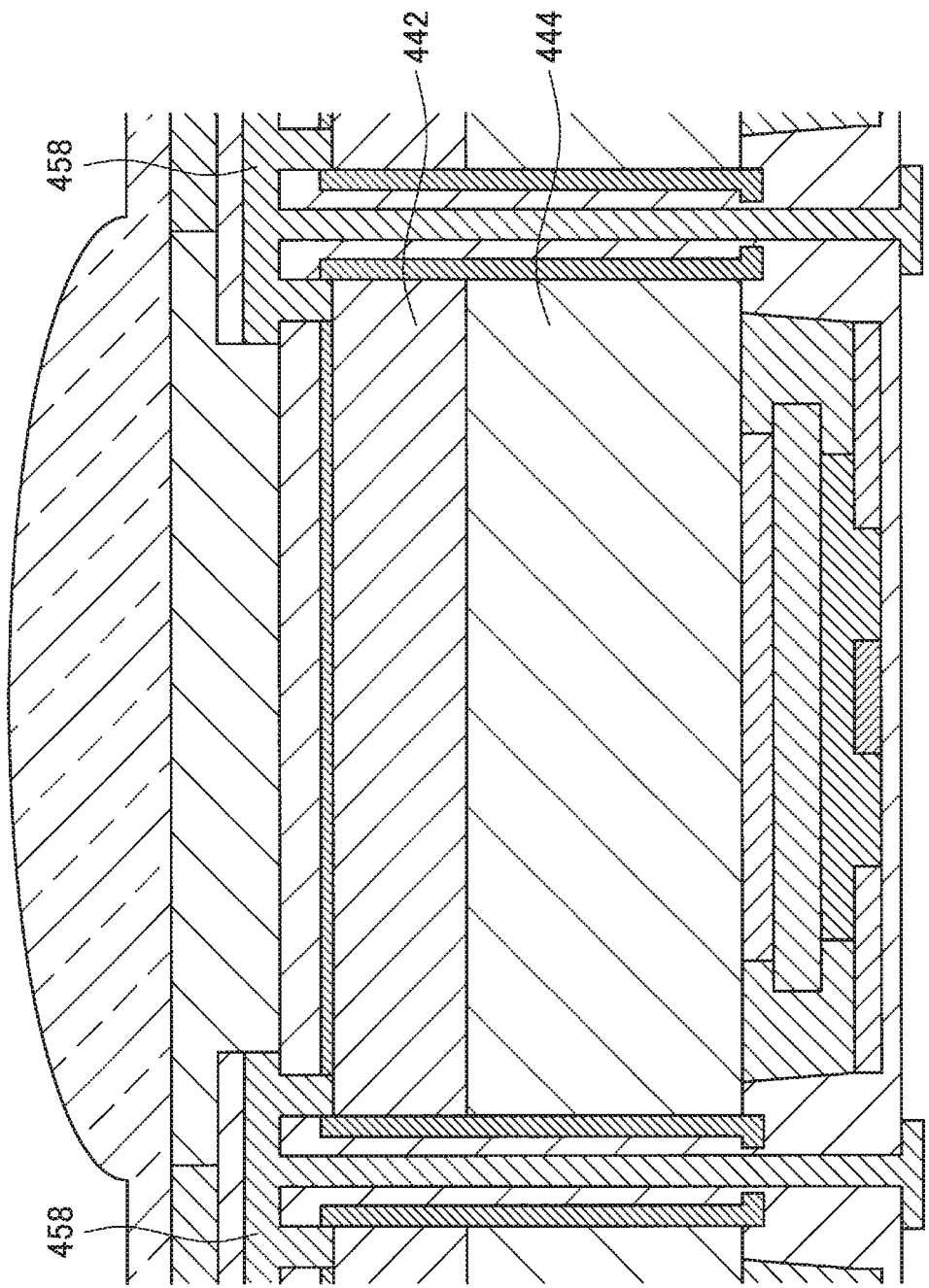
FIG. 30 is a schematic sectional view which shows a semiconductor device completed in the second variation.
Figure 31:
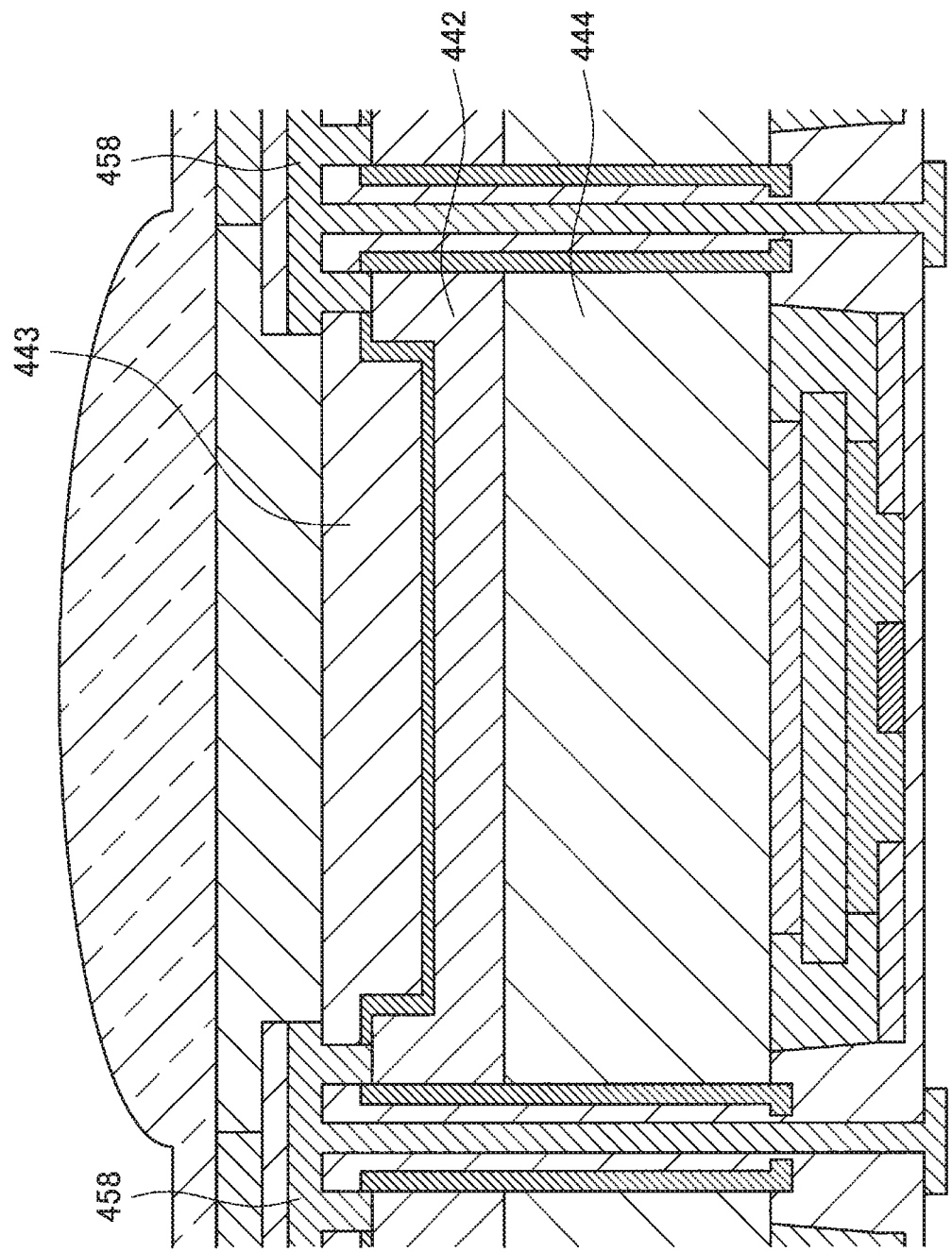
FIG. 31 is a schematic sectional view which shows a semiconductor device completed in the second variation.

FIGS. 30 and 31 are schematic sectional views which show completed semiconductor devices. As shown in FIG. 30, it is possible to make an electric field constant from the anode to the cathode on the back surface side and to achieve miniaturization by causing the metal film 458 to go through from the back surface side to the front surface side.

In addition, as shown in FIG. 31, it is also possible to form a thin P+ layer 442 by etching only a photoelectric conversion unit of the pixel after exposing the high-concentration P+ layer 442 of a portion corresponding to the light receiving unit of the pixel. In addition, as shown in FIG. 32, when the thin P+ layer 442 is formed, an inclination may be given to a periphery thereof.

Figure 32:
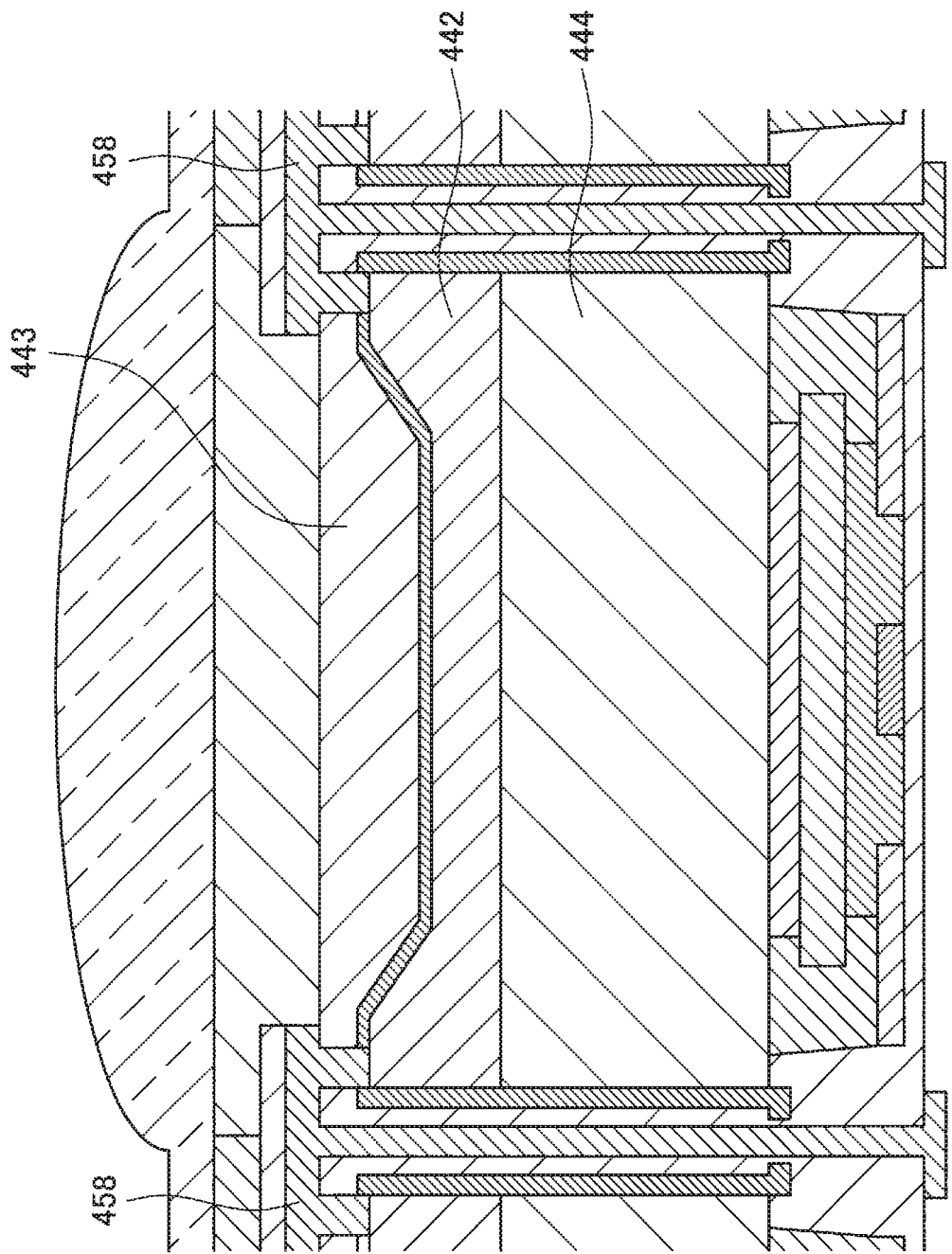
FIG. 32 is a schematic sectional view which shows an example in which a periphery of a thin P+ layer is inclined when the thin P+ layer is formed.
Figure 33:
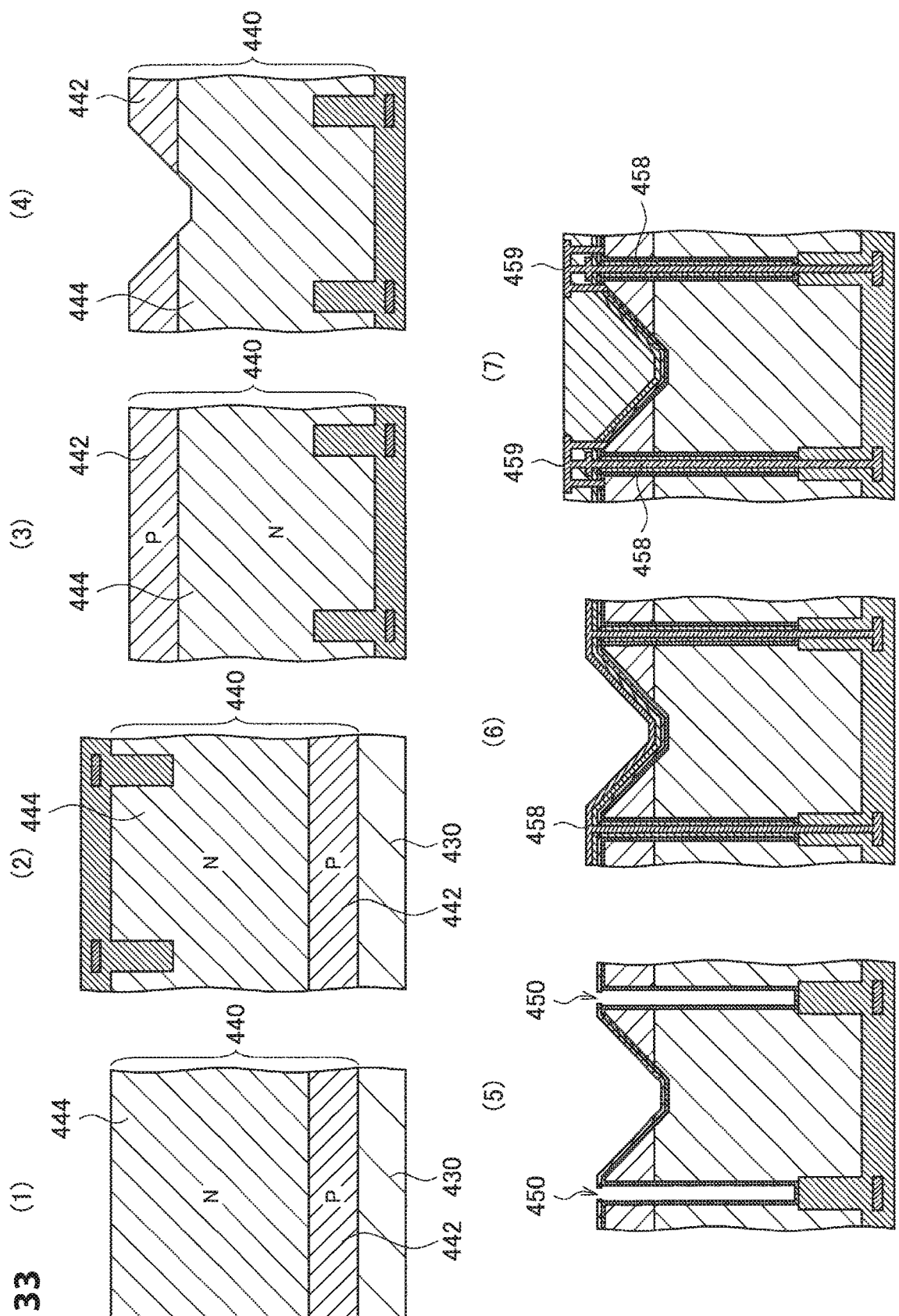
FIG. 33 is a schematic sectional view which shows a manufacturing method of the semiconductor device shown in FIG. 32 in process order.

FIG. 33 is a schematic sectional view which shows a manufacturing method of the semiconductor device shown in FIG. 32 in process order. First, in a process of (1) and process (2), a SPAD pixel is formed in the two-layer epitaxial substrate 440 from the front surface side. The two-layer epitaxial substrate 440 is laminated on the supporting substrate 430.

In a process of (3), the upper and lower sides are reversed. In a process of (4), the N epitaxial layer 444 is exposed in the center of the pixel is exposed by shaving the supporting substrate 430 from the supporting substrate 430 side. In a next process of (5), a resist pattern is formed and the contact hole 450 for a light shielding portion is dug in from the back surface side. Furthermore, an insulating film such as an interlayer film is formed in the contact hole 450, and furthermore, a contact hole which goes through to an electrode on the front surface side is formed to bury the metal film 458 such as tungsten (W) therein in a process of (6). The metal film 458 of a light receiving unit is removed by performing patterning on the light receiving unit, and furthermore an electrode 459 connected to the metal film 458 is formed in a process of (7). The electrode 459 is also connected to the P+ layer 442.

Figure 34:
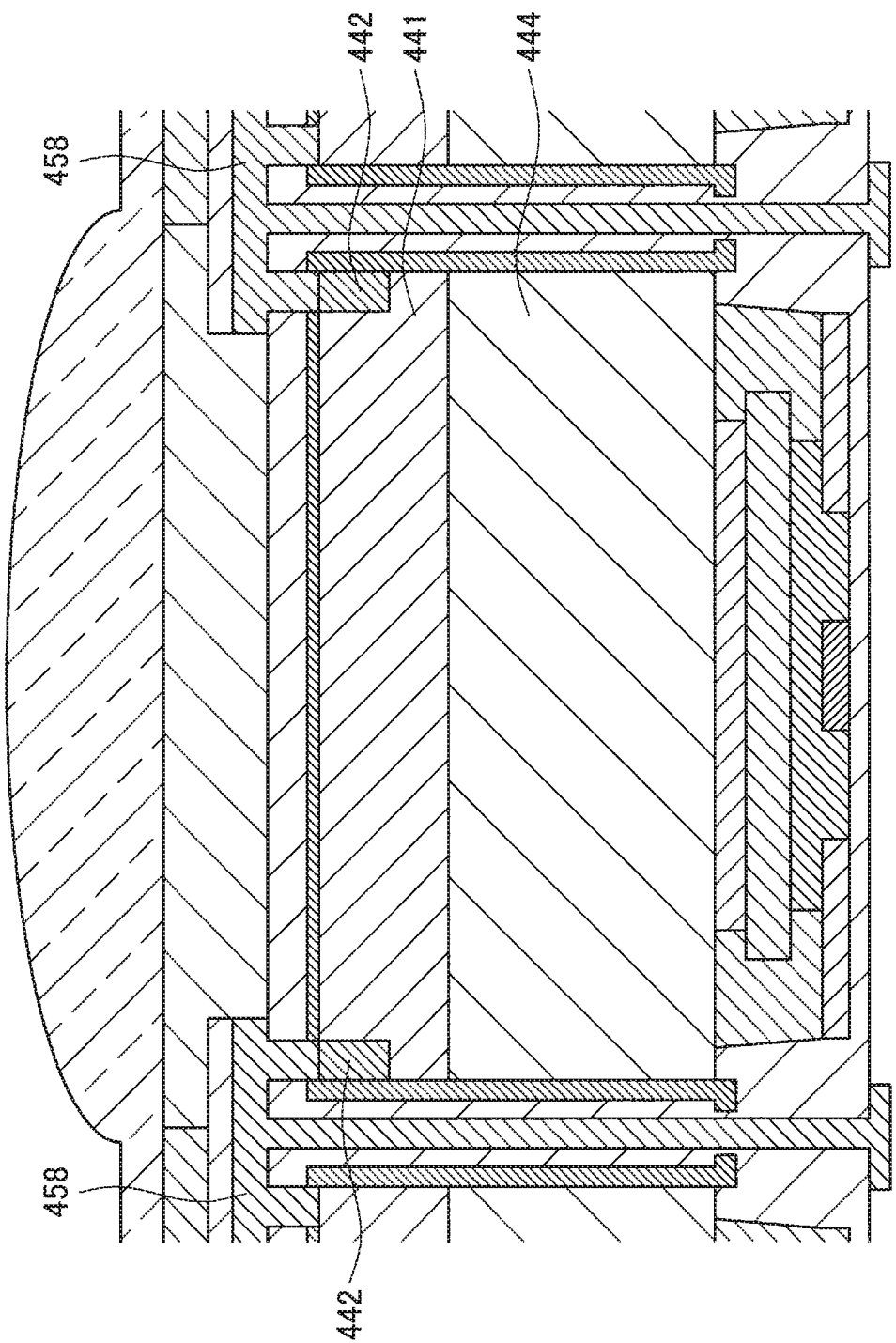
FIG. 34 is a schematic sectional view which shows a configuration in which an inside of a light collecting unit in the semiconductor device shown in FIG. 30 is set as a low concentration P region 446.

FIG. 34 is a schematic sectional diagram which shows a configuration in which an inside of a light collecting unit in the semiconductor device shown in FIG. 30 is set as a low concentration P region 446. In addition, FIG. 35 is a schematic sectional view which shows a manufacturing method of the semiconductor device shown in FIG. 34 in process order. First, a P layer 441 and the N layer 444 are formed on the supporting substrate 430, and the high-concentration P layer 442 is formed in an element separation region in a process of (1). The P layer 442 is formed by ion implantation, solid phase diffusion, and the like. Next, a SPAD pixel is formed from the front surface side, a buried layer 820 made of an insulating film is formed in a region of the pixel separation unit 150, and an electrode 822 is formed in the buried layer 820 in a process of (2). In a next process of (3), the upper and lower sides are reversed, and the P+ layer 442 is exposed by shaving the supporting substrate 800 from the upper side.

In a next process of (4), a resist pattern is formed, a contact hole for a light shielding portion is dug in from the back surface side, and insulating films 452 and 453 are formed in the contact hole. A contact hole which goes through to an electrode on the front surface side is formed to bury the metal film 458 such as tungsten (W) therein in a process of (5). The metal film 458 of a light receiving unit is removed by performing patterning on the light receiving unit in a process of (6). As a result, an anode electrode is formed on the back surface side. The electrode 459 connected to the metal film 458 is formed, and an insulating film 812 is formed on an interlayer film 806.

In the third variation described above, since it is possible to form a back surface anode electrode, a finer SPAD element configuration can be made. In addition, by using a two-layer epitaxial substrate, the P+ layer 442 serving as an anode electrode and an interface between the P+ layer 442 and the N layer 444 can be formed by suppressing crystal defects. Therefore, it is also possible to further improve the characteristics such as a dark current.

Figure 36:
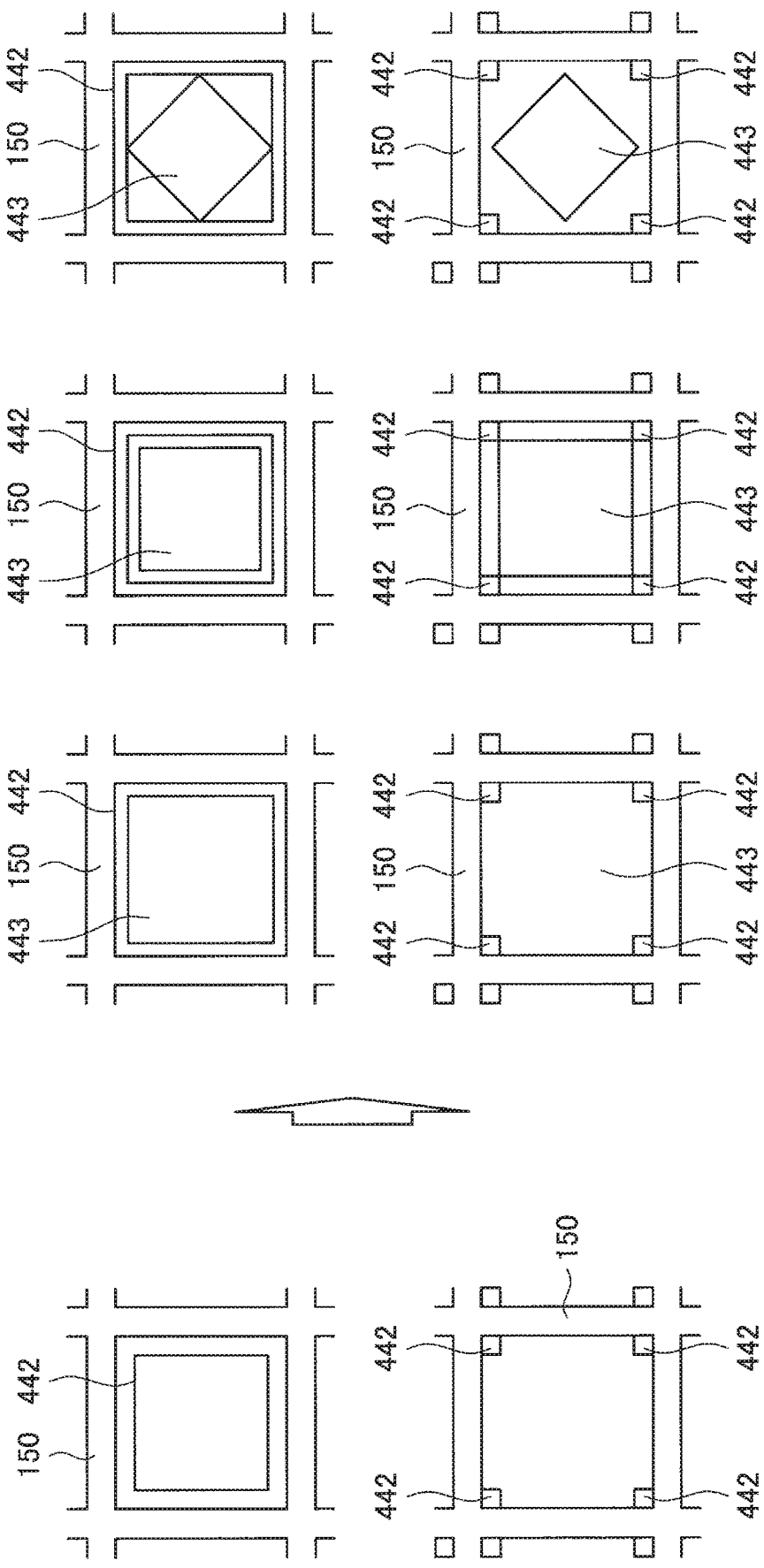
FIG. 36 is a plan view which shows some examples of a planar configuration of a SPAD pixel of the second variation.

FIG. 36 is a plan view which shows some examples of a planar configuration of the SPAD pixel of the second variation. The standard structure shown in FIG. 36 shows an example in which the high-concentration P+ layer 442 that is a contact portion is provided adjacent to the pixel separation unit 150. In addition, an example in which a low-concentration region is provided as shown in FIG. 36 shows an example in which a region 443 having the P concentration lower than that of the P+ layer 442 is provided on an uppermost surface of the inside of the high-concentration P+ layer 442. This region 443 corresponds to a region obtained by removing the P+ layer 442 from the upper side as shown in FIGS. 31 and 32. Note that the present technology is not limited to these configurations as long as a light-collecting area can be secured and a contact can be obtained.

As shown in FIGS. 31, 32, and 36, by providing the region 443 having the P concentration lower than that of the P+ layer 442, it is possible to avoid that an entire surface of the back surface side of a pixel portion becomes the high-concentration P+ layer, and as a result, concentration profile control becomes easy, and it is possible to suppress adverse effects from occurring in an electric charge transfer. In addition, a recombination probability can be improved, and the light receiving sensitivity (photo detection efficiency: PDE) can be improved.

8.4. Third Variation

In a case in which a pair of electrodes are provided on the front surface side and the back surface side of a substrate to achieve miniaturization, a transparent electrode or an electrode formed by an impurity layer is provided on the light irradiation surface. However, in a case in which a transparent electrode is provided, noise occurs at a contact portion with the substrate. In addition, in a case in which an electrode is formed by an impurity layer, it is necessary to implant high-concentration impurities, and it is necessary to secure a thickness of the impurity layer to reduce resistance of the electrode. In this case, in particular, sensitivity of short-wavelength light decreases.

In the third variation, the SPAD photodiode is set as a back-surface irradiation type, and a potential difference between the anode and cathode is set in a vertical direction. A metal layer having a light shielding property is buried between pixels, and this buried metal layer and a photoelectric conversion unit are separated by an insulating film.

Then, a high-concentration impurity layer is provided on a wafer back surface side to form an anode electrode on the back surface side. As a result, it is possible to realize miniaturization of a pixel and a decrease of noise, and to improve the short-wavelength sensitivity while suppressing inter-pixel interference and variations for each pixel.

Figure 37:
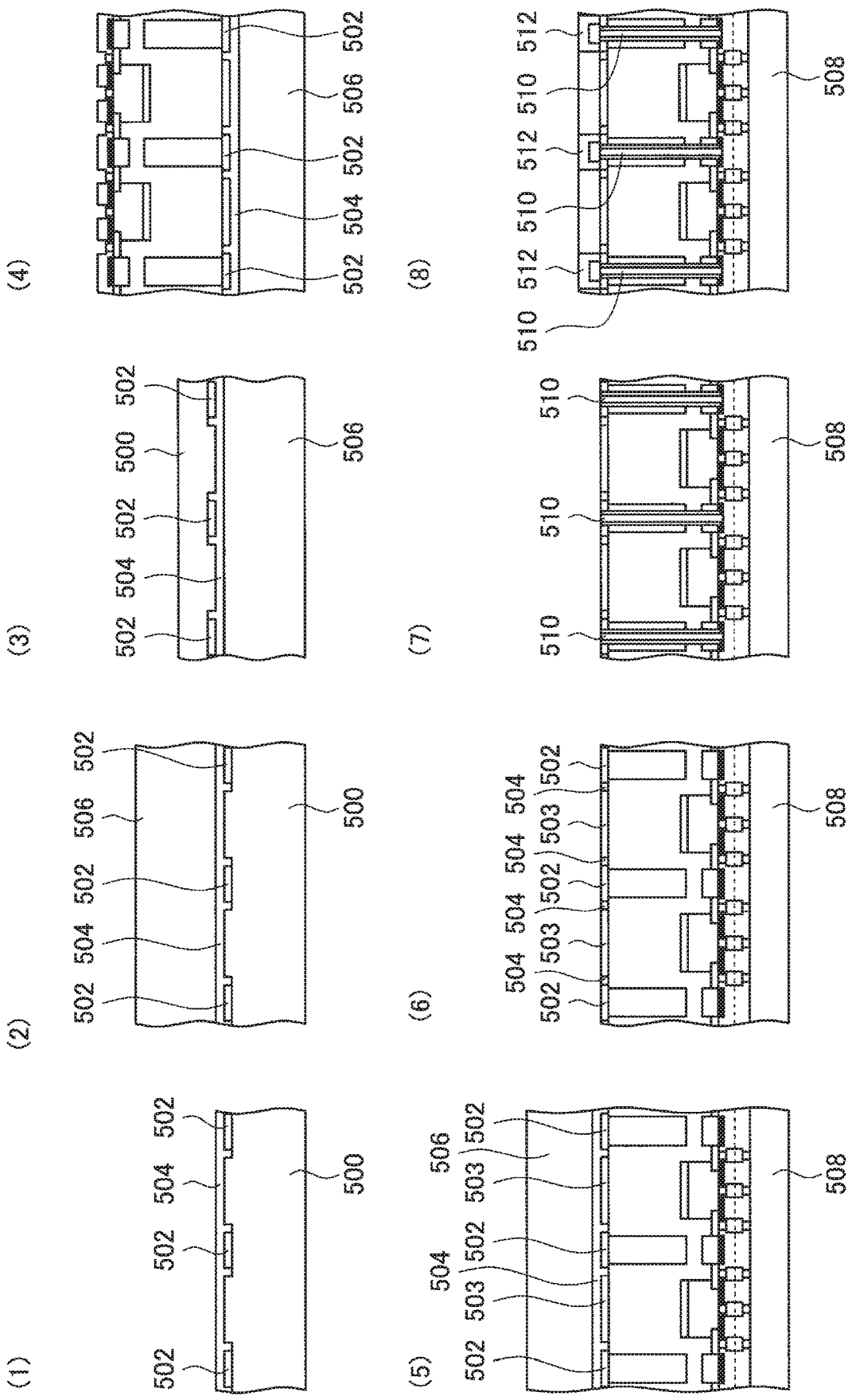
FIG. 37 is a schematic sectional view which shows a manufacturing method of a semiconductor device according to a third variation in process order.

In the following description, a manufacturing method of the semiconductor device according to the third variation will be described in process order with reference to FIG. 37. FIG. 37 is a schematic sectional view which shows the manufacturing method of the semiconductor device according to the third variation in process order. First, in a process of (1), a mark for alignment measurement is formed in the Si substrate 500, and a P+ layer 502 is formed by performing ion implantation of high-concentration impurities. Then, the Si substrate 500 is dug in to surround the P+ layer 502 and an insulation film 504 is buried in a dug-in region. A type of the insulating film 504 (SiN-type, SiO2-type) is not particularly limited.

In a process of (2), the insulating film 504 is planarized and joined to the substrate 506. A substrate 506 is a supporting substrate which forms an SPAD photodiode. In a process of (3), the upper and lower sides are reversed, and the substrate 500 is thinned to a prescribed Si thickness (several um) level. Then, formation of a transistor (Tr), and the like are performed on a thinned surface of the substrate 500 joined to the substrate 506. Although high temperature annealing (ANL) work is performed when the TR formation is performed, since the P+ layer 502 implanted in the substrate 500 is surrounded by the insulating film 504, its diffusion can be suppressed.

In a next process of (4), sensor formation processes (FEOL to BEOL) are performed. In a next process of (5), the substrate 500 and the substrate 506 which have been completed up to a wiring process are vertically reversed and joined to the substrate 508. In a next process of (6), the substrate 508 is set as a supporting substrate and the substrate 506 is completely removed by etching or polishing to cause a joining surface (the insulating film 504) between the substrate 506 and the substrate 500 to be exposed.

In a next process of (7), an insulating film 503 using an interface between the substrate 50 and the substrate 506 is removed, and a light shielding metal 510 is buried between pixels. In a next process of (8), a back electrode 512 is formed.

Figure 38:
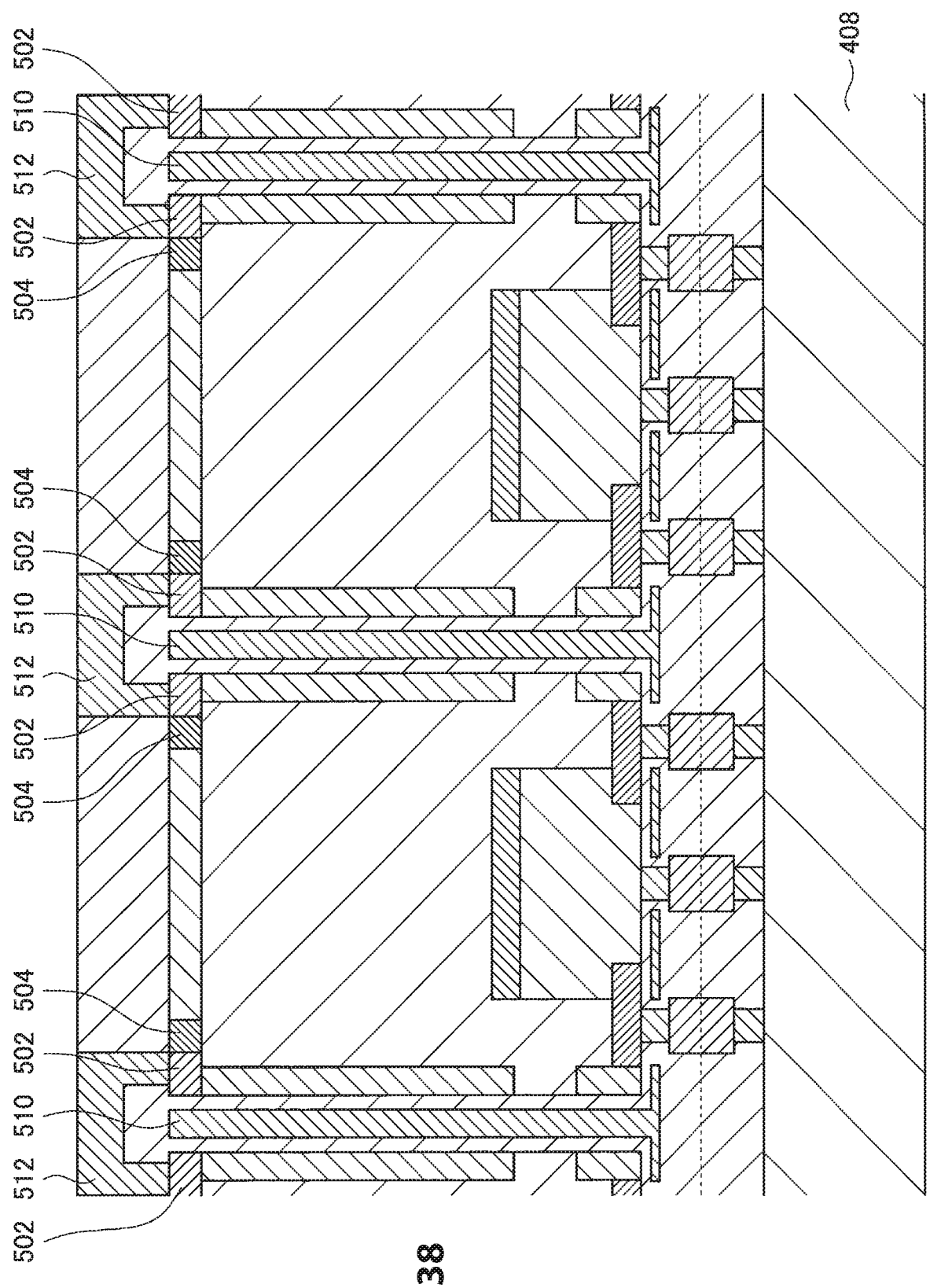
FIG. 38 is a schematic sectional view which shows a semiconductor device completed in the third variation.

FIG. 38 is a schematic sectional view which shows a semiconductor device completed in the third variation. As shown in FIG. 38, a patterned P+ layer 502 made of high-concentration B ($3 \times 10^9$/cm or more) is formed at a position in contact with a wiring 512. In addition, a periphery of the P+ layer 502 is surrounded by the insulating film 504 in a planar manner.

The third variation is a structure having a fine contact to the light irradiation surface of each pixel, and is a structure having an impurity layer in Si which connects with the contact, and in which impurities of high concentration exist (pile up) at an Si interface with the contact. In the third variation, miniaturization can be made by forming an electrode on the back surface. The back electrode is formed at the beginning of FEOL. At this time, impurities are doped into the Si substrate 500 with a fine pattern, and the P+ layer 502 is surrounded by the insulating film 504 to prevent diffusion. The P+ layer 502 is surrounded by the insulating film 504, and thereby diffusion of boron (B) due to heat of a subsequent process can be prevented. As a result, it is possible to form a fine element by forming an impurity layer for back surface contact before the formation of a transistor and suppressing the diffusion caused by the heat of a subsequent process. In addition, a high-concentration region of impurities can be used as an electrode formation surface, and ohmic junction becomes easier.

In the third variation as described above, miniaturization can be made by forming an electrode on the back surface. Since this back electrode is formed by an ohmic junction, it is necessary to form a high-concentration impurity layer, but it is possible to suppress diffusion of impurities by surrounding the high-concentration impurity layer with an insulating film.

8.5. Fourth Variation

The concentration of the N layer is intended to be thicker to create and separate a structure of PNP in a vertical direction in the back electrode structure, there is a concern that the electric field may be strongly applied and breakdown occurs. In addition, increasing the concentration of the N layer may increase a dark current. Furthermore, in a case in which a fixed charge film (a pinning film, an SCF) is attached, there is a concern that the dark current may increase if the fixed charge film is also formed in a high-concentration N region.

In the fourth variation, after a first layer in which an insulation film is buried is formed, a second insulating film buried layer is formed so as to connect with the first layer, and a buried metal layer is formed such that it goes through these layers.

In the fourth variation, the buried metal layer is formed such that it is caused to go through the layer in which an insulating film is buried and to surround a pixel. An end of the layer in which an insulating film is buried is in a depletion layer region, and an end of the depletion layer is on a side wall of the layer in which an insulating film is buried.

Specifically, a boundary between the P– region 710 and the N– region 780 shown in FIG. 21 is the depletion layer region. If the N– region 780 has too high concentration, there is a concern of breakdown. Then, if a fixed charge film is formed on a side surface of the N– region 780, there is a concern that the dark current may increase. In the fourth variation, there is a layer in which an insulating film is buried, and thus it is possible to prevent formation of a fixed charge film (a pinning film, an SCF) in an N region. Instead of a fixed charge film, a high-concentration P layer may be formed by a method such as solid phase diffusion. A dark current that occurs in the vicinity of a front surface, which occurs due to a layer in which an insulating film is buried, is discarded to the ground via the P+ layer 790 and the electrode 800.

In the following description, a manufacturing method of the semiconductor device according to the fourth variation will be described in process order with reference to FIG. 39. FIG. 39 is a schematic sectional view which shows the manufacturing method of the semiconductor device according to the fourth variation in process order. First, in a process of (1), an Si layer 526 whose Si uppermost surface is the N layer 522 and which has the P layer 524 thereunder is formed on the Si substrate 520. An example in which the N layer 522 and the P layer 524 are formed by epitaxial growth is set as a typical example, but they may also be formed by ion implantation or solid phase diffusion before epitaxial growth.

Next, in a process of (2), a first layer 528 in which an insulating film of STI is buried is formed so as to surround the pixel, an N layer and a P layer which are necessary are formed by ion implantation, heat treatment, and the like. Then, the metal layer 530 is formed on the first layer 528 in which an insulating film is buried, and furthermore an insulating film is formed to obtain a structure in which the metal layer 530 is buried in the first layer 528. For a burial in the first layer 528, various variations such as an oxide film, a nitride film, and a lamination of an oxide film and a nitride film can be considered. Moreover, the N layer region under the first layer 528 needs to be made as a P layer by a method such as ion implantation. It is desirable to form the metal layer 530 using tungsten (W) or the like.

Next, in a process of (3), a necessary wiring layer is formed, and the front and back surfaces are reversed by a method such as lamination, and thereby an unnecessary layer is removed such that the P layer 524 appears on the uppermost surface. In a next process of (4), the Si layer 526 is etched to reach the STI, a fixed charge film 532 made of aluminum oxide ($Al_2O_3$), and then hafnium oxide (HF2), and the like, and an insulating film 534 made of an oxide film or the like are formed. It is preferable to use a film type with good coverage. Then, in a process of (5), a contact hole going through the first buried layer 528 and reaching the metal layer 530 is formed and a metal layer 536 is buried therein. It is desirable to form the metal film 536 using tungsten (W) or the like. Note that the fixed charge film 532 and the insulating film 534 may be formed after causing the contact hole to go through the Si layer 526 and the first buried layer 528, and the metal layer 536 may be buried therein. At last, in a process of (6), an electrode 538 having a contact with the back surface is formed. According to these processes, elements including back electrodes are manufactured. Note that the N layer and the P layer may be reversed. In this case, a type of the fixed charge film 532 is changed.

Figure 40:
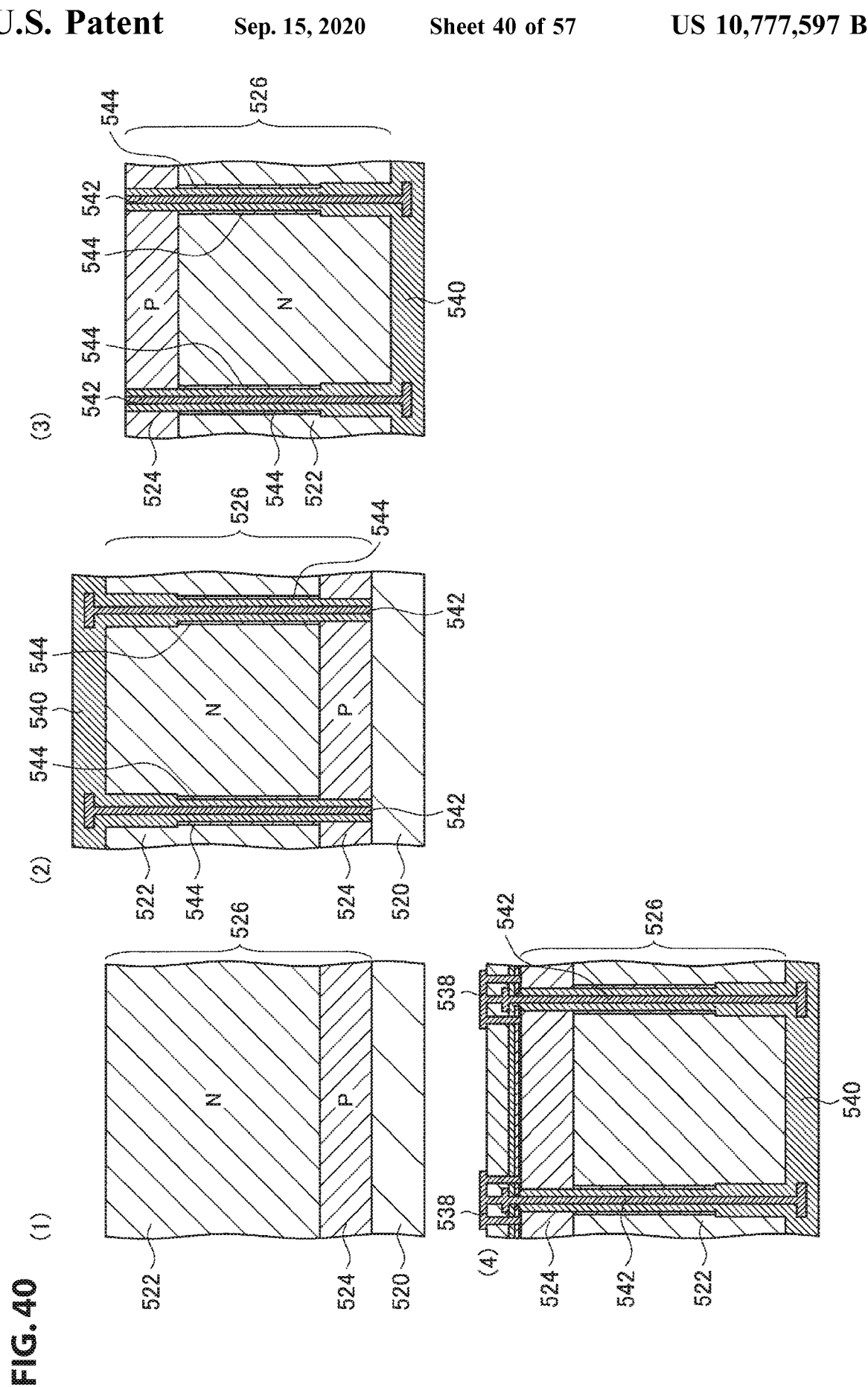
FIG. 40 is a schematic diagram which shows a manufacturing process in a case in which a second buried layer formed from a front side to a back surface side is surrounded by a high-concentration P layer by using solid phase diffusion.

In the manufacturing method shown in FIG. 39, a second buried layer formed from the front side to the back surface side may be surrounded by a high-concentration P layer using solid phase diffusion or the like at the time of forming the front surface side instead of forming the fixed charge film 532. FIG. 40 is a schematic diagram which shows a manufacturing process in this case. Process (1) is the same as in FIG. 39. In a process of (2), the second layer 540 is buried so as to go through the N layer 522 and the P layer 524, and the metal film 542 is buried in the second layer 540. At the time of burying the second layer 540, the high-concentration P layer 544 is formed in the N layer 522 adjacent to the second layer 540 by using solid phase diffusion or the like.

In a next process of (3), the front and back surfaces are reversed, and an unnecessary layer is removed such that the P layer 524 appears on the uppermost surface. Thereafter, after a predetermined insulating film is formed on the P layer 524, in the same manner as the process (6) of FIG. 39, an electrode 538 having a contact with the back surface is formed.

According to the fourth variation, the fixed charge film 532 is formed in the P layer 524 on the back surface side. On the other hand, the fixed charge film 532 or the high-concentration P layer 544 by solid phase diffusion is not formed under the N layer 522. As a result, a withstand voltage can be improved and a dark current can be suppressed.

8.6. Fifth Variation

In a case in which an SPAD pixel is separated in a PNP structure in the vertical direction and a through trench is formed for light shielding between pixels, it is necessary to form a fixed charge film on a side wall of the trench for improvement in characteristics of a white point and a dark current, but there is a concern that a pinning film is also formed in the N type region, and conversely the dark current increases.

In a fifth variation, a fixed charge film formed on the side wall of the trench for light shielding between pixels is created and separated in the vertical direction, and a structure in which there is no fixed charge film at least on the side wall of the N-type region is formed in the same view as the fourth variation.

In the fifth variation, a trench that goes through Si is formed to surround the pixel, and a metal layer is buried. A fixed charge film is formed on the sidewall of the trench that goes through Si other than the N-type region. The PNP structure is formed in the vertical direction, and the front and back electrodes are electrically separated.

Figure 41:
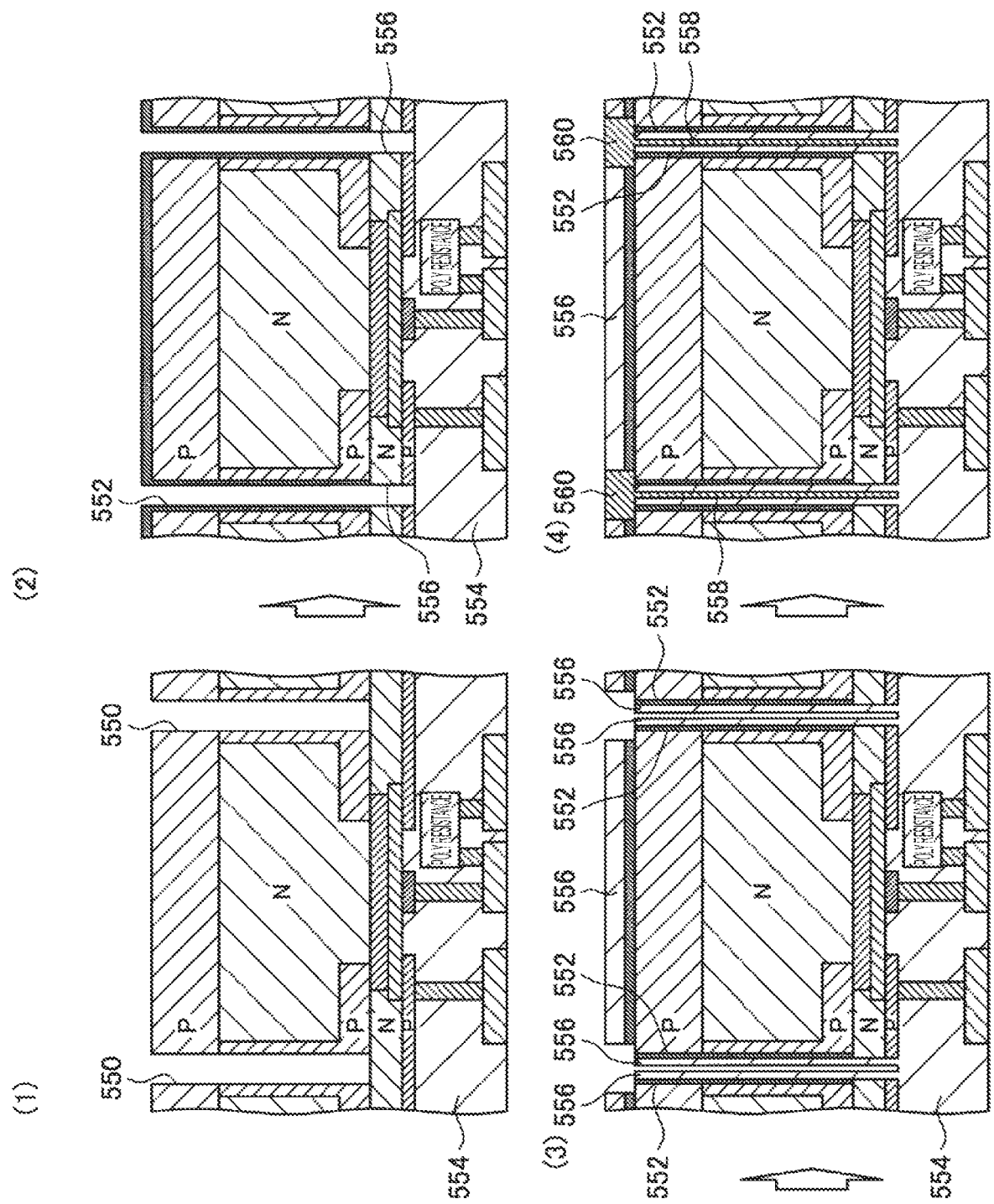
FIG. 41 is a schematic sectional view which shows a manufacturing method of a semiconductor device according to a fifth variation in process order.

A manufacturing method of the semiconductor device according to the fifth variation will be described below in process order with reference to FIG. 41. FIG. 41 is a schematic sectional view which shows the manufacturing method of the semiconductor device according to the fifth variation in process order. First, in a process of (1), a vertical PNP structure is formed by ion implantation or solid phase diffusion in a region forming the through trench in advance. Si is thinned from the back surface side to cause the pixel front surface to be exposed, and the trench 550 is formed by etching the Si of the P-type region.

In a next process of (2), after a fixed charge film 552 is formed in the P-type region, only Si at a bottom of the trench is exposed by dry etchback, and a through trench is formed by etching to an interlayer insulating film 554 on the front surface side using Si etchback. Next, in a process of (3), for example, an insulating film 556 made of $SiO_2$ is formed by an ALD method with good coverage in a high-aspect structure. As a result, the insulating film 556 is integrated with a correlation insulating film 554. Thereafter, the insulating film 556 and the fixed charge film 552 are partially opened to bring a metal into contact with the contact region.

In a next process of (4), a metal film 558 which shields light between pixels, and serves as the back surface contact electrode is buried in the portion opened in a process of (3) and in the trench, and the metal film 558 is planarized by CMP or dry etchback to form a damascene structure. Tungsten (W), aluminum (Al), copper (Cu), or the like is used as the metal film 558. As a result, a structure in which the metal film 558 and an anode contact electrode 560 are integrated is obtained. Note that the metal film 558 and the contact electrode 560 may be formed separately. According to these processes, an element having a back electrode is manufactured. Note that the N layer and the P layer may be reversed. In this case, a type of fixed charge film 552 is changed.

Figure 42:
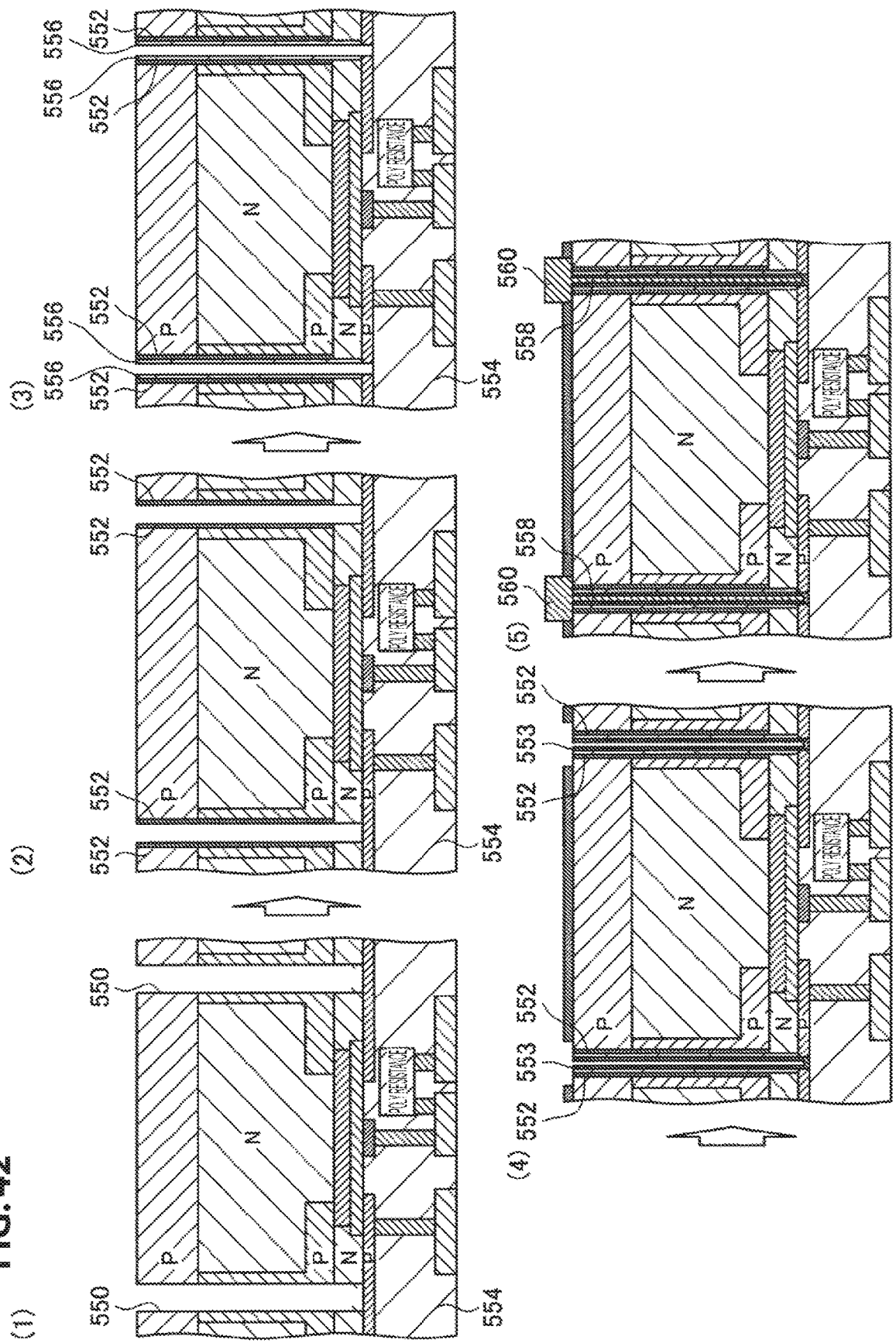
FIG. 42 is a schematic diagram which shows an example of a method of forming a three layer separately creation structure.

FIG. 42 shows an example of a method of forming a three-layer separately creation structure. In FIG. 41, the fixed charge film 552 is created and separated into two layers of a P type region on the back surface side and an N/P type region on the front surface side, but it is preferable to have a three-layer structure in which the fixed charge film 552 is also formed in a P-type region on the front surface side.

In this case, in a process of (2), in silicon etchback after the fixed charge film 552 is formed, only N type region is etched. Then, in a process of (3), the insulating film 556 made of $SiO_2$ is formed, and then the insulating film 556 is etched back. Furthermore, after causing the trench to go through to the interlayer insulating film 556 on the front surface side by silicon etchback, the pinning film 553 is formed again. A subsequent manufacturing method is the same as in FIG. 41. As a result, a three-layer structure can be formed such that films contacting the side walls of the trench are the fixed charge film 552 as the P-type region and the insulating film 556 as the N-type region.

Figure 43:
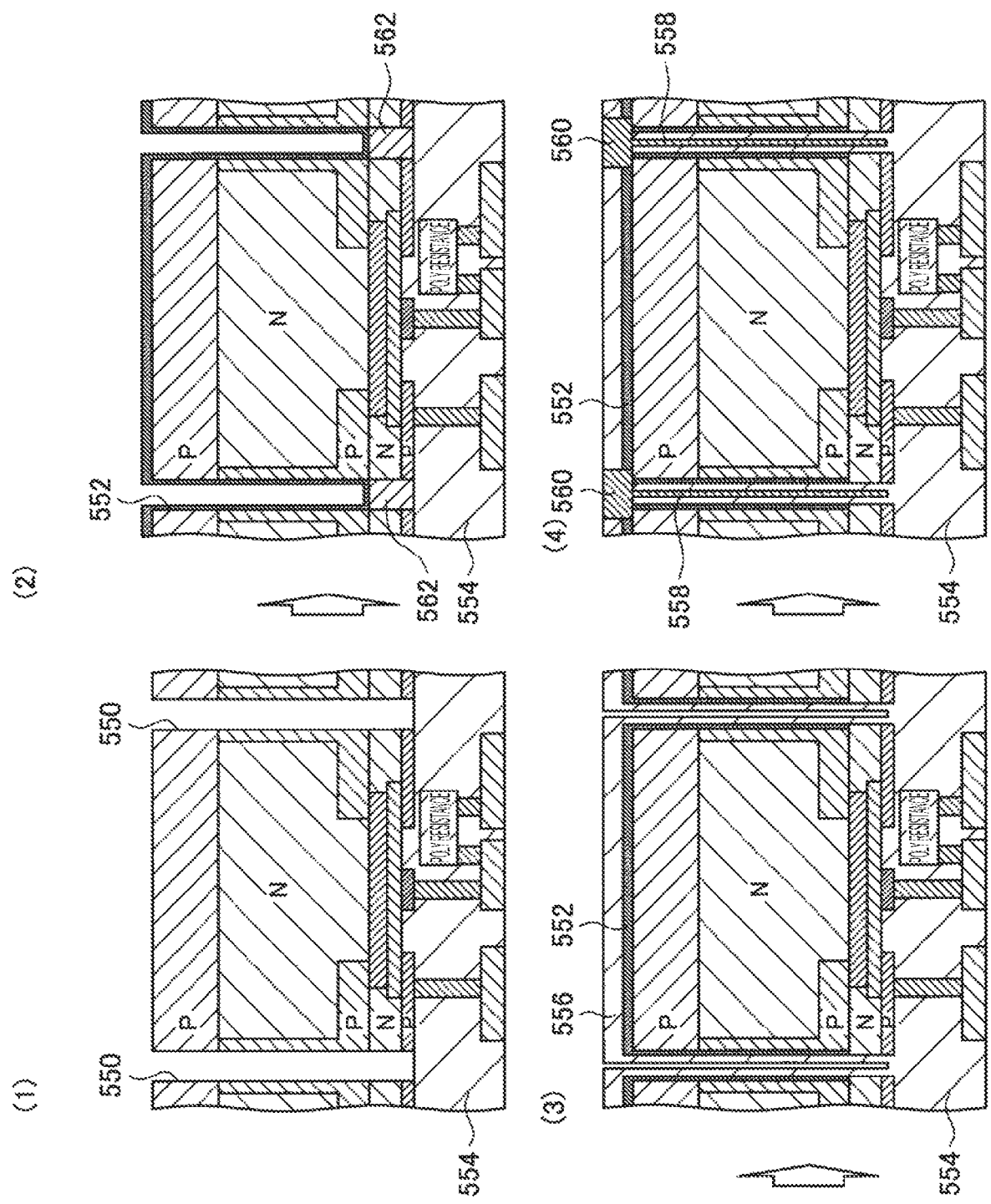
FIG. 43 is a schematic diagram which shows a manufacturing method different from those in FIGS. 41 and 42.

FIG. 43 shows a manufacturing method different from FIGS. 41 and 42. In the example shown in FIG. 43, when the trench 550 is first formed in a process of (1), the trench 550 is caused to go through to the front surface side. In a next process of (2), the fixed charge film 552 is formed with a dummy material (for example, a resist) 562 buried in the N/P type region on the front surface side.

In a next process of (3), after the fixed charge film 552 is etched back, removal of the dummy material 562 is performed, and then the insulating film 556 made of $SiO_2$ is formed. The removal of the dummy material 562 is performed by etching using sulfuric acid/hydrogen peroxide solution or an organic resist stripping solution, dry etch back, or the like. The subsequent manufacturing method is the same as in FIG. 41. As a result, it is possible to form the same structure as in FIG. 41. Note that, in a case in which a three-layer structure is used as shown in FIG. 42, etch back, and formation of the pinning film 553 may be performed by performing etchback of the dummy material 562 only for the N type region, and then forming the insulating film 556.

Figure 44:
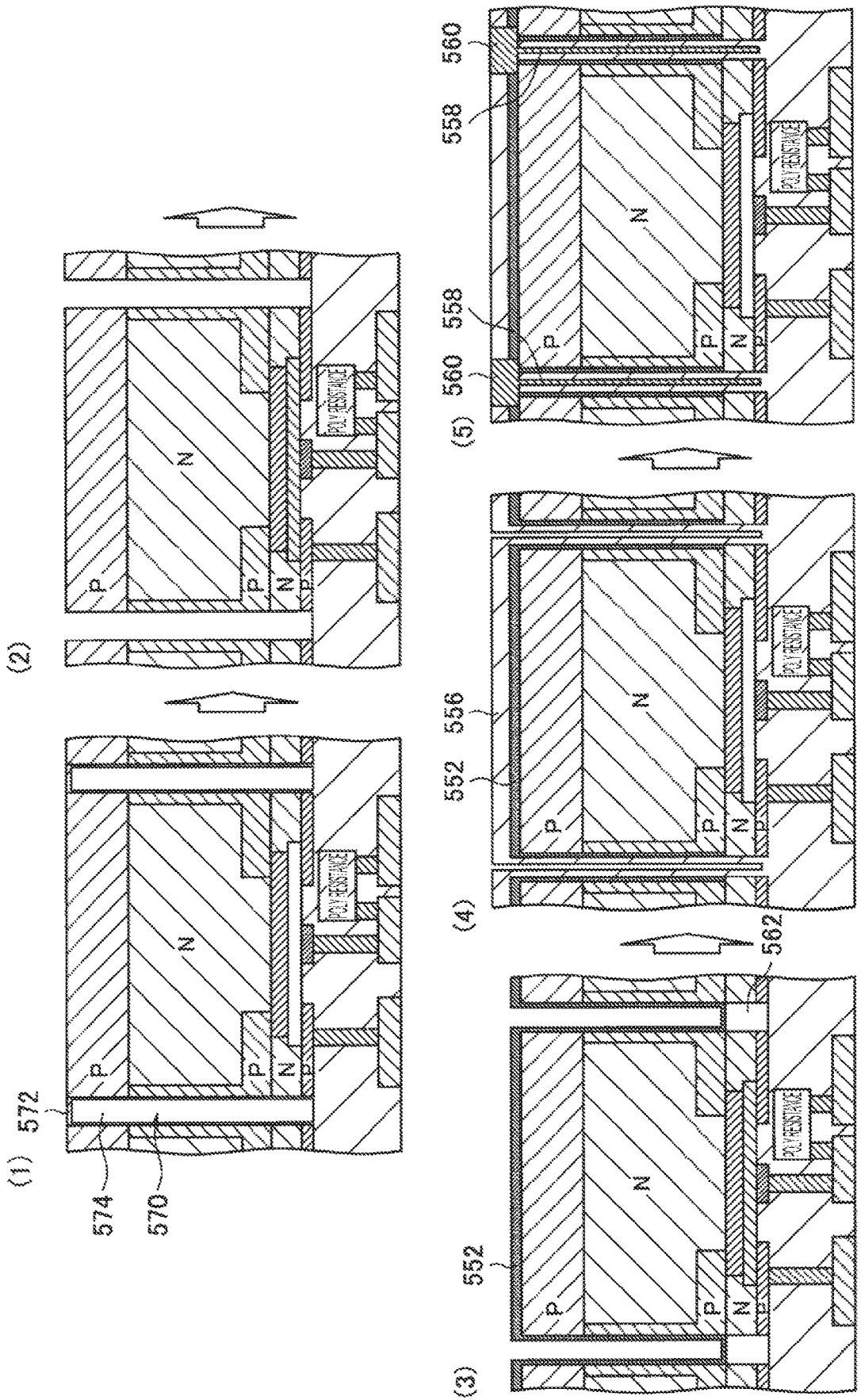
FIG. 44 is a schematic diagram which shows an example of a manufacturing method in a case in which a through trench is formed from a front surface side in an FEOL process.

FIG. 44 shows an example of a manufacturing method in a case in which a through trench is formed from the front surface side in FEOL process. In a process of (1), after forming a through trench 570 in FEOL, for example, a $SiO_2$ film 572 and a poly-Si film 574 are buried in the trench 570. After that, in a process of (2), Si is thinned from the back surface side, and a bottom of the trench 570 is exposed, and then the $SiO_2$ film 572 and the poly-Si film 574 in the trench 570 are removed. In a case in which the $SiO_2$ film 572 and the poly-Si film 574 are buried, for example, an alkaline Si etching liquid and a DHF solution or the like may be used. A subsequent manufacturing method is the same as in FIG. 43. It is also possible to form a three-layer structure in the same manner as in FIG. 42.

According to the fifth variation, a pinning film is formed in the P type region on the side wall of the trench, but a pinning form to the N type region can be prevented. As a result, it is possible to suppress color mixing between pixels, and to suppress occurrence of white spots and dark currents in a structure in which the front and back electrodes can be separated.

8.7. Sixth Variation

In a sixth variation, a trench for filling an electrode is formed in an STI region in the transistor formation process and the wiring process. As a result, the amount of etching required for a go-through process after formation of a deep trench (back surface Deep Trench (DT)) formed from the back surface is greatly reduced, or the go-through process becomes unnecessary.

In addition, it is possible to form an electrode in the STI region without a misalignment with the STI, and it is possible to narrow an STI line width required for securing a withstand voltage between the N+ region and the electrode in the STI.

Figure 45:
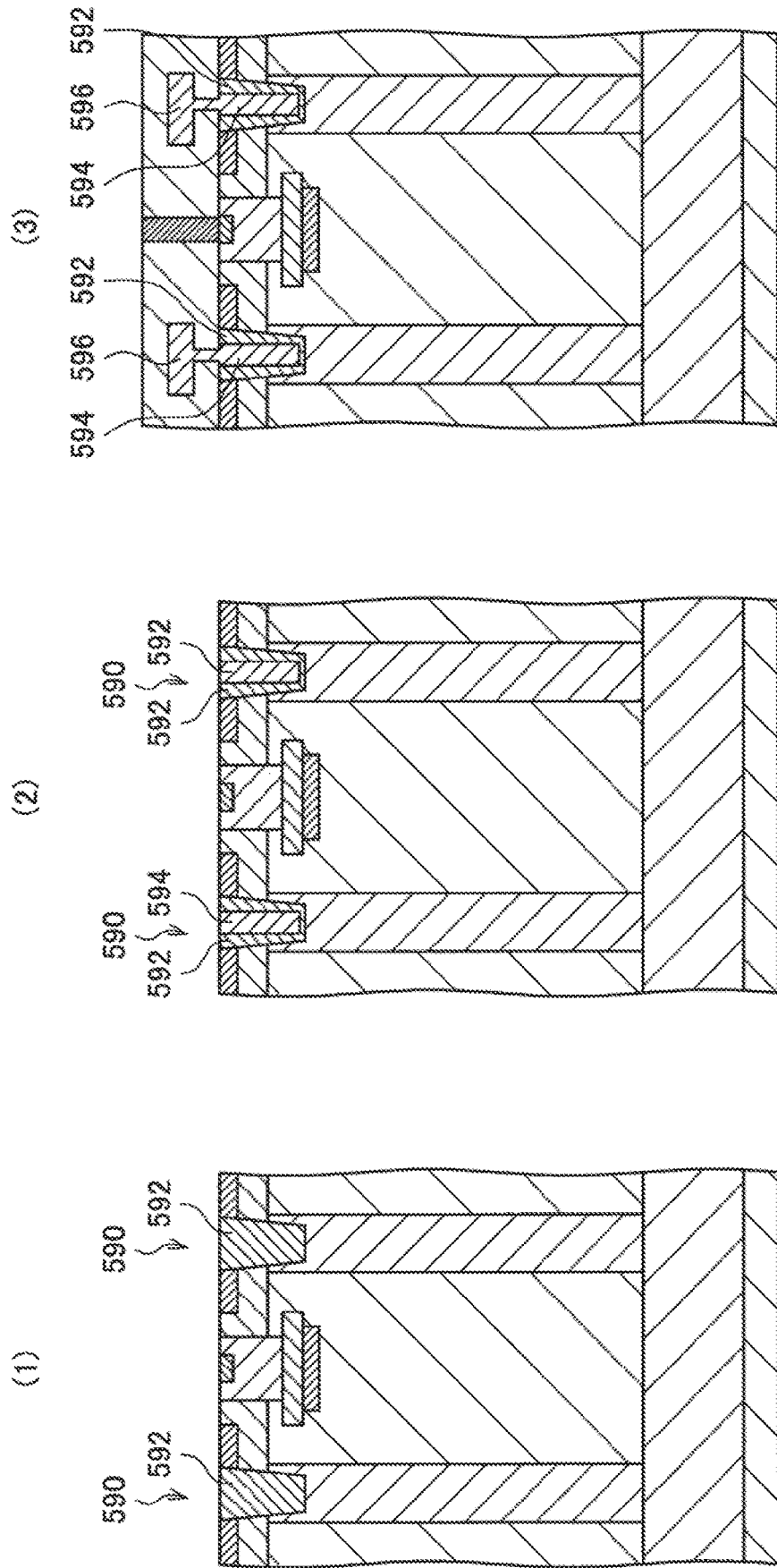
FIG. 45 is a schematic sectional view which shows a manufacturing method of a semiconductor device according to a sixth variation in process order.
Figure 46:
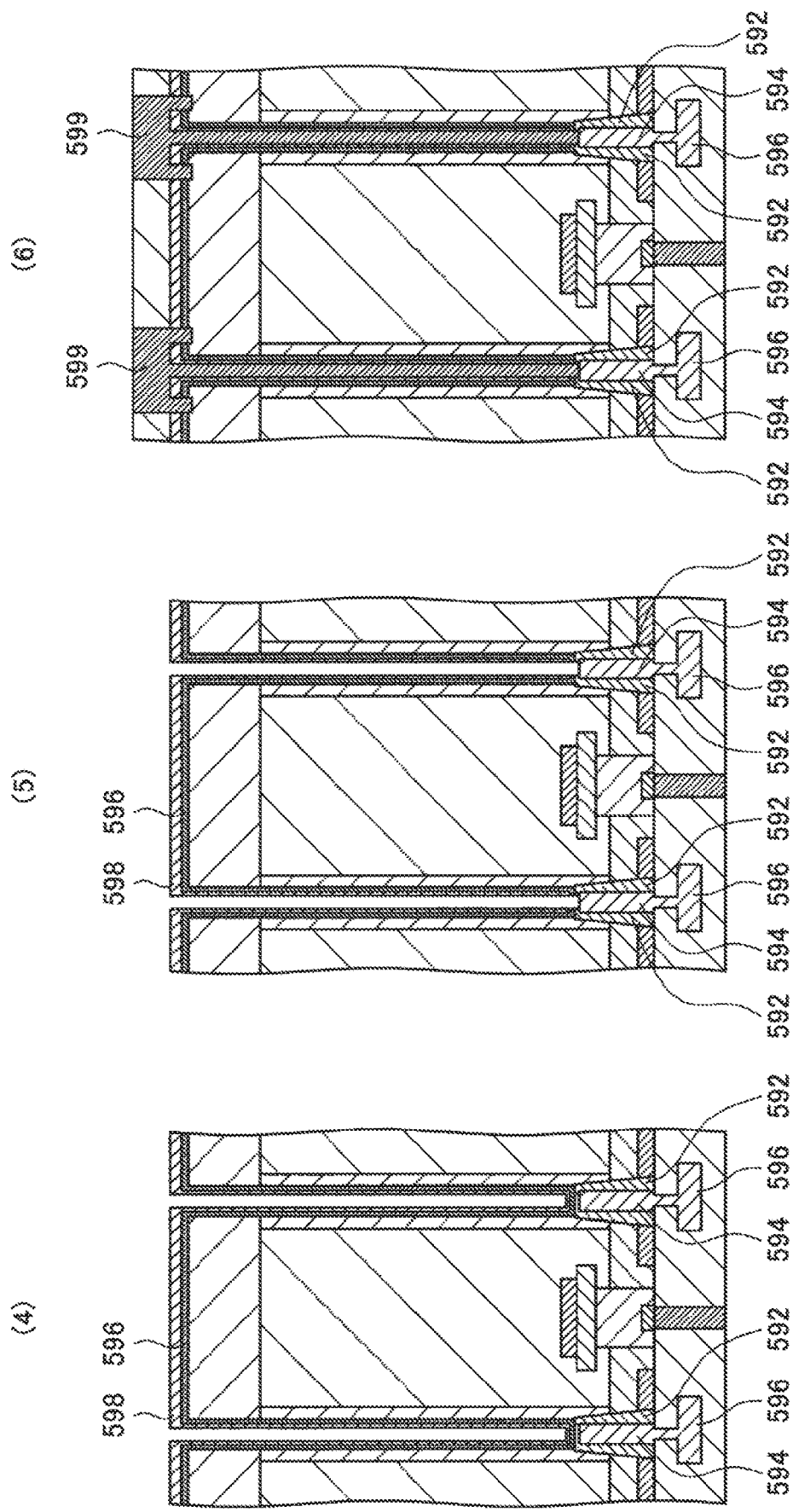
FIG. 46 is a schematic sectional view which shows a manufacturing method of a semiconductor device according to the sixth variation in process order.

Hereinafter, a manufacturing method of the semiconductor device according to the sixth variation will be described in the process order with reference to FIGS. 45 and 46. FIGS. 45 and 46 are schematic sectional views which show the manufacturing method of the semiconductor device according to the sixth variation in process order. First, in a process of (1), an STI 590 is formed and an insulating layer 592 is formed in the STI 590. Next, in a process of (2), a region of the STI 590 is opened by etching and an electrode 594 is formed. Poly-Si, PDAS, W, or the like is used as the electrode 594.

Next, in a process of (3), a wiring layer 596 and the electrode 594 of the STI region are connected in the wiring layer formation process. Next, in a process of (4), the upper and lower sides are reversed, a back surface DT is formed, a fixed charge film 596 is formed inside the back surface DT, and an insulating film 598 is formed on the fixed charge film 596. Next, in a process of (5), a go-through process is performed on the insulating film 598 on the fixed charge film 596 at a bottom of the back surface DT, the fixed charge film 596, and the insulating film 592 of the STI 590. A film thickness of the insulating film 592 of the STI 590 which needs to be processed is a remaining film thickness of the insulating film 592 at the bottom of the STI 590 at the time of opening of the STI 590 of process (2), which is a very thin film thickness. Next, the process (6) is completed by forming a go-through electrode 599 in a subsequent process.

In the process (5), since the electrode 594 is exposed by removing the very thin film thickness of the insulating film 592, it is possible to suppress a thickness of a film serving as a mask from being insufficient at the time of the go-through process. Therefore, it is possible to stably perform the go-through process. As described above, since the go-through electrode 599 is formed from an opposite side of the STI 590, center axes of the electrode 594 and the go-through electrode 599 may not be perfectly matched in some cases, but they can be within an allowable range by accurately performing alignment at the time of forming a contact.

Figure 47:
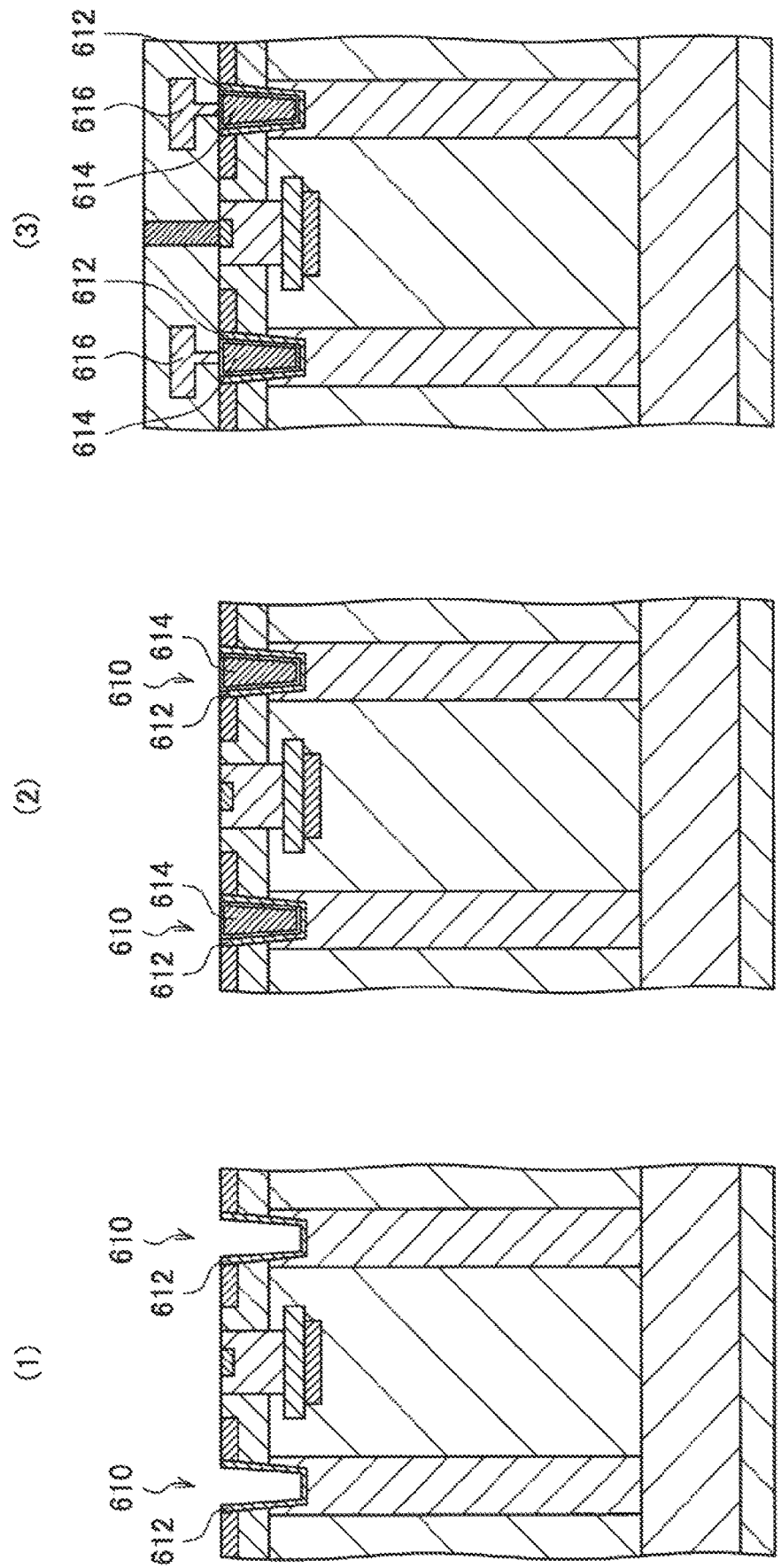
FIG. 47 is a schematic sectional view which shows another manufacturing method of the semiconductor device according to the sixth variation in process order.
Figure 48:
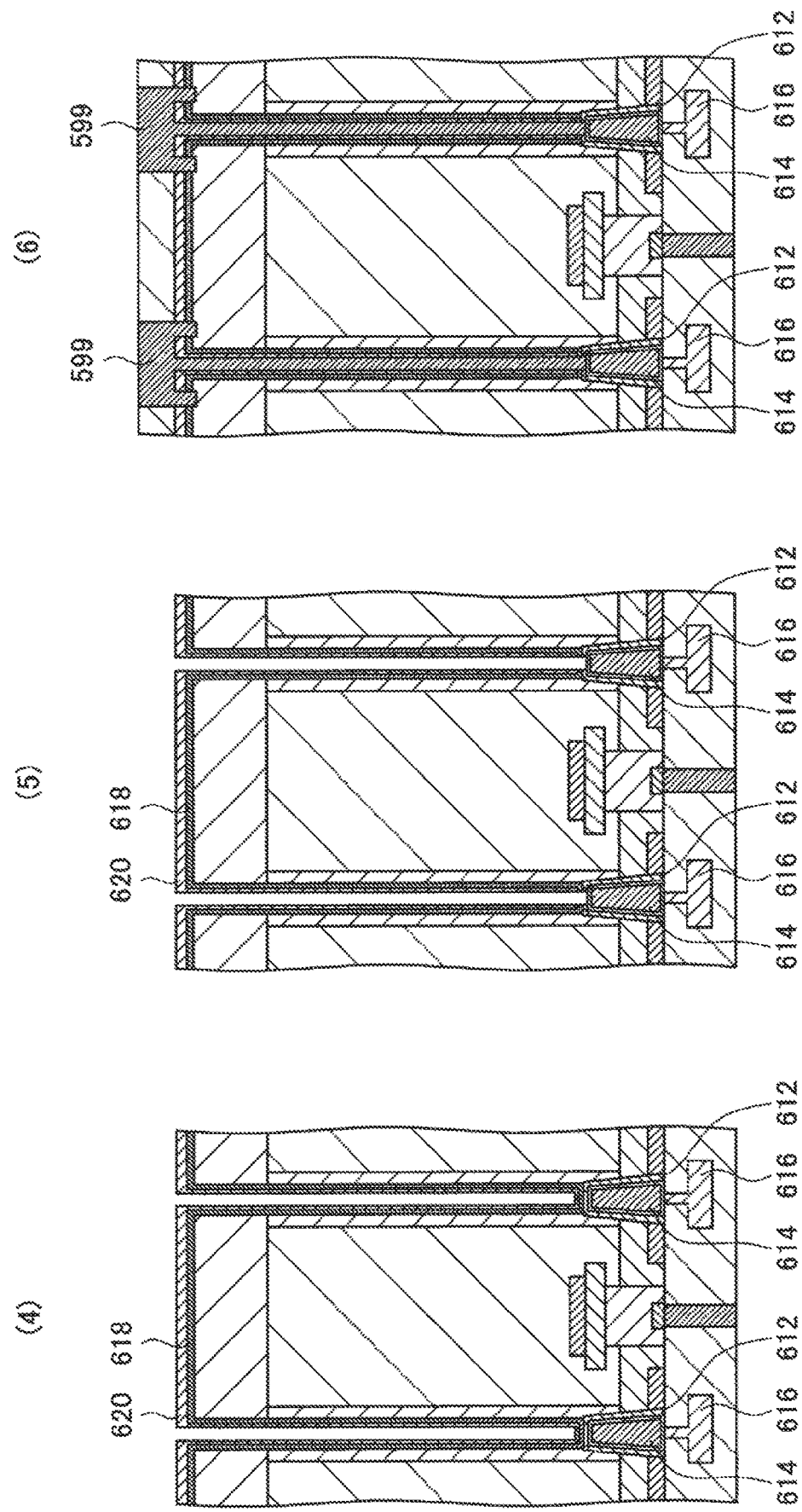
FIG. 48 is a schematic sectional view which shows another manufacturing method of the semiconductor device according to the sixth variation in process order.

FIGS. 47 and 48 are schematic sectional views which show another manufacturing method of the semiconductor device according to the sixth variation in process order. First, in a process of (1), an STI 610 is formed, and an insulating layer 612 is formed so as not to be blocked inside the STI 610. The insulating film 612 is set to have a film thickness equal to or larger than a film thickness required for securing insulation resistance with the N+ layer.

In a next process of (2), an electrode material is filled in the STI 610 to be an electrode 614 of the STI region. To form the electrode 614 in the so-called FEOL process, a material of the electrode 614 is a non-metal material such as Poly-Si or PDAS. The self-alignment of the electrode 614 is formed by process (2), and thereby a misalignment between the STI 610 and the electrode 614 becomes zero.

In a next process of (3), a wiring layer 616 and the electrode 614 of the STI 610 are connected in the wiring layer formation process. In a next process of (4), the upper and lower sides are reversed, the back surface DT is formed, a fixed charge film 618 is formed inside the back surface DT, and an insulating film 620 is formed on the fixed charge film 618.

In a next process of (5), the go-through process is performed on the insulating film 620 on the SCF 618 at the bottom of the back surface DT, and the insulating film 612 of the SCF 618 and the STI 610. A film thickness of the insulating film 612 of the STI 610 which needs to be processed is a film thickness of the film formed by the process (1), and can be set to very significantly thinned film thickness. Moreover, as compared with the examples of FIGS. 45 and 46, it is possible to suppress variations in the film thickness of necessary STI insulating film amounts. Next, process (6) is completed by forming the go-through electrode 599 in s subsequent process.

Figure 49:
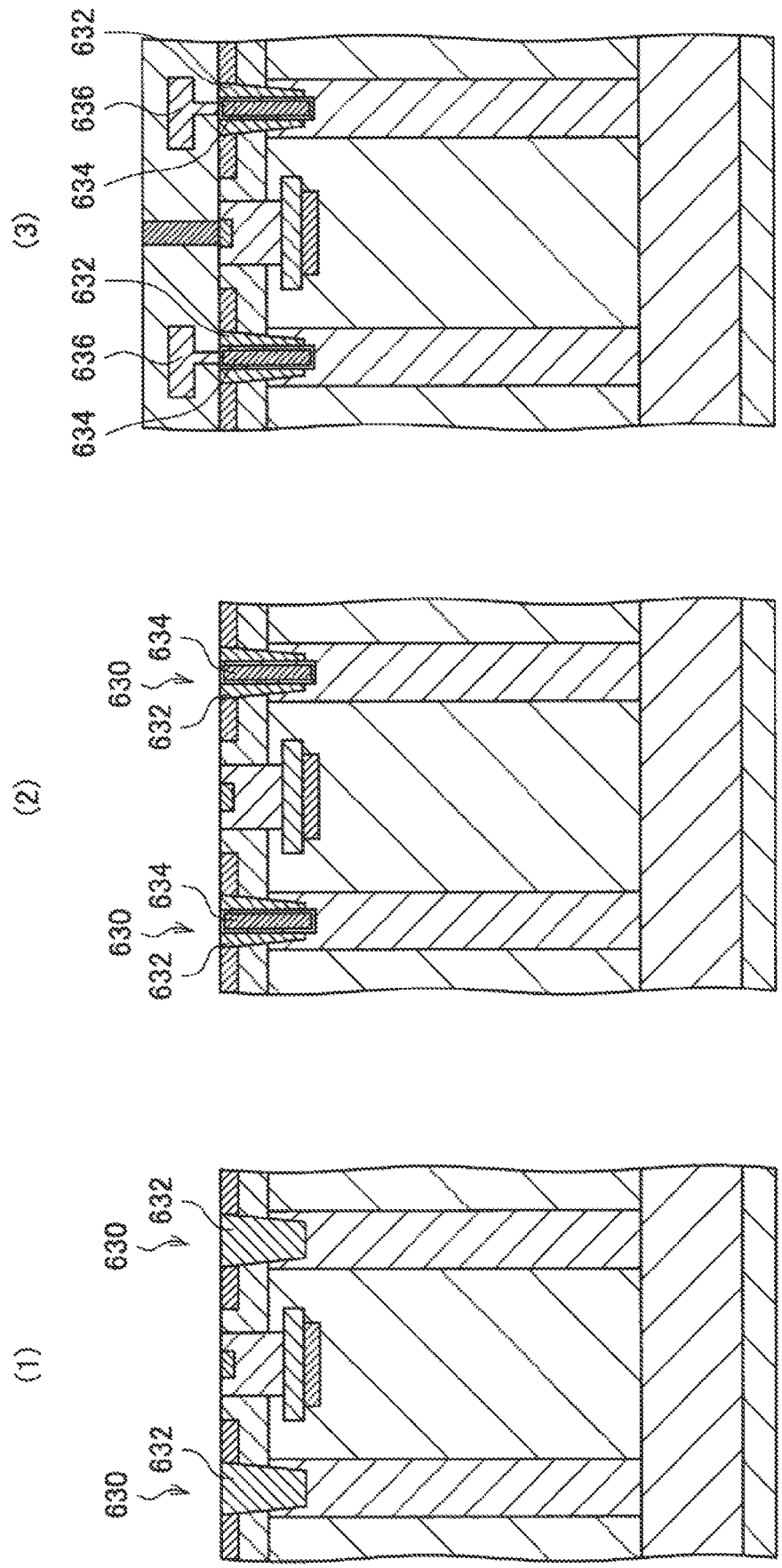
FIG. 49 is a schematic sectional view which shows still another manufacturing method of the semiconductor device according to the sixth variation in process order.
Figure 50:
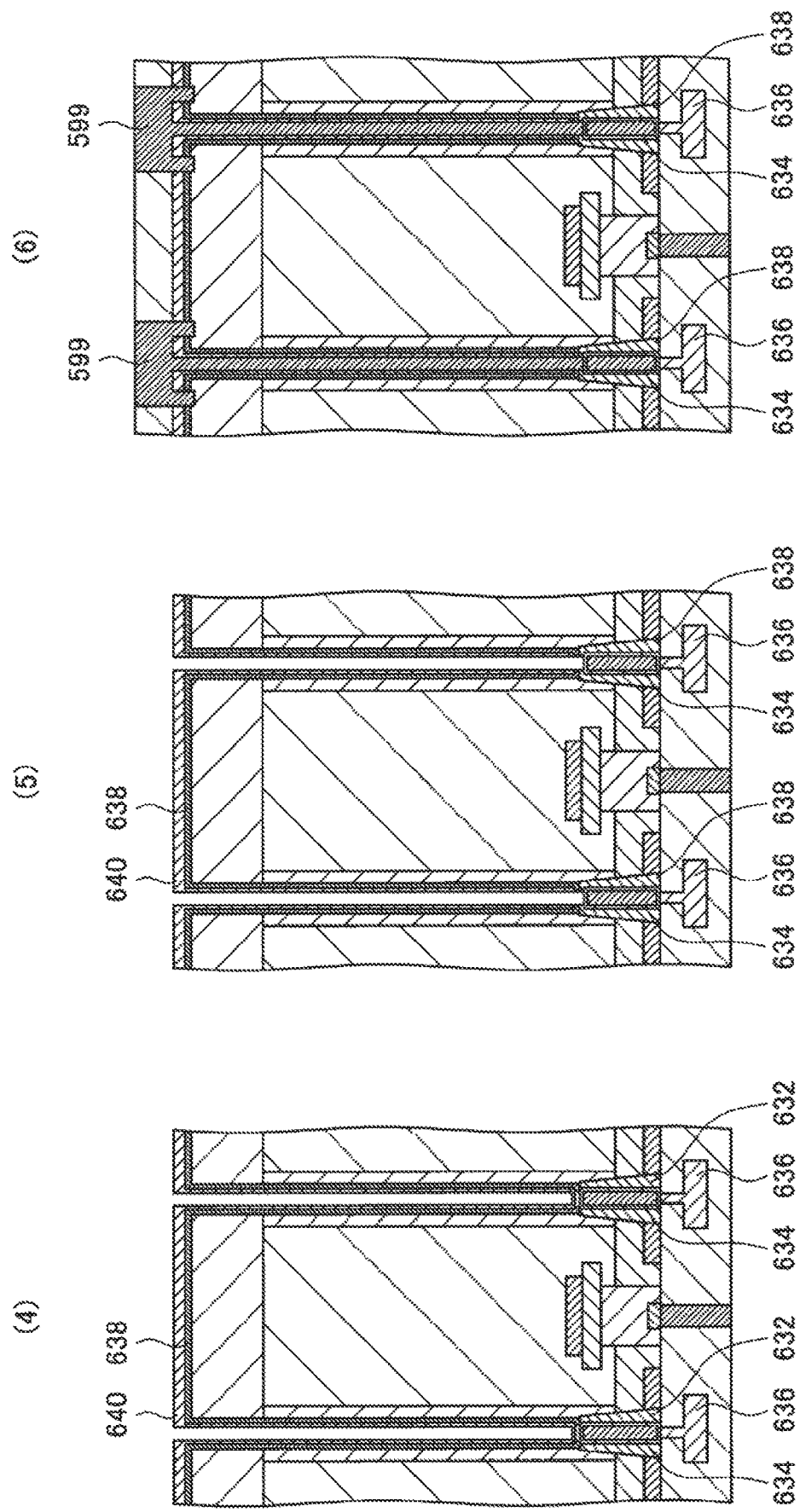
FIG. 50 is a schematic sectional view which shows still another manufacturing method of the semiconductor device according to the sixth variation in process order.

FIGS. 49 and 50 are schematic sectional views which show still another manufacturing method of the semiconductor device according to the sixth variation in process order. First, in a process of (1), an STI 630 is processed and an insulating layer 632 is formed in the STI 630.

In a next process of (2), the STI 630 is opened by etching. At this time, an opening is formed to go through the insulating film 632 at a bottom of the STI 630. Thereafter, an electrode 634 is formed. Non-metal films such as Poly-Si, PDAS, or the like can be used as a material of the electrode 634. From a viewpoint of suppressing substrate contamination, it is desirable not to use a metal film as the electrode material.

In a next process of (3), the wiring layer 636 and the electrode 634 of the STI 630 are connected in the wiring layer formation process. In a next process of (4), the upper and lower sides are reversed, the back surface DT is formed, a fixed charge film 638 is formed inside the back surface DT, and an insulating film 640 is formed on the fixed charge film 638. In this example, since the electrode 634 is formed to go through the insulating film 632 at the bottom of the STI 630, the electrode 634 of the STI 630 is exposed at the time of processing the back surface DT.

In a next process of (5), the go-through process is performed on the insulating film 640 on the fixed charge film 638 at the bottom of the back surface DT, and the fixed charge film 638. In this example, since the electrode 634 is exposed at the time of processing the back surface DT, it is not necessary to etch the insulating film 632 of STI 630 at the time of the go-through process. The process will be completed by forming the go-through electrode 599 in a subsequent process.

Figure 51:
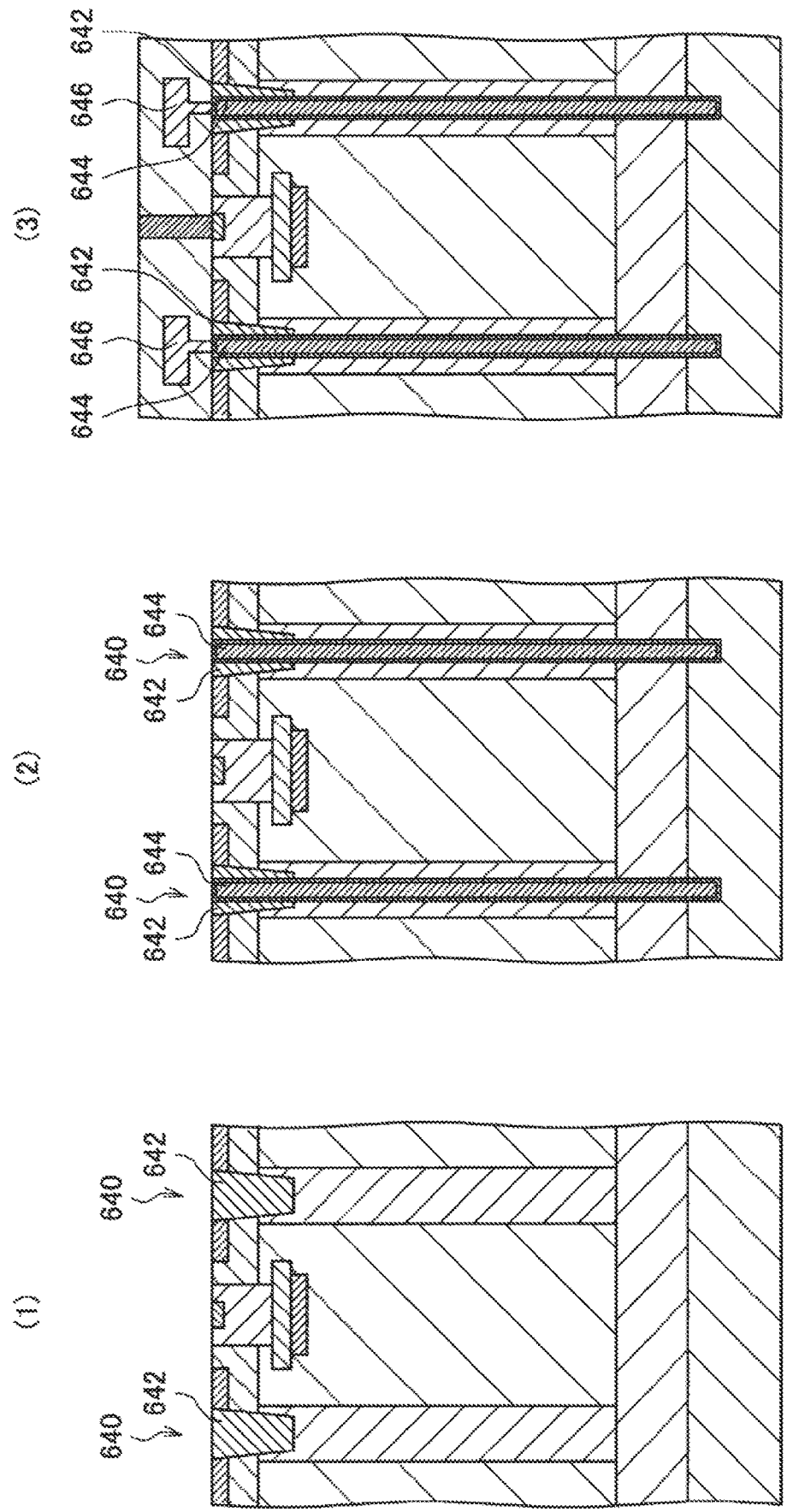
FIG. 51 is a schematic sectional view which shows still another manufacturing method of the semiconductor device according to the sixth variation in process order.
Figure 52:
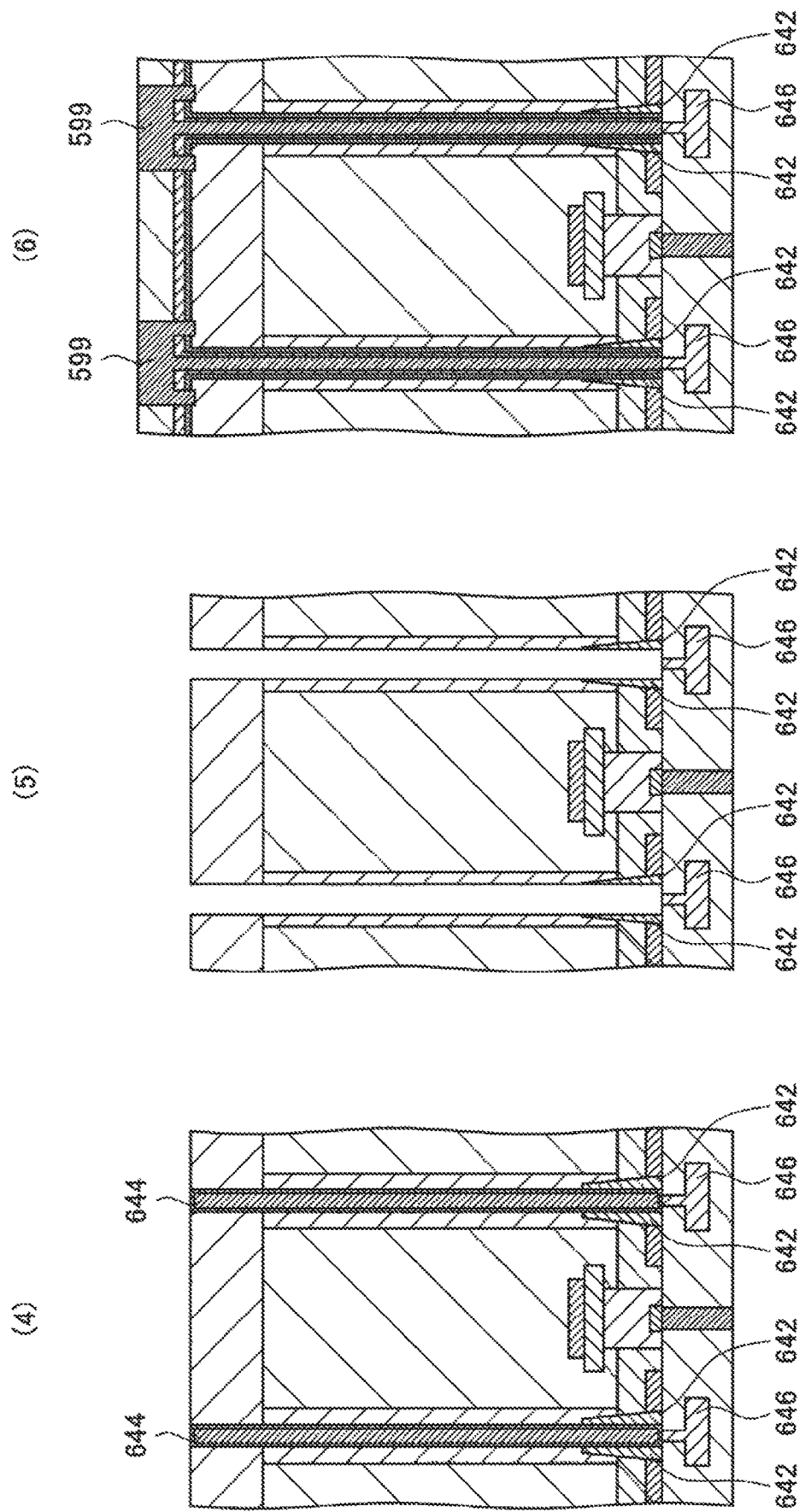
FIG. 52 is a schematic sectional view which shows still another manufacturing method of the semiconductor device according to the sixth variation in process order.

FIGS. 51 and 52 are schematic sectional views which show still another manufacturing method of the semiconductor device according to the sixth variation in process order. First, in a process of (1), the STI 640 is processed and an insulating layer 642 is formed in the STI 640. In a next process of (2), the STI 640 is opened by etching, and an insulating film and a sacrificial film are filled as a filling layer 644. Poly-Si, PDAS, SiN, or the like is used as the sacrificial film.

In a next process of (3), the wiring layer 646 and the filling layer 644 are connected in the wiring layer formation process. In a next process of (4), the wiring process is completed, the upper and lower sides are reversed, thinning is performed after a connection with a supporting substrate, and the filling layer 644 is exposed.

In a next process of (5), the filling layer 644 is removed. According to this process, a through trench for forming a through electrode is completed. In a next process of (6), after the filling layer 644 is removed, the electrode material 599 is formed in the through trench, and a necessary wiring is formed to complete the process.

According to the sixth variation, an insufficient mask film thickness at the time of the go-through process performed from the back surface, which is a problem in forming an STI go-through structure, is solved. Moreover, it is possible to eliminate a misalignment between the STI and the electrode in the STI, and thus it is not necessary to increase the STI line width in consideration of the influence of misalignment. As a result, the flexibility of element layout setting increases.

9. Application Example to Other than Imaging Device

The present disclosure can also be applied to other devices that detect light, for example a time of flight (TOF) sensor, and the like. In a case in which the present disclosure is applied to a TOF sensor, it is possible to apply it to, for example, a distance image sensor based pm a direct TOF measurement method, and a distance image sensor based on an indirect TOF measurement method. In the distance image sensor based on the direct TOF measurement method, since arrival timing of photons is obtained in a direct time region in each pixel, an optical pulse with a short pulse width is transmitted and an electrical pulse is generated using a receiver responding at high speed. The present disclosure can be applied to the receiver at this time. In addition, in the indirect TOF method, flight time of light is measured using a semiconductor element structure in which the detection and accumulation amount of a carrier generated by light change depending on the arrival timing of light. The present disclosure can also be applied as such a semiconductor structure. In a case in which the present disclosure is applied to the TOF sensor, it is arbitrary to provide the color filters 300*a*, 300*b*, 300*c* and the on-chip lens 400 as shown in FIG. 18, and these may not be provided.

10. Configuration Example of Electronic Device

Figure 53:
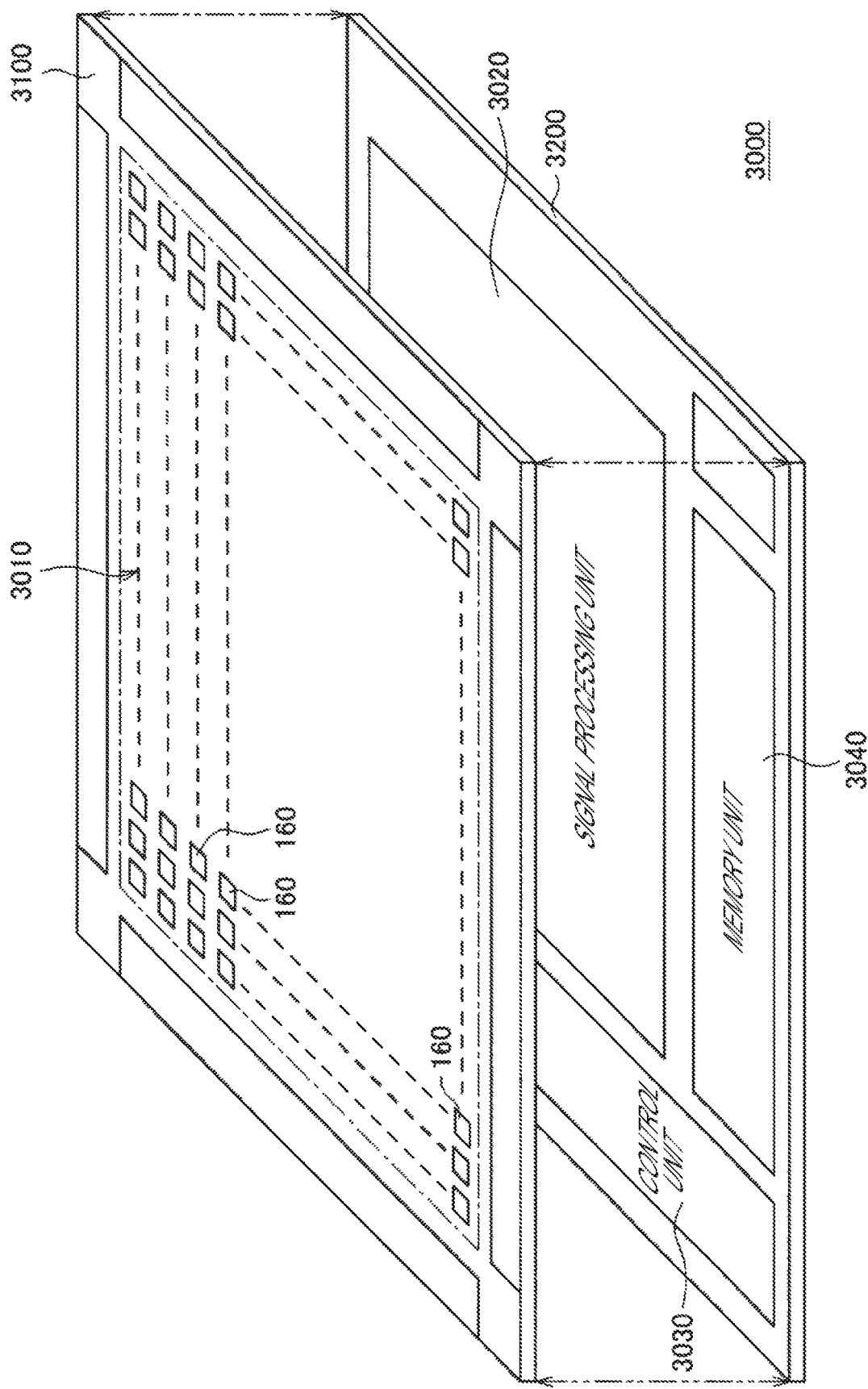
FIG. 53 is a schematic diagram which shows a configuration of an electronic device including an imaging device.

FIG. 53 is a schematic diagram which shows a configuration of an electronic device 3000 including the imaging device 1000 described above. The electronic device 3000 shown in FIG. 53 includes a first semiconductor chip 3100 having a sensor unit 3010 formed by a plurality of photoelectric conversion units 160 being disposed, and a second semiconductor chip 3200 having a signal processing unit 3020 for processing signals acquired by the photoelectric conversion unit 160. The first semiconductor chip 3100 and the second semiconductor chip 3200 are stacked. A control unit 3030 for controlling the electronic device 3000 and a memory unit 3040 for storing signals acquired by the photoelectric conversion unit 160 are provided in the vicinity of the signal processing unit 3020. The control unit 3030 can be disposed in the vicinity of the photoelectric conversion unit 160, in addition to the control of the signal processing unit 3020, for other driving and control purposes. In addition to shown disposition shown, the control unit 3030 can be provided to have arbitrary functions in any one of the first semiconductor chip 3100 and the second semiconductor chip 3200. Note that the plurality of photoelectric conversion units 160 are disposed in a two-dimensional matrix form (matrix form). In addition, in FIG. 53, for the sake of description, the first semiconductor chip 3100 and the second semiconductor chip 3200 are illustrated in a separated state.

11. Application Example to Mobile Body

A technology (the present technology) according to the present disclosure can be applied to various products. For example, the technology according to the present disclosure may also be realized as a device mounted in a mobile body of any type such as automobile, electric vehicle, hybrid electric vehicle, motorcycle, bicycle, personal mobility, airplane, drone, ship, or robot.

Figure 54:
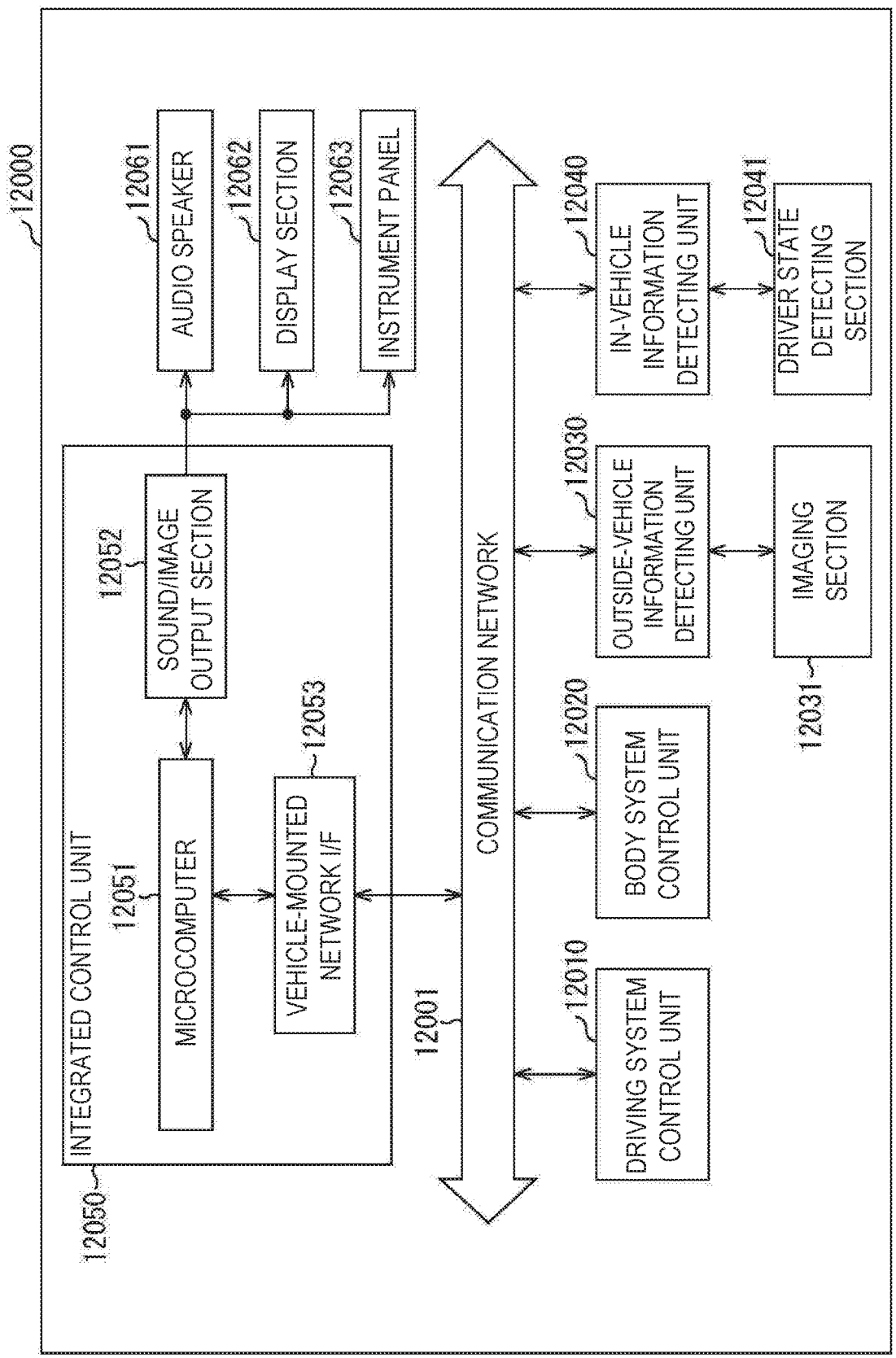
FIG. 54 is a block diagram depicting an example of a schematic configuration of a vehicle control system.

FIG. 54 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 54, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 54, an audio speaker 12061, a display section 12062, and an instrument panel 12063 are illustrated as the output device. The display section 12062 may, for example, include at least one of an on-board display and a head-up display.

Figure 55:
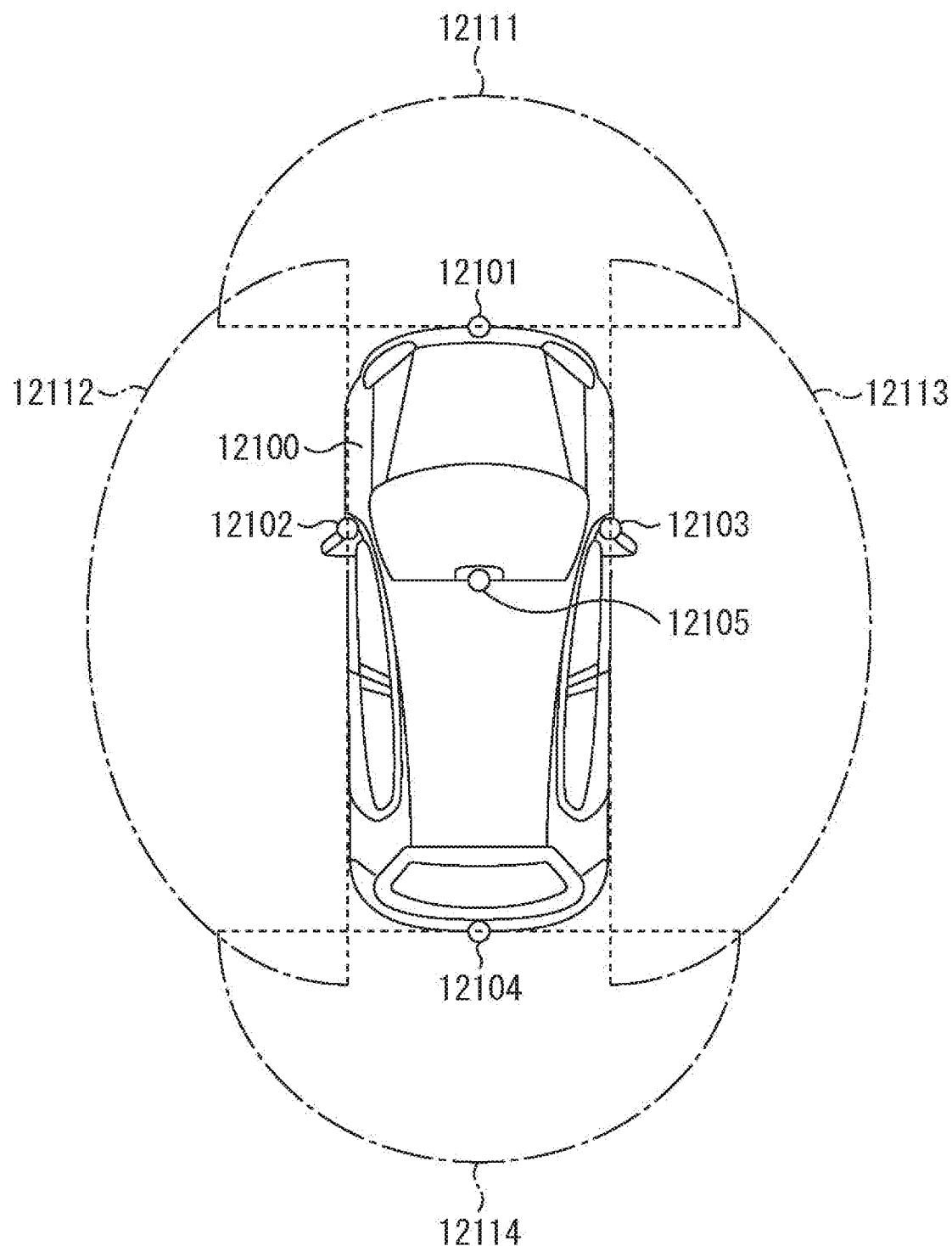
FIG. 55 is a diagram of assistance in explaining an example of installation positions of an outside-vehicle information detecting section and an imaging section.

FIG. 55 is a diagram depicting an example of the installation position of the imaging section 12031.

In FIG. 55, the imaging section 12031 includes imaging sections 12101, 12102, 12103, 12104, and 12105.

The imaging sections 12101, 12102, 12103, 12104, and 12105 are, for example, disposed at positions on a front nose, side-viewing endoscopes, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the side-viewing endoscopes obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 55 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the side-viewing endoscopes. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

As described above, an example of a vehicle control system in which a technology according to the present disclosure can be applied has been described. The technology according to the present disclosure can be applied to the imaging section 12031 among the configurations described above. Specifically, the imaging device (SPAD photodiode) 1000 can be applied to the imaging section 12031, and the like. Since a more easily viewable image can be obtained by applying the technology according to the present disclosure to the imaging section 12031, it is possible to reduce fatigue of a driver.

12. Application Example to Endoscopic Surgery System

The present disclosure technology (this technology) can be applied to various products. For example, the present disclosure technology may be applied to the endoscopic surgery system.

Figure 56:
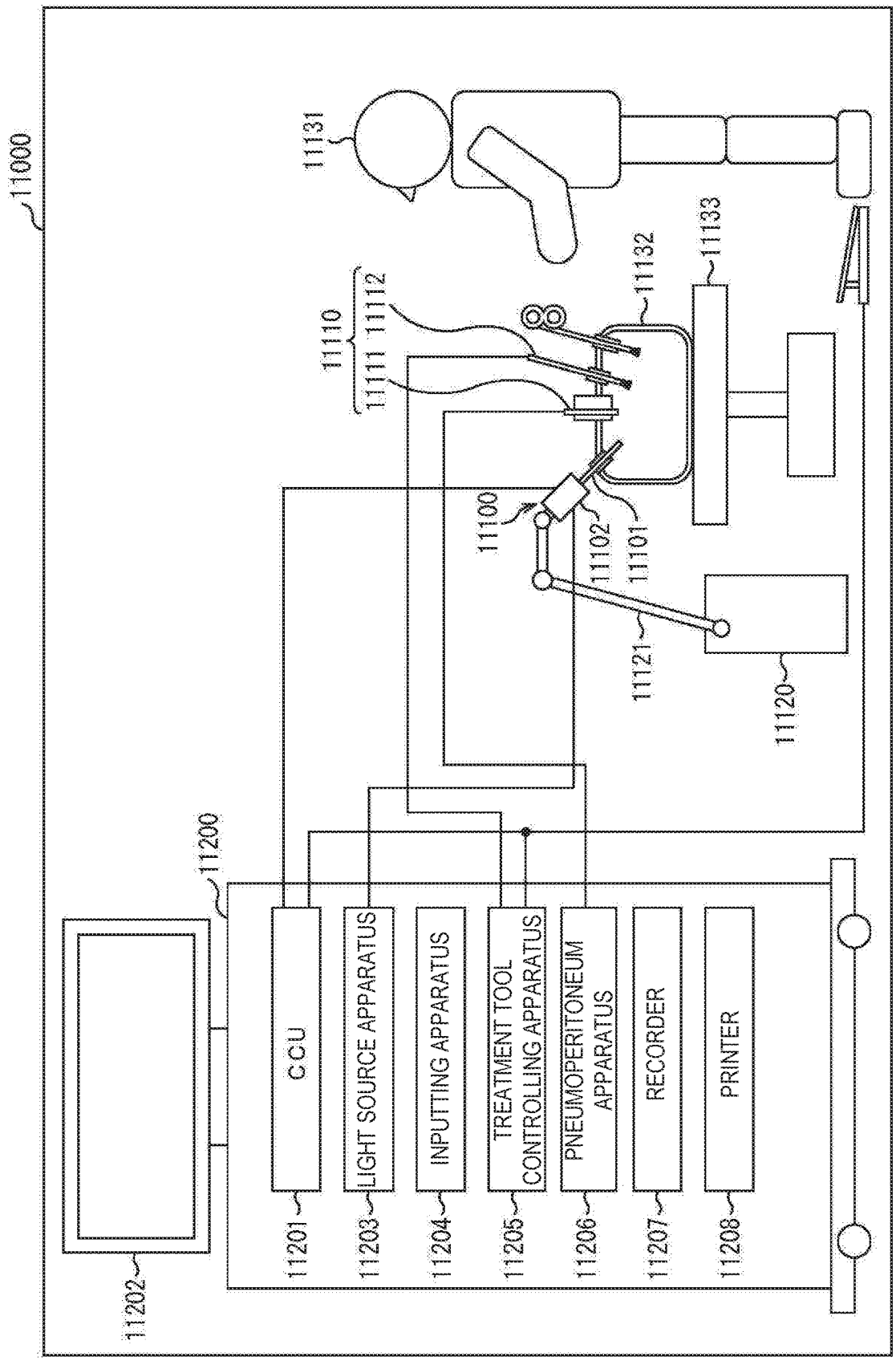
FIG. 56 is a view depicting an example of a schematic configuration of an endoscopic surgery system.

FIG. 56 is a view depicting an example of a schematic configuration of an endoscopic surgery system to which the technology according to an embodiment of the present disclosure (present technology) can be applied.

In FIG. 56, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally implanting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 57:
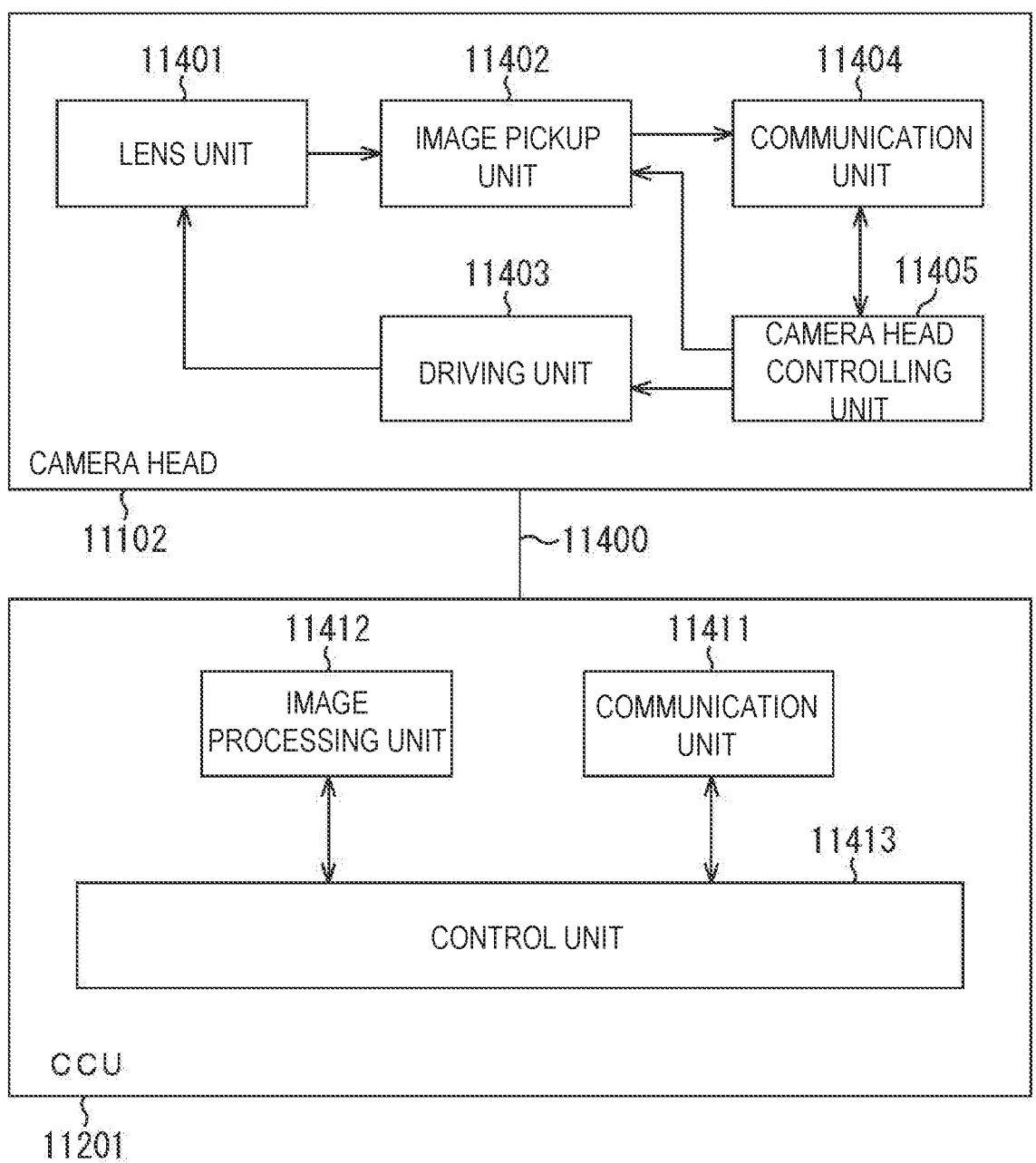
FIG. 57 is a block diagram depicting an example of a functional configuration of a camera head and a camera control unit (CCU).

FIG. 57 is a block diagram depicting an example of a functional configuration of the camera head 11102 and the CCU 11201 depicted in FIG. 56.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

As described above, an example of an endoscopic surgery system to which the technology according to the present disclosure can be applied has been described. The technology according to the present disclosure can be applied to the imaging section 11402 of the camera head 11102 among the above-described configurations. Specifically, the imaging device (SPAD photodiode) 1000 can be applied to the imaging section 10402. By applying the technology according to the present disclosure to the imaging section 10402, it is possible to obtain a clearer surgical region image, and thus a surgeon can reliably confirm a surgical region and the surgeon can perform a treatment in the same sensation as in the case of performing a touch-contact observation on a surgical region.

Note that, although the endoscopic surgery system has been described as an example herein, the technology according to the present disclosure may also be applied to others, for example, a microscope surgery system, and the like.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

An imaging device including:

a first semiconductor layer which is formed in a semiconductor substrate;

a second semiconductor layer of a conductivity type opposite to a conductivity type of the first semiconductor layer formed on the first semiconductor layer;

a pixel separation unit which defines a pixel region including the first semiconductor layer and the second semiconductor layer;

a first electrode which is connected to the first semiconductor layer from one surface side of the semiconductor substrate; and a second electrode which is connected to the second semiconductor layer from a light irradiation surface side that is the other surface of the semiconductor substrate, and is formed to correspond to a position of the pixel separation unit.

(2)

The imaging device according to (1), in which a voltage for electron multiplication is applied between the first electrode and the second electrode.

(3)
The imaging device according to (1) or (2), including:
a third semiconductor layer of the same conductivity type as the second semiconductor layer formed on the second semiconductor layer.

(4)
The imaging device according to any one of (1) to (3), in which the second electrode is provided on an upper surface of the pixel separation unit.

(5)
The imaging device according to any one of (1) to (4), in which the pixel separation unit and the second electrode have a lattice-like planar shape that surrounds a plurality of the pixel regions.

(6)
The imaging device according to any one of (1) to (5), further including:
a metal layer which is formed on the second electrode and has a light shielding property.

(7)
The imaging device according to (6), including:
an insulating layer which is formed on the second electrode, in which the metal layer is formed on the second electrode via the insulating layer.

(8)
The imaging device according to (6), including:
an electrode extraction unit which is provided on a light irradiation surface side outside a pixel array including a plurality of the pixel regions,
in which the metal layer is connected to the electrode extraction unit.

(9)
The imaging device according to any one of (1) to (8), further including:
an auxiliary electrode which is formed on a front surface of the pixel region and is connected to the second electrode.

(10)
The imaging device according to any one of (1) to (3), in which the second electrode is formed on the pixel region side on an upper end of the pixel separation unit.

(11)
The imaging device according to (10), in which the second electrode is formed to surround the pixel region.

(12)
The imaging device according to (10) or (11), including:
a metal layer which is formed on the second electrode to straddle the upper end of the pixel separation unit,
in which the metal layer is connected to the second electrode formed in an adjacent pixel region.

(13)
The imaging device according to any one of (1) to (12), in which the pixel separation unit includes an impurity region.

(14)
The imaging device according to any one of (1) to (13), further including:
a metal layer and an insulating layer which are buried in the pixel separation unit in at least a part in a thickness direction of the semiconductor substrate.

(15)
The imaging device according to (14), in which the metal layer and the insulating layer are buried in the pixel separation unit from the one surface side of the semiconductor substrate.

(16)
The imaging device according to (14), in which the metal layer and the insulating layer are buried in the pixel separation unit from the light irradiation surface side of the semiconductor substrate.

(17)
The imaging device according to (16), in which the second electrode and the metal layer are insulated by the insulating layer.

(18)
The imaging device according to any one of (1) to (17), further including:
a contact layer which is connected to the second electrode and is continuous with a front surface on the one surface side; and
an electrode extraction unit which is electrically connected to the contact layer and is provided outside a pixel array including a plurality of the pixel regions.

(19)
The imaging device according to (18), in which the contact layer is formed outside the pixel array or inside the pixel array.

(20)
The imaging device according to (1),
in which the second electrode includes an impurity region, and
the imaging device includes a carbon layer which is formed to cover at least a side surface of the second electrode.

(21)
The imaging device according to (20), in which the carbon layer is formed to cover a bottom surface of the second electrode.

(22)
The imaging device according to (1), in which both the first semiconductor layer and the second semiconductor layer include an epitaxial layer.

(23)
The imaging device according to (22), in which the second semiconductor layer has a thinner thickness at a center of a region surrounded by the pixel separation unit than its surroundings.

(24)
The imaging device according to (1),
in which the second electrode includes an impurity region, and
the imaging device includes an insulating layer which is formed to cover at least a side surface of the second electrode.

(25)
The imaging device according to (14), including:
a fixed electric charge layer which is formed in a vertical direction along the pixel separation unit,
in which the fixed electric charge layer is formed on a level on which the second semiconductor layer is formed, and is not formed on a level on which the first semiconductor layer is formed.

(26)
The imaging device according to (14), including:
a solid phase diffusion layer which is formed in a vertical direction along the pixel separation unit,
in which the solid phase diffusion layer is formed on a level on which the second semiconductor layer is formed, and is not formed on at least a part of a level on which the first semiconductor layer is formed.

(27)

The imaging device according to (25), in which the pixel separation unit includes a buried insulating film formed on the one surface side of the semiconductor substrate, and the fixed electric charge layer is not formed on a side wall of the buried insulating layer.

(28)

The imaging device according to (27), in which a depletion layer region is provided on the side wall of the buried insulating layer.

(29)

The imaging device according to (14), in which the pixel separation unit includes a trench insulating unit formed from the one surface side and a trench electrode formed in the trench insulating unit, and the metal layer and the trench electrode are connected.

(30)

The imaging device according to (29), in which center axes of the metal layer and the trench electrode match or the center axes of the metal layer and the trench electrode are misaligned.

(31)

A signal processing device which receives an image signal corresponding to each pixel region from an imaging device that includes a first semiconductor layer formed in a semiconductor substrate, a second semiconductor layer of a conductivity type opposite to a conductivity type of the first semiconductor layer formed on the first semiconductor layer, a pixel separation unit which defines a pixel region including the first semiconductor layer and the second semiconductor layer, a first electrode which is connected to the first semiconductor layer from one surface side of the semiconductor substrate, and a second electrode which is connected to the second semiconductor layer from a light irradiation surface side that is the other surface of the semiconductor substrate, and is formed to correspond to a position of the pixel separation unit, and performs signal processing for displaying the image signal on a display apparatus.

REFERENCE SIGNS LIST 100 cathode electrode (first electrode)
130 anode electrode (second electrode)
132 auxiliary electrode
140 contact layer
150 pixel separation unit
152 metal layer
160 photoelectric conversion unit (third semiconductor layer)
170 P-type layer (second semiconductor layer)
180 N-type layer (first semiconductor layer)
190 buried metal layer
200 insulating layer
220 front surface metal layer
2200 DSP circuit (signal processing device)
2400 display section (display apparatus)

What is claimed is:

1. An imaging device, comprising:
    a first semiconductor layer which is formed in a semiconductor substrate;
    a second semiconductor layer of a conductivity type opposite to a conductivity type of the first semiconductor layer formed on the first semiconductor layer;
    a pixel separation unit that defines a first pixel region including the first semiconductor layer and the second semiconductor layer;
    a first electrode that is connected to the first semiconductor layer from a first surface side of the semiconductor substrate; and
    a second electrode that is connected to the second semiconductor layer from a light irradiation surface side that is a second surface side of the semiconductor substrate, and is formed to correspond to a position of the pixel separation unit;
    a metal layer that is formed on the second electrode and has a light shielding property; and
    a withdrawing electrode that is provided on the light irradiation surface side outside a pixel array including a plurality of pixel regions,
    wherein the metal layer is connected to the withdrawing electrode.

2. The imaging device according to claim 1, wherein a voltage for electron multiplication is applied between the first electrode and the second electrode.

3. The imaging device according to claim 1, comprising:
    a third semiconductor layer of a same conductivity type as the second semiconductor layer formed on the second semiconductor layer.

4. The imaging device according to claim 1, wherein the second electrode is provided on an upper surface of the pixel separation unit.

5. The imaging device according to claim 1, wherein the pixel separation unit and the second electrode have a lattice-like planar shape that surrounds the plurality of pixel regions.

6. The imaging device according to claim 1, further comprising:
    an auxiliary electrode that is formed on a light irradiation surface side of the pixel region and is connected to the second electrode.

7. The imaging device according to claim 1, wherein the pixel separation unit includes an impurity region.

8. The imaging device according to claim 1, further comprising:
    a buried metal layer and an insulating film that are buried in the pixel separation unit in at least a part in a thickness direction of the semiconductor substrate.

9. The imaging device according to claim 8, wherein the buried metal layer and the insulating film are buried in the pixel separation unit from the first surface side of the semiconductor substrate.

10. The imaging device according to claim 8, wherein the buried metal layer and the insulating film are buried in the pixel separation unit from the light irradiation surface side of the semiconductor substrate.

11. The imaging device according to claim 8, wherein the second electrode and the buried metal layer are insulated by the insulating film.

12. The imaging device according to claim 1, further comprising:
    a contact layer that is connected to the second electrode and is continuous with a front surface on the first surface side, wherein the withdrawing electrode is electrically connected to the contact layer and is provided outside the pixel array including the plurality of pixel regions.

13. The imaging device according to claim 12, wherein the contact layer is formed outside the pixel array or inside the pixel array.

14. The imaging device according to claim 8, further comprising:
   a fixed electric charge layer that is formed in a vertical direction along the pixel separation unit,
   wherein the fixed electric charge layer is formed on a level on which the second semiconductor layer is formed, and is not formed on a level on which the first semiconductor layer is formed.

15. The imaging device according to claim 8, comprising:
   a solid phase diffusion layer that is formed in a vertical direction along the pixel separation unit,
   wherein the solid phase diffusion layer is formed on a level on which the second semiconductor layer is formed, and is not formed on at least a part of a level on which the first semiconductor layer is formed.

16. The imaging device according to claim 14,
   wherein the pixel separation unit includes the insulating film formed on the first surface side of the semiconductor substrate, and
   the fixed electric charge layer is not formed on a side wall of the insulating film.

17. The imaging device according to claim 16, wherein a depletion layer region is provided on the side wall of the insulating film.

18. The imaging device according to claim 8,
   wherein the pixel separation unit includes a trench insulating unit formed from the first surface side and a trench electrode formed in the trench insulating unit, and
   the buried metal layer and the trench electrode are connected.

19. The imaging device according to claim 18, wherein center axes of the buried metal layer and the trench electrode match or the center axes of the metal layer and the trench electrode are misaligned.

* * * * *